(12) United States Patent
Gholamipour et al.

(10) Patent No.: US 11,056,206 B2
(45) Date of Patent: Jul. 6, 2021

(54) NON-VOLATILE MEMORY WITH DYNAMIC WEAR LEVELING GROUP CONFIGURATION

(71) Applicant: WESTERN DIGITAL TECHNOLOGIES, INC., San Jose, CA (US)

(72) Inventors: Amir Gholamipour, Irvine, CA (US); Chandan Mishra, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/851,092

(22) Filed: Dec. 21, 2017

(65) Prior Publication Data

US 2019/0108889 A1 Apr. 11, 2019

Related U.S. Application Data

(63) Continuation-in-part of application No. 15/838,201, filed on Dec. 11, 2017, now Pat. No. 10,409,716.

(Continued)

(51) Int. Cl.
*G11C 16/34* (2006.01)
*G06F 12/02* (2006.01)
(Continued)

(52) U.S. Cl.
CPC ...... *G11C 16/3495* (2013.01); *G06F 12/0246* (2013.01); *G06F 12/0623* (2013.01);
(Continued)

(58) Field of Classification Search
CPC ............ G06F 3/0689; G06F 12/02346; G06F 12/0623; G11C 11/40603; G11C 16/08; G11C 29/76
See application file for complete search history.

(56) References Cited

U.S. PATENT DOCUMENTS

| | | | |
|---|---|---|---|
| 6,721,858 B1 * | 4/2004 | Joseph | G06F 12/0817 711/153 |
| 8,169,808 B2 * | 5/2012 | Roohparvar | G11C 15/046 365/49.1 |

(Continued)

FOREIGN PATENT DOCUMENTS

EP 2507710 B1 * 10/2018

OTHER PUBLICATIONS

Increasing Lifetime and Security of Phase-Change Memory with Endurance Variation, by Wen Zhou, Dan Feng, et el., 2016 IEEE 22nd International Conference on Parallel and Distributed Systems, Presented in Wuhan, China Dec. 13-16, 2016. Available at https://ieeexplore.IEEE.org/document/7823831 (Year: 2016).*

(Continued)

*Primary Examiner* — William E. Baughman
*Assistant Examiner* — Janice M. Girouard
(74) *Attorney, Agent, or Firm* — Vierra Magen Marcus LLP

(57) ABSTRACT

A non-volatile storage apparatus includes a set of non-volatile memory cells and one or more control circuits in communication with the set of non-volatile memory cells. The one or more control circuits are configured to group physical addresses of the set of non-volatile memory cells into groups of configurable sizes and to individually apply wear leveling schemes to non-volatile memory cells of a group.

20 Claims, 31 Drawing Sheets

Related U.S. Application Data which is a continuation-in-part of application No. 15/730,511, filed on Oct. 11, 2017, now Pat. No. 10,656,844.

(51) Int. Cl.

| | | |
|---|---|---|
| *G06F 12/06* | (2006.01) | |
| *G06F 3/06* | (2006.01) | |
| *G11C 11/406* | (2006.01) | |
| *G11C 29/00* | (2006.01) | |
| *G11C 16/08* | (2006.01) | |
| *G11C 8/12* | (2006.01) | |
| *G11C 13/00* | (2006.01) | |

(52) U.S. Cl.
CPC .......... *G11C 16/349* (2013.01); *G06F 3/0689* (2013.01); *G06F 2212/7201* (2013.01); *G06F 2212/7211* (2013.01); *G11C 8/12* (2013.01); *G11C 11/40603* (2013.01); *G11C 13/0023* (2013.01); *G11C 13/0033* (2013.01); *G11C 16/08* (2013.01); *G11C 29/76* (2013.01)

(56) References Cited

U.S. PATENT DOCUMENTS

| | | | | |
|---|---|---|---|---|
| 2012/0131304 | A1* | 5/2012 | Franceschini | G06F 12/0246 711/202 |
| 2013/0024609 | A1 | 1/2013 | Gorobets et al. | |
| 2013/0254514 | A1* | 9/2013 | Yu | G06F 12/0246 711/209 |
| 2013/0311707 | A1 | 11/2013 | Hitachi Ltd | |
| 2014/0063902 | A1* | 3/2014 | Sunkavalli | G11C 11/165 365/148 |
| 2015/0160893 | A1 | 6/2015 | Gorobets et al. | |
| 2016/0098215 | A1* | 4/2016 | Song | G06F 3/0619 711/103 |
| 2016/0147467 | A1 | 5/2016 | Roberts | |
| 2016/0170903 | A1 | 6/2016 | Kanno et al. | |
| 2016/0210045 | A1 | 7/2016 | Hahn et al. | |
| 2017/0177470 | A1 | 6/2017 | Gunnam | |
| 2017/0256305 | A1 | 9/2017 | Niu et al. | |
| 2018/0039573 | A1 | 2/2018 | Shung | |
| 2018/0046576 | A1 | 2/2018 | Lesartre et al. | |
| 2018/0060227 | A1* | 3/2018 | Tang | G06F 12/02 |
| 2018/0095678 | A1* | 4/2018 | McClain | G06F 3/064 |
| 2018/0113636 | A1* | 4/2018 | Kwon | G06F 12/0246 |
| 2018/0157427 | A1* | 6/2018 | Hong | G06F 12/0246 |

OTHER PUBLICATIONS

Article by Liu "Curling-PCM:Application-specific wear leveling for phase change memory based on embedded systems", by Duo Liu, Tianzheng Wang, et el.. Pubished in 2013 at 18th Asia and South Pacific Desing Automation Conference. (Year: 2013).*
Presentation titled Ourobors Wear-leveling: A Two-level Hierarchical Wear-leveling Model for NVRAM, by Qingyue Liu, Peter Varman, etc, (Year: 2017).*
Office Action dated Dec. 31, 2018 in U.S. Appl. No. 15/730,511.
Office Action dated Jan. 2, 2019 in U.S. Appl. No. No. 15/838,201.
Helmick, et al., "Non-Volatile Memory with Regional and Inter-Region Wear Leveling," filed Oct. 11, 2017.
Gholampouri et al., "Non-Volatile Memory with Adaptive Wear Leveling," filed Dec. 11, 2017.
Qureshi, et al., "Enhancing Lifetime and Security of PCM-Based Main Memory with Start-Gap Wear Leveling," MICRO 2009, Dec. 12-16, 2009, 10 pages.
Qureshi, et al., "Start-Gap: Low-Overhead Near-Perfect Wear Leveling for Main Memories," IBM T.J. Watson Research Center, Yorktown Heights, NY, MICRO-2009, 28 pages.
Office Action dated Jun. 20, 2019 in U.S. Appl. No. 15/730,511.
Notice of Allowance dated Jun. 20, 2019 in U.S. Appl. No. 15/838,201.
Response to Office Action filed Mar. 18, 2019 in U.S. Appl. No. 15/730,511.
Response to Office Action filed Mar. 18, 2019 in U.S. Appl. No. 15/838,201.
Office Action dated Oct. 30, 2019 in U.S. Appl. No. 15/730,511.
Response to Office Action filed Sep. 3, 2019 in U.S. Appl. No. 15/730,511.
Notice of Allowance dated Mar. 26, 2020, U.S. Appl. No. 15/730,511, filed Oct. 11, 2017.
Response to Office Action filed Jan. 13, 2020 in U.S. Appl. No. 15/730,511.

* cited by examiner

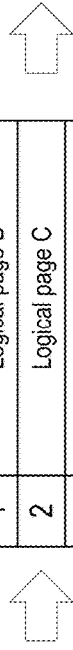

| Region 1 | Logical pages A-D |
| Region 2 | Logical pages E-H |
| Region 3 | Logical pages I-L |
| Region 4 | Logical pages M-P |

Figure 10A
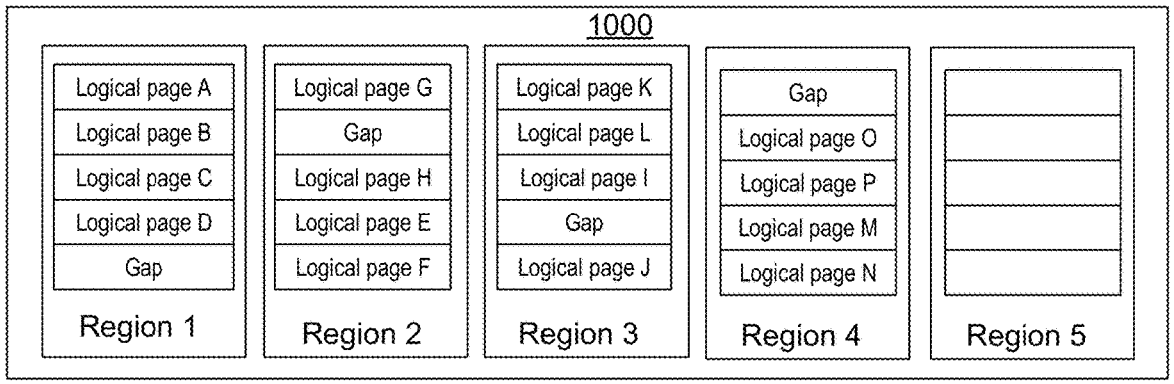
Figure 10B
| Region 1 | Logical pages A-D |
| Region 2 | Logical pages E-H |
| Region 3 | Logical pages I-L |
| Region 4 | Logical pages M-P |
| Region 5 | Gap |
Figure 11A
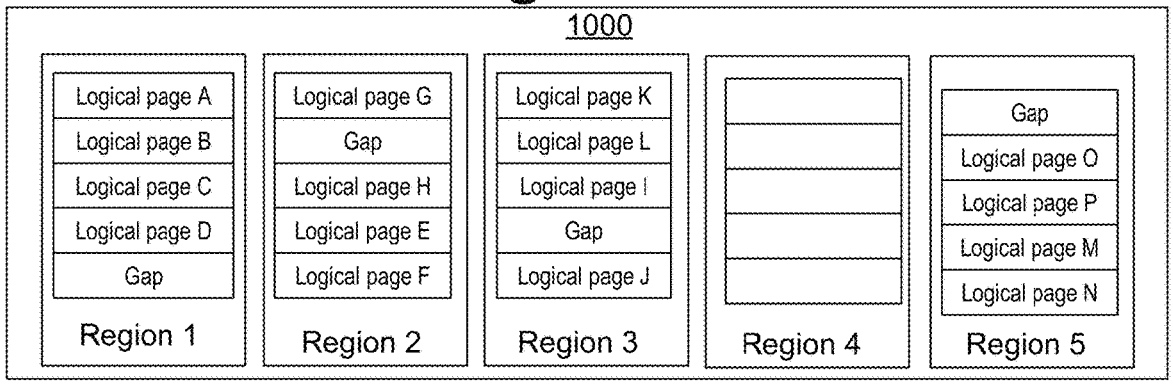
Figure 11B
| Region 1 | Logical pages A-D |
| Region 2 | Logical pages E-H |
| Region 3 | Logical pages I-L |
| Region 4 | Gap |
| Region 5 | Logical pages M-P |

Figure 12A
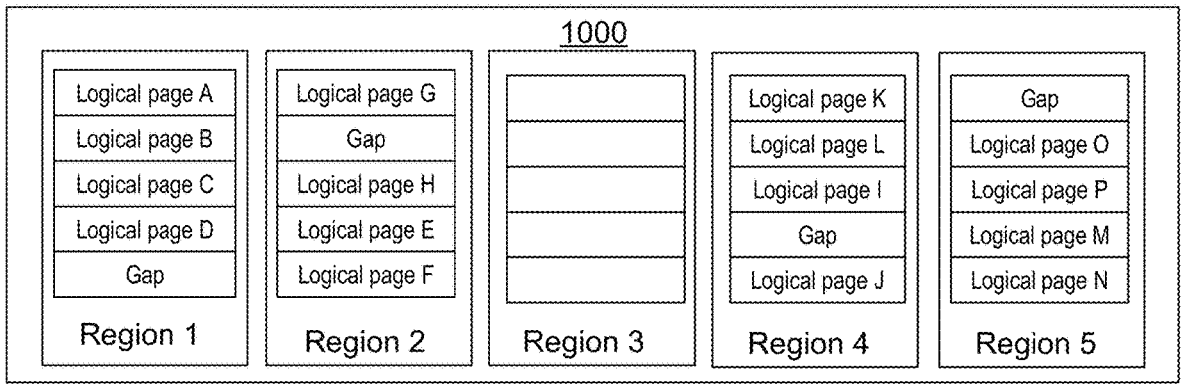
Figure 12B
| Region 1 | Logical pages A-D |
| --- | --- |
| Region 2 | Logical pages E-H |
| Region 3 | Gap |
| Region 4 | Logical pages I-L |
| Region 5 | Logical pages M-P |
Figure 13A
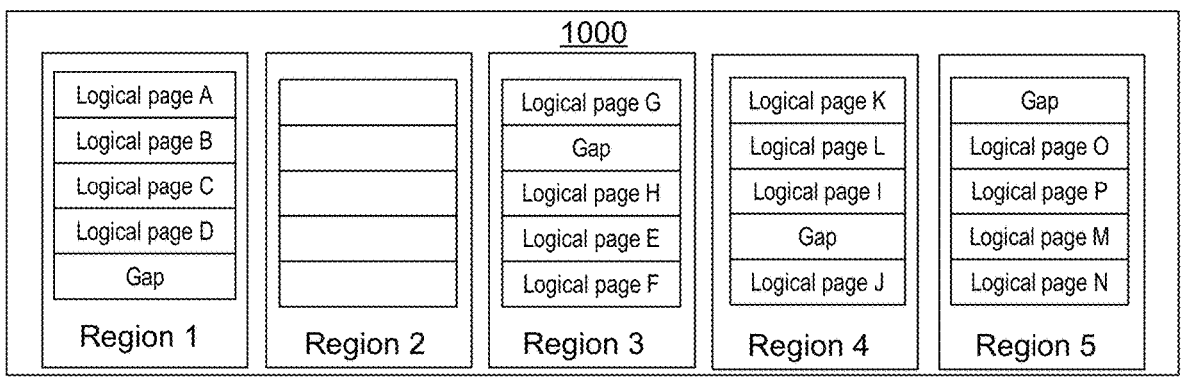
Figure 13B
| Region 1 | Logical pages A-D |
| --- | --- |
| Region 2 | Gap |
| Region 3 | Logical pages E-H |
| Region 4 | Logical pages I-L |
| Region 5 | Logical pages M-P |

Figure 14A

| Region 1 | Region 2 | Region 3 | Region 4 | Region 5 |
|---|---|---|---|---|
|  | Logical page A | Logical page G | Logical page K | Gap |
|  | Logical page B | Gap | Logical page L | Logical page O |
|  | Logical page C | Logical page H | Logical page I | Logical page P |
|  | Logical page D | Logical page E | Gap | Logical page M |
|  | Gap | Logical page F | Logical page J | Logical page N |

| Region 1 | Gap |
|---|---|
| Region 2 | Logical pages A-D |
| Region 3 | Logical pages E-H |
| Region 4 | Logical pages I-L |
| Region 5 | Logical pages M-P |

Figure 15

| Logical pages A-D | Group 1 | Low frequency |
|---|---|---|
| Logical pages E-H | Group 2 | Medium frequency |
| Logical pages I-L | Group 3 | Medium frequency |
| Logical pages M-P | Group 4 | High frequency |

Figure 16

| Region 1 | Low endurance |
|---|---|
| Region 2 | High endurance |
| Region 3 | Medium endurance |
| Region 4 | Medium endurance |
| Region 5 | Low endurance |

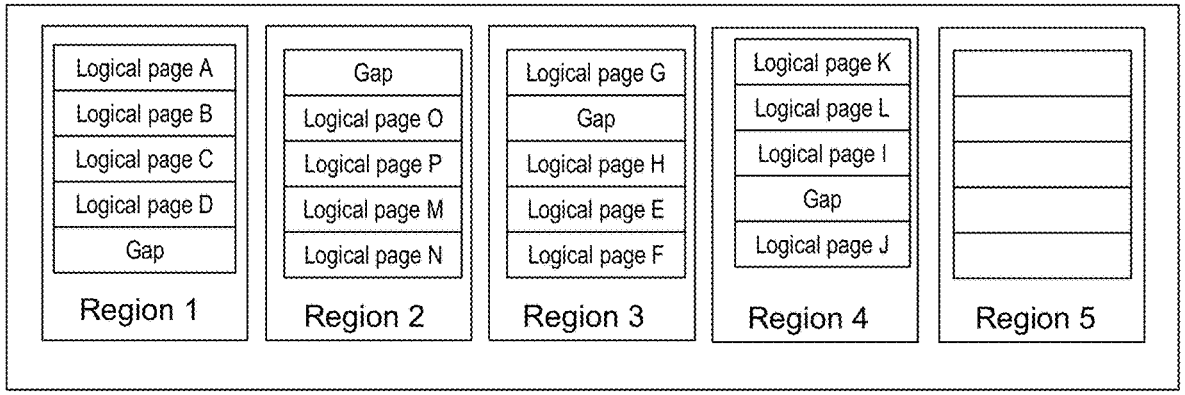

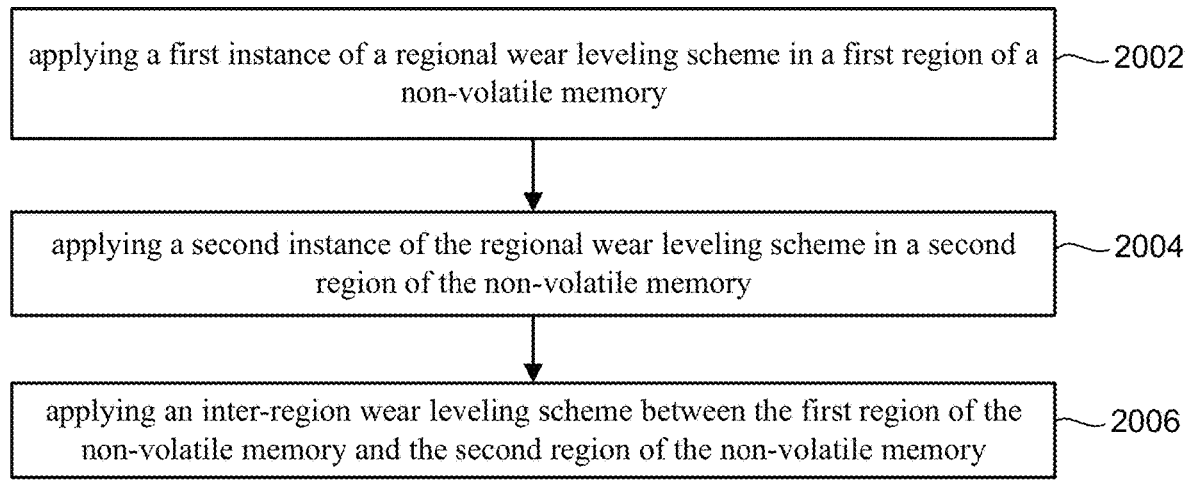

Figure 22
| Unit 1 | A | 3 |
| Unit 2 | B | 8 |
| Unit 3 | C | 15 |
| Unit 4 | D | 23 |
| Unit 5 | Gap | 0 |
Figure 23A
| Unit 1 | A |
| Unit 2 | B |
| Unit 3 | C |
| Unit 4 | |
| Unit 5 | Gap |
2302 
Figure 23B
| Unit 1 | A |
| Unit 2 | B |
| Unit 3 | |
| Unit 4 | |
| Unit 5 | C |
2302 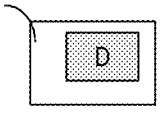
Figure 23C
| Unit 1 | |
| Unit 2 | |
| Unit 3 | A |
| Unit 4 | B |
| Unit 5 | C |
2302 
Figure 23D
| Unit 1 | D |
| Unit 2 | Gap |
| Unit 3 | A |
| Unit 4 | B |
| Unit 5 | C |
2302 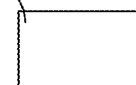

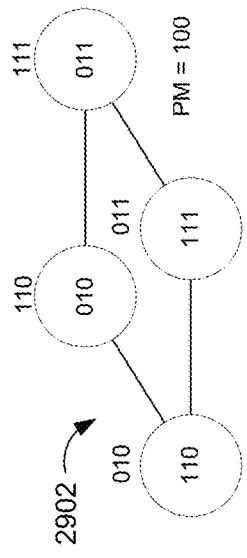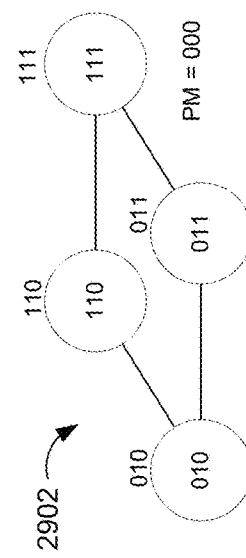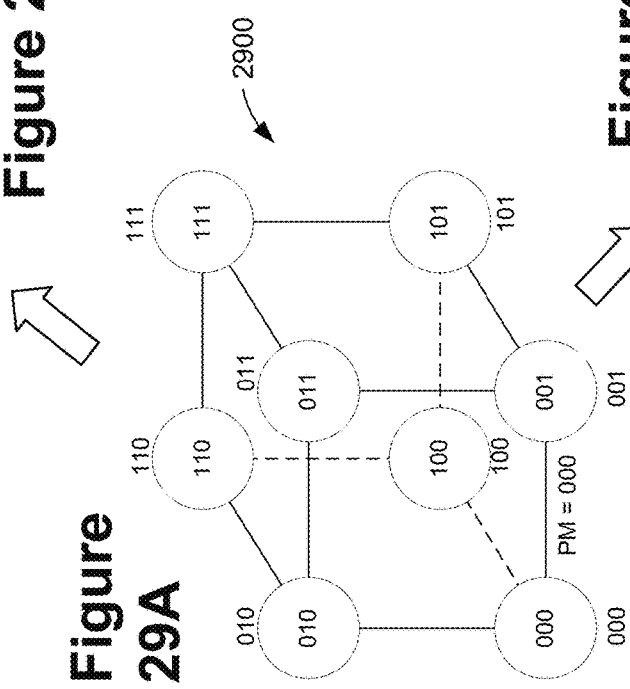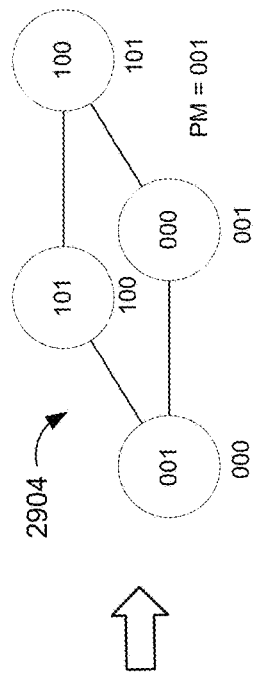
Figure 29A
Figure 29B
Figure 29C
Figure 29D
Figure 29E

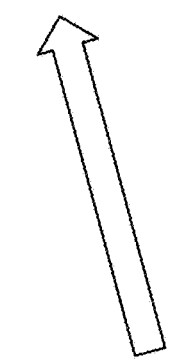
Figure 33B — 3342
Figure 33C — 3344
Figure 33A — 3340

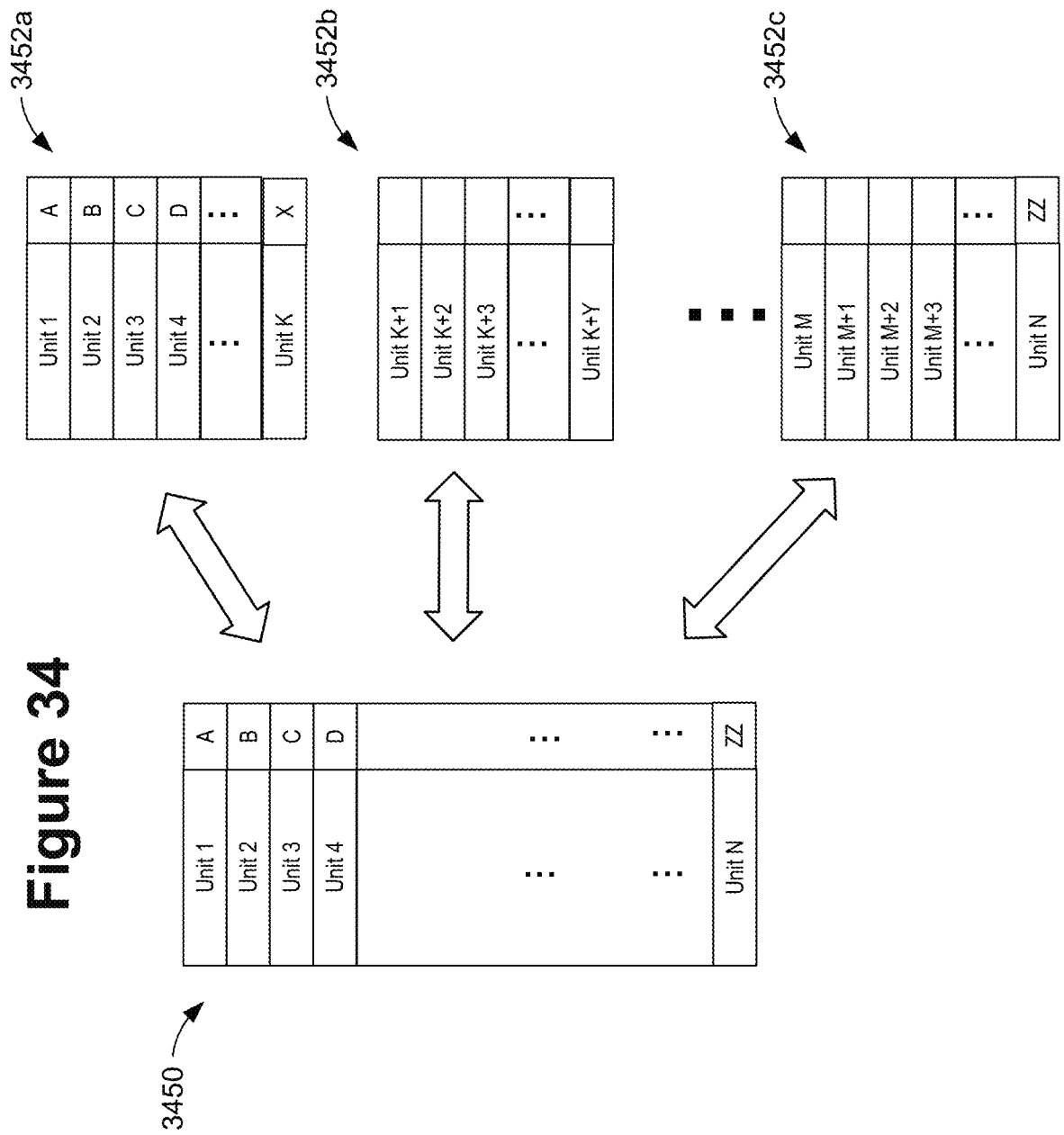

NON-VOLATILE MEMORY WITH DYNAMIC WEAR LEVELING GROUP CONFIGURATION

CROSS-REFERENCE TO RELATED APPLICATIONS

This application is a Continuation-In-Part of U.S. patent application Ser. No. 15/838,201, filed on Dec. 11, 2017 and issued as U.S. Pat. No. 10,409,716 on Sep. 10, 2019, and is a Continuation-In-Part of U.S. patent application Ser. No. 15/730,511, filed on Oct. 11, 2017 and issued as U.S. Pat. No. 10,656,844 on May 19, 2020, which are hereby incorporated by reference in their entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), resistive memory (e.g. ReRAM), ferroelectric memory (e.g., FeRAM), magnetoresistive memory (e.g., magnetoresistive random access memory, or MRAM), and phase change memory (e.g., PRAM).

When a memory system is deployed in an electronic device, the memory system may program data, store data, read data and/or erase data. In some types of memory, cell characteristics of memory cells degrade with use so that memory cells tend to wear out after a certain amount of use (e.g. after being written a certain number of times). Different types of memories can have different wear-out characteristics and different memory access patterns can cause different patterns of wear. Wear leveling may be used to distribute wear across memory cells so that wear is not concentrated on particular memory cells, which could lead to early failure of such memory cells.

BRIEF DESCRIPTION OF THE DRAWINGS

Like-numbered elements refer to common components in the different figures.

FIGS. 7A-I illustrate a start gap wear leveling scheme.

FIGS. 10A-B illustrate a first mapping of groups of logical addresses to regions of a non-volatile memory in an inter-region wear leveling scheme.

FIGS. 11A-B illustrate a second mapping of groups of logical addresses to regions of a non-volatile memory in an inter-region wear leveling scheme.

FIGS. 12A-B illustrate a third mapping of groups of logical addresses to regions of a non-volatile memory in an inter-region wear leveling scheme.

FIGS. 13A-B illustrate a fourth mapping of groups of logical addresses to regions of a non-volatile memory in an inter-region wear leveling scheme.

FIGS. 14A-B illustrate a fifth mapping of groups of logical addresses to regions of a non-volatile memory in an inter-region wear leveling scheme.

FIG. 15 illustrates mapping of host logical addresses to groups according to expected access patterns.

FIG. 16 illustrates mapping of regions according to expected endurance limits.

FIGS. 17A-B illustrate a first mapping of logical groups to regions according to expected access patterns and endurance limits.

FIG. 18 illustrates an inter-region wear leveling scheme according to regional wear data.

FIG. 19 illustrates recording regional wear data and recording group write data.

FIG. 20 shows a method of operating wear leveling schemes.

FIG. 22 illustrates a start gap scheme remapping data from a heavily worn unit to another heavily worn unit.

FIGS. 23A-D illustrate an example of a start gap scheme that avoids remapping data from a heavily worn unit to another heavily worn unit.

FIGS. 29A-E illustrate an example of splitting a wear leveling group into subgroups.

FIGS. 33A-C illustrate an example of splitting a wear leveling group into subgroups of equal size.

FIG. 34 illustrates an example of splitting a wear leveling group into subgroups of unequal size.

DETAILED DESCRIPTION

Figure 1:
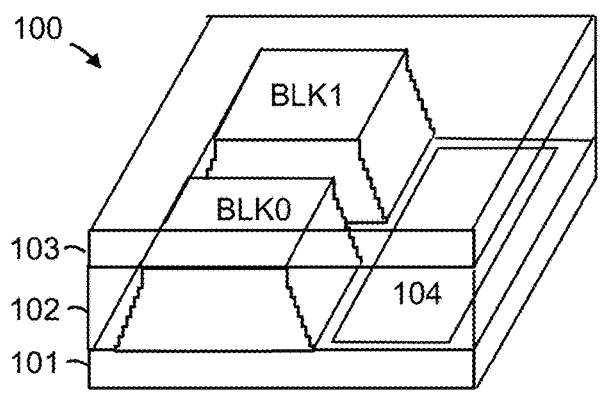
FIG. 1 is a perspective view of a 3D stacked non-volatile memory device.

In a non-volatile memory system, memory cells may be mapped into regions with regional wear leveling applied individually to regions. Regional wear leveling may be relatively simple so that operation of regional wear leveling may be performed without using significant resources and without significantly impacting other memory operations. For example, a deterministic wear leveling scheme (also referred to as a "mathematical" wear leveling scheme) may remap host data to physical locations in memory according to a predetermined algorithm, such as by offsetting logical to physical address mapping according to an offset that is incremented with use. A deterministic scheme does not account for changing characteristics of memory cells and proceeds blindly moving data according (e.g. incrementing locations).

In addition to regional wear leveling, inter-region wear leveling may be applied to level wear between regions and avoid concentration of wear in a particular region or regions. Inter-region wear leveling may be a simple wear leveling scheme such as a deterministic wear leveling scheme. Alternatively, inter-region wear leveling may be based on wear experienced by regions. Wear may be measured, and indicators of wear may be maintained for each region (e.g. an indicator of the number of writes experienced by each region, an increase in bit errors after a write verify, media retention behavior). Logical address mapping may be exchanged between a region that has experienced relatively high wear and a region that has experienced relatively low wear so that frequently written data is mapped to memory cells with lower wear and infrequently written data is mapped to cells with higher wear.

In some cases, a host access characteristics or desires may be provided to the device, determined by the device, or assumed by the device. For example, the host may identify a boot partition or frequently demanded data. In another example, the device may recognize the read or write access rate for a set of logical addresses. A device may also recognize or assume another host pattern and make logical address layout decisions to optimize group usage or information regarding expected access frequency (e.g. write frequency) for some logical addresses. Such information may be used to map host logical addresses into groups according to expected access frequency. These groups may then be individually mapped to regions. In some cases, characteristics of different physical areas of a memory array may be known. For example, certain areas may have different media properties such as low expected endurance because of physical characteristics of memory cells while other areas may have high expected endurance, e.g. memory cells at different physical levels above a substrate in a 3-D memory array may have different media properties including endurance characteristics. Areas of high expected endurance (with high expected endurance limit) may be mapped into particular regions while areas of low expected endurance (with low expected endurance limit) may be mapped to other regions and logical groups may be allocated to these regions accordingly. For example, a group containing frequently written data may be allocated to a high endurance region while a group containing infrequently written data may be allocated to a low endurance region. Other media properties than endurance may be used for these placement decisions such as media latency, media bit error accumulation rate, placement for minimized access conflicts, or device temperature gradient dispersion across multiple die or packages.

In some examples, a wear leveling scheme may remap logical addresses to physical addresses in a manner that is based on a cost metric and that does not require a full logical to physical mapping. An individual placement mapping indicating which logical address is associated with each physical address may be stored as pointers (e.g. the start and gap pointers described above), a bit string, or other format that does not require a full logical to physical map. The next placement mapping in a wear leveling scheme may be chosen according to a cost metric so that wear leveling is not purely deterministic and thus may reflect media properties and/or logical data properties. This provides some of the benefits of adapting wear leveling to changing properties (e.g. to non-uniform wear, changing bit error rates, changing host access patterns, or other properties) without the overhead associated with full logical to physical mapping.

Figure 2:
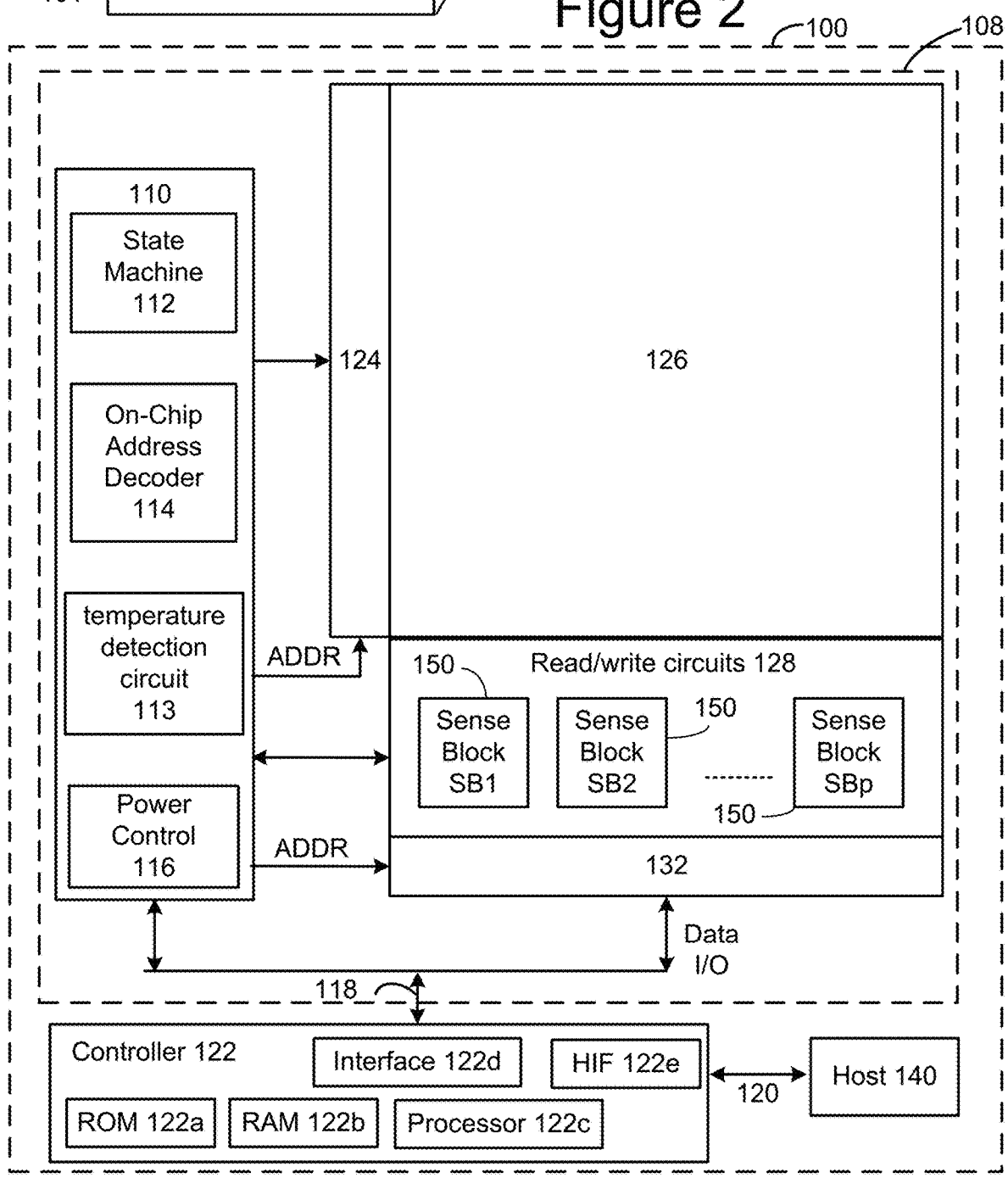
FIG. 2 is a functional block diagram of a memory device such as the 3D stacked non-volatile memory device 100 of FIG. 1.
Figure 3:
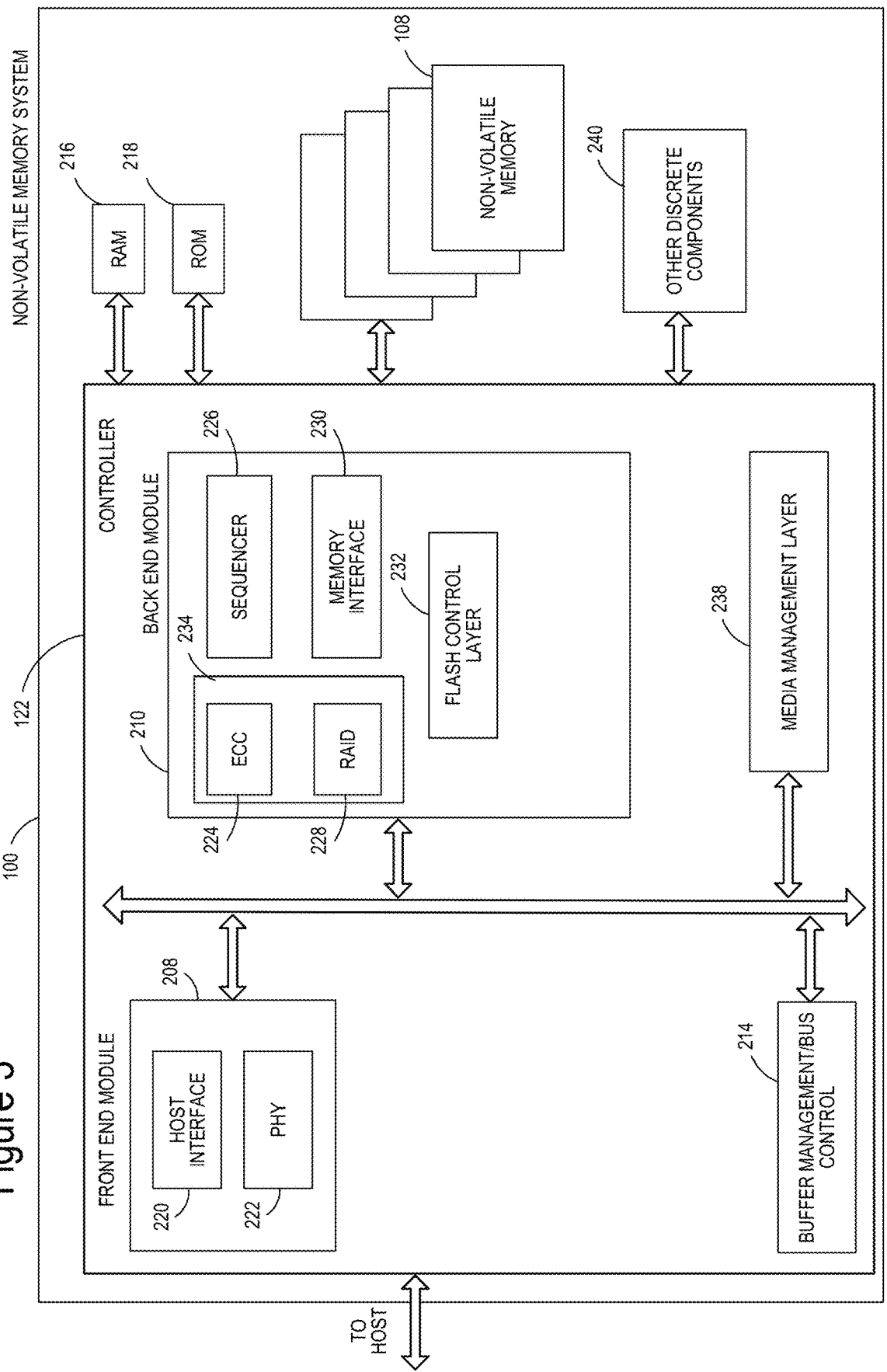
FIG. 3 is a block diagram depicting one embodiment of a Controller.

FIGS. 1-3 describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of memory cells, including BLK0 and BLK1, formed of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of memory cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122*c*, ROM 122*a*, RAM 122*b*, Memory interface 122*d* and Host Interface 122*e*, all of which are interconnected. One or more processors 122C is one example of a control circuit. Other embodiments can use state machines or other custom circuits designed to perform one or more functions. The storage devices (ROM 122*a*, RAM 122*b*) comprises code such as a set of instructions, and the processor 122*c* is operable to execute the set of instructions to provide the functionality described herein. Alternatively, or additionally, processor 122*c* can access code from a storage device in the memory structure, such as a reserved area of memory cells connected to one or more word lines. Memory interface 122*d*, in communication with ROM 122*a*, RAM 122*b* and processor 122*c*, is an electrical circuit that provides an electrical interface between Controller 122 and memory die 108. For example, memory interface 122*d* can change the format or timing of signals, provide a buffer, isolate from surges, latch I/O, etc. Processor 122C can issue commands to control circuitry 110 (or any other component of memory die 108) via Memory interface 122*d*. Host Interface 122*e* in communication with ROM 122*a*, RAM 122*b* and processor 122*c*, is an electrical circuit that provides an electrical interface between Controller 122 and host 140. For example, Host Interface 122*e* can change the format or timing of signals, provide a buffer, isolate from surges, latch I/O, etc. Commands and data from host 140 are received by Controller 122 via Host Interface 122*e*. Data sent to host 140 are transmitted via Host Interface 122*e*.

Multiple memory elements in memory structure 126 may be configured so that they are connected in series or so that each element is individually accessible. By way of non-limiting example, flash memory devices in a NAND configuration (NAND flash memory) typically contain memory elements connected in series. Alternatively, memory elements may be configured so that each element is individually accessible.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of an example memory system 100, depicting more details of Controller 122. In one embodiment, the system of FIG. 3 is a solid-state drive (SSD). As used herein, a flash memory Controller is a device that manages data stored on non-volatile memory and communicates with a host, such as a computer or electronic device. A non-volatile memory Controller can have various functionality in addition to the specific functionality described herein. For example, the non-volatile memory Controller can format the non-volatile memory to ensure the memory is operating properly, map out bad non-volatile memory cells, and allocate spare memory cells to be substituted for future failed memory cells. Some part of the spare memory cells can be used to hold firmware to operate the non-volatile memory Controller and implement other features. In operation, when a host needs to read data from or write data to the non-volatile memory, it will communicate with the non-volatile memory Controller. If the host provides a logical address to which data is to be read/written, the non-volatile memory Controller can convert the logical address received from the host to a physical address in the non-volatile memory. (Alternatively, the host can provide the physical address). The non-volatile memory Controller can also perform various memory management functions, such as, but not limited to, wear leveling (distributing writes to avoid wearing out specific blocks of memory that would otherwise be repeatedly written to) and garbage collection (after a block is full in a block-erased memory, moving only the valid pages of data to a new block, so the full block can be erased and reused).

The communication interface between Controller 122 and non-volatile memory die 108 may be any suitable interface, such as Open NAND flash interface (ONFI), Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the non-volatile memory may be embedded within the host, such as in the form of a solid-state disk (SSD) drive installed in a personal computer or as a non-volatile dual in-line memory module (NVDIMM) in a host system.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A non-volatile control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Media Management Layer (MML) 238 (also referred to as a Flash Translation Layer, or FTL, in the case where non-volatile memory is flash) may be integrated as part of the non-volatile management that may handle errors and interfacing with the host. MML may be a module in memory management. In particular, the MML 238 may include an algorithm in the memory device firmware which translates writes from the host into writes to the non-volatile memory 126 of memory die 108. The MML 238 may be needed because: 1) the non-volatile memory may have limited endurance, retention, or be susceptible to disturbances from other media activities; 2) the non-volatile memory 126 may only be written in multiples of pages; and/or 3) the non-volatile memory 126 may not be written unless it is erased as a block (i.e. a block may be considered to be a minimum unit of erase). The MML 238 understands these potential limitations of the non-volatile memory 126 which may not be visible to the host. Accordingly, the MML 238 attempts to translate the writes from host into writes into the non-volatile memory 126.

Controller 122 may interface with one or more memory die 108. In in one embodiment, Controller 122 and multiple memory dies (together comprising memory system 100)

implement a solid-state drive (SSD), which can emulate, replace or be used instead of a hard disk drive inside a host, as a NAS device, etc. Additionally, the SSD need not be made to work as a hard drive.

Figure 4A:
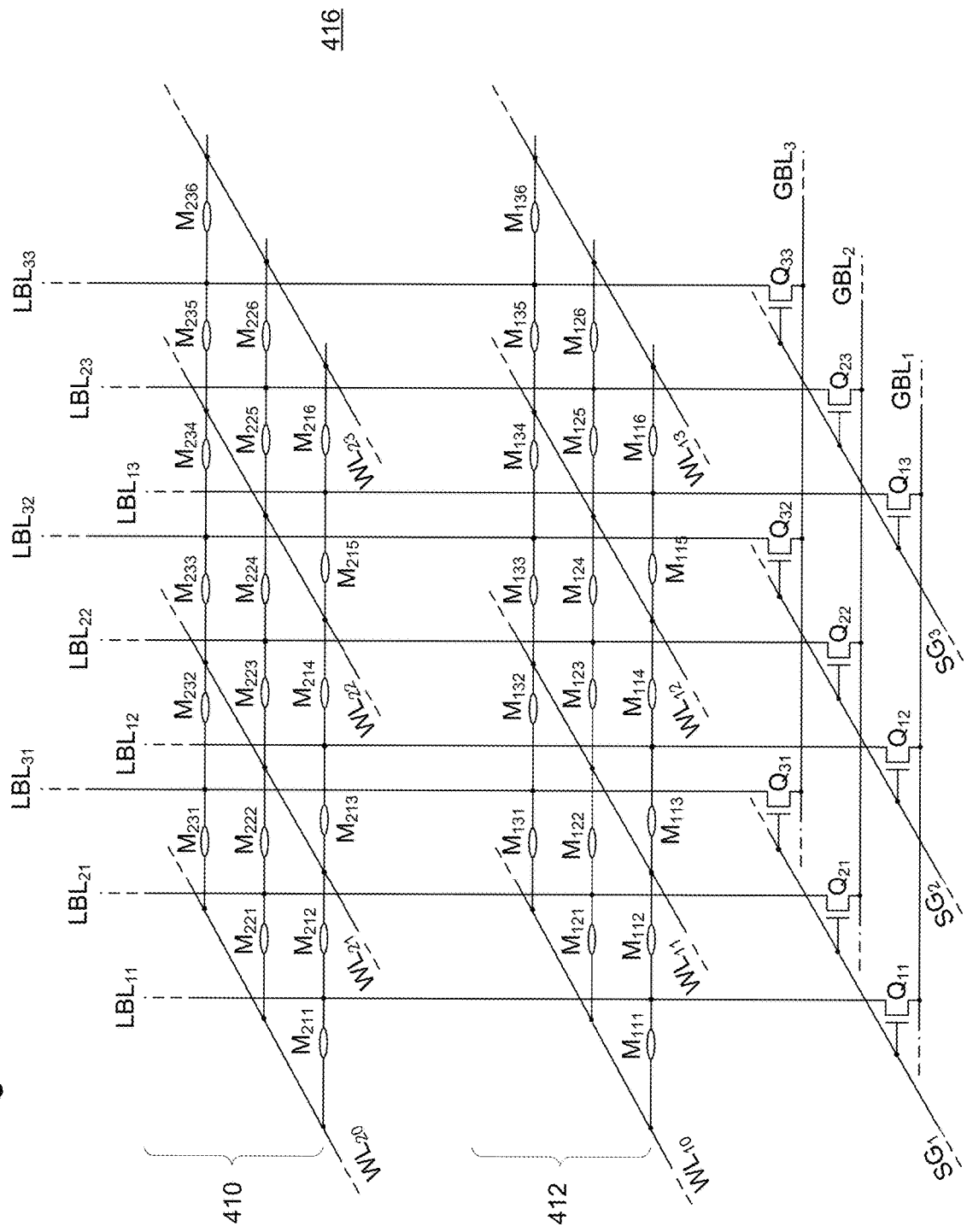
FIGS. 4A-B illustrate an embodiment of a three-dimensional monolithic memory structure.

FIG. 4A depicts one embodiment of a portion of a monolithic three-dimensional memory array 416 that includes a first memory level 412 positioned below a second memory level 410. Memory array 416 is one example of an implementation for three-dimensional memory structure 126 in FIG. 2. As depicted, the local bit lines LBL11-LBL33 are arranged in a first direction (i.e., a vertical direction) and the word lines WL10-WL23 are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell M111 is disposed between local bit line LBL11 and word line WL10). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines GBL1-GBL3 are arranged in a third direction that is perpendicular to both the first direction and the second direction. A set of bit line select devices (e.g., Q11-Q31) may be used to select a set of local bit lines (e.g., LBL11-LBL31). As depicted, bit line select devices Q11-Q31 are used to select the local bit lines LBL11-LBL31 and to connect the local bit lines LBL11-LBL31 to the global bit lines GBL1-GBL3 using row select line SG1. Similarly, bit line select devices Q12-Q32 are used to selectively connect the local bit lines LBL12-LBL32 to the global bit lines GBL1-GBL3 using row select line SG2 and bit line select devices Q13-Q33 are used to selectively connect the local bit lines LBL13-LBL33 to the global bit lines GBL1-GBL3 using row select line SG3.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096. In another embodiment, the memory cells accessed in parallel may be more granular such as 1, 64, or 128.

Figure 4B:
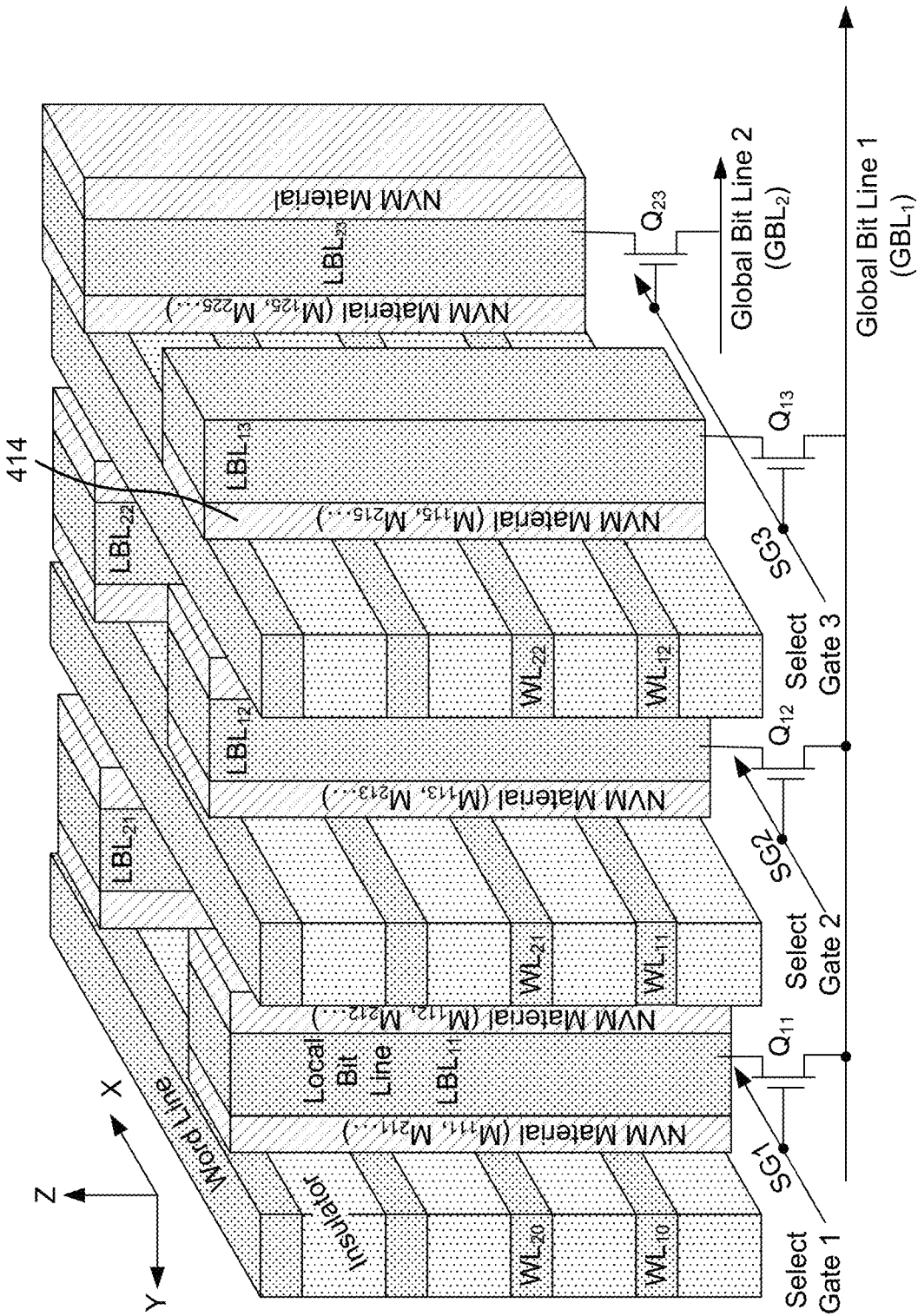

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between WL12 and LBL13 and a part of a second memory cell associated with the cross section between WL22 and LBL13. In some cases, a vertical bit line, such as LBL13, may comprise a vertical structure (e.g., a rectangular prism, a cylinder, or a pillar) and the non-volatile material may completely or partially surround the vertical structure (e.g., a conformal layer of phase change material surrounding the sides of the vertical structure in phase change memory cells). As depicted, each of the vertical bit lines may be connected to one of a set of global bit lines via a select transistor. The select transistor may comprise a MOS device (e.g., an NMOS device) or a vertical thin-film transistor (TFT).

Figure 5:
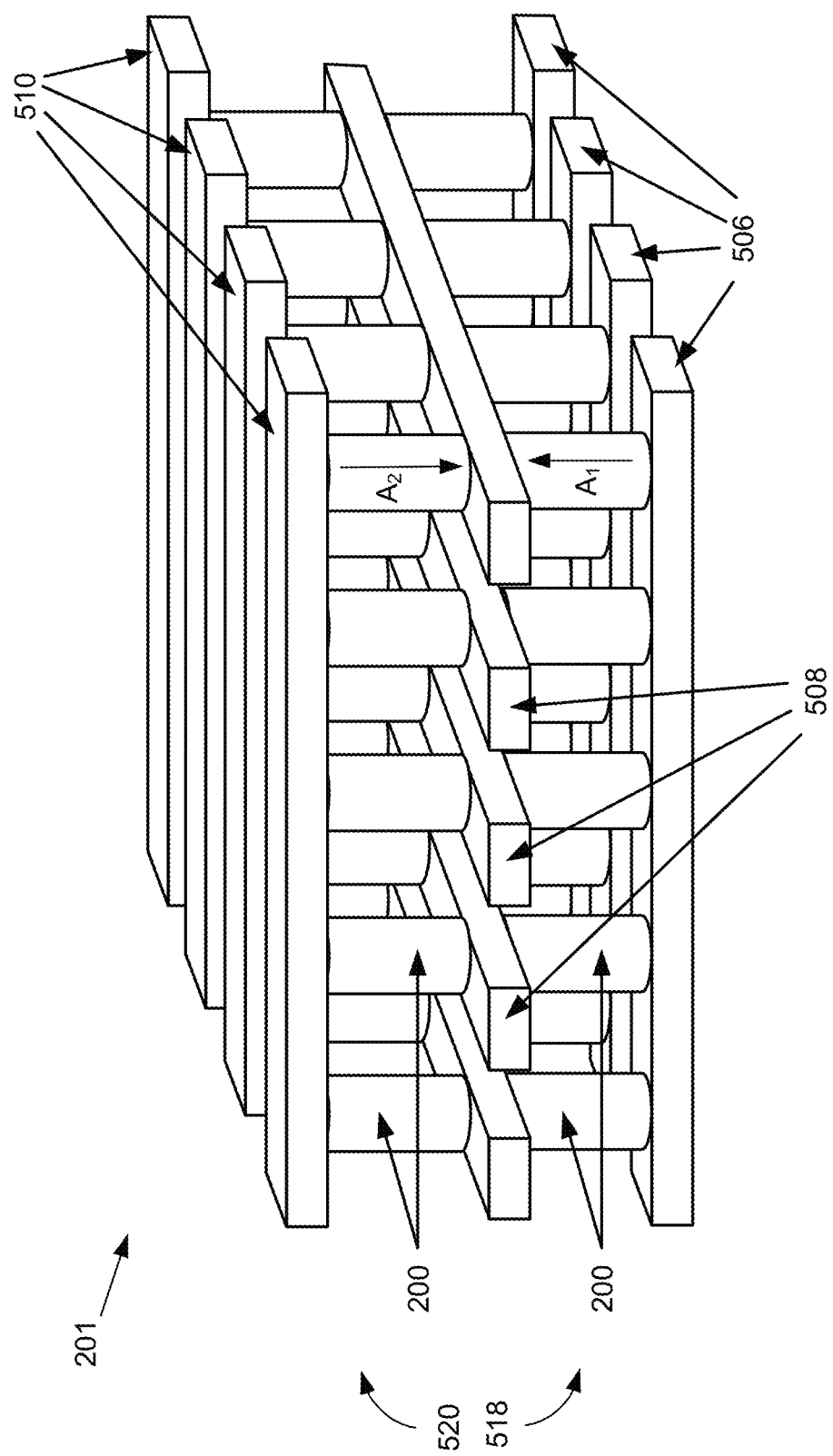
FIG. 5 illustrates two layers of an embodiment of a three-dimensional monolithic memory structure.

FIG. 5 depicts one embodiment of a portion of a monolithic three-dimensional memory array 201 that includes a second memory level 520 positioned above a first memory level 518. Memory array 201 is one example of an implementation for non-volatile memory die 108. The bit lines 506 and 510 are arranged in a first direction and the word lines 508 are arranged in a second direction perpendicular to the first direction. As depicted, the upper conductors of first memory level 518 may be used as the lower conductors of the second memory level 520 that is positioned above the first memory level. In a memory array with additional layers of memory cells, there would be corresponding additional layers of bit lines and word lines.

As depicted in FIG. 5, memory array 201 includes a plurality of memory cells 200. The memory cells 200 may include re-writeable memory cells. The memory cells 200 may include non-volatile memory cells or volatile memory cells. With respect to first memory level 518, a first portion of memory cells 200 are between and connect to bit lines 206 and word lines 508. With respect to second memory level 520, a second portion of memory cells 200 are between and connect to bit lines 510 and word lines 508. In one embodiment, each memory cell includes a steering element (e.g., a diode) and a memory element (i.e., a state change element). In one example, the diodes of the first memory level 518 may be upward pointing diodes as indicated by arrow $A_1$ (e.g., with p regions at the bottom of the diodes), while the diodes of the second memory level 520 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 5 may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 5 may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Different types of non-volatile memory may have very different media properties, including endurance characteristics and may have different likely failure modes. For example, block-erasable memories may use logical-to-physical mapping to accommodate writing the same data to different locations (e.g. when data is updated it may be written in a new block). A wear leveling scheme may remap data from a heavily worn block in such a memory and write-erase cycles may be counted on a block-by-block basis. Certain types of non-volatile memory do not require an erase between writes (previous data may be overwritten) and may be considered write-in-place memories. Some write-in-place memories are proposed as candidates to replace DRAM main memory in some processing systems because of their high read and write speeds and may be referred to as "storage class memory" or SCM. Unlike DRAM, such memories retain data when power is lost and may also be referred to as "persistent memory." ReRAM, MRAM, and Phase Change Memory (PCM) may be considered persistent memory examples and may be considered as SCM. Some forms of SCM may have relatively low endurance compared to DRAM. While overwriting old data with corresponding replacement data allows fast writing and simplifies memory management, if particular data is frequently updated, a corresponding physical area may become worn rapidly. Thus, wear leveling for write-in-place memories poses particular challenges. While aspects of the present technology are described with respect to write-in-place memories, it will be understood that the present technology is applicable to any suitable memory and is not limited to write-in-place.

Referring to FIG. 5, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 5, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Figure 6:
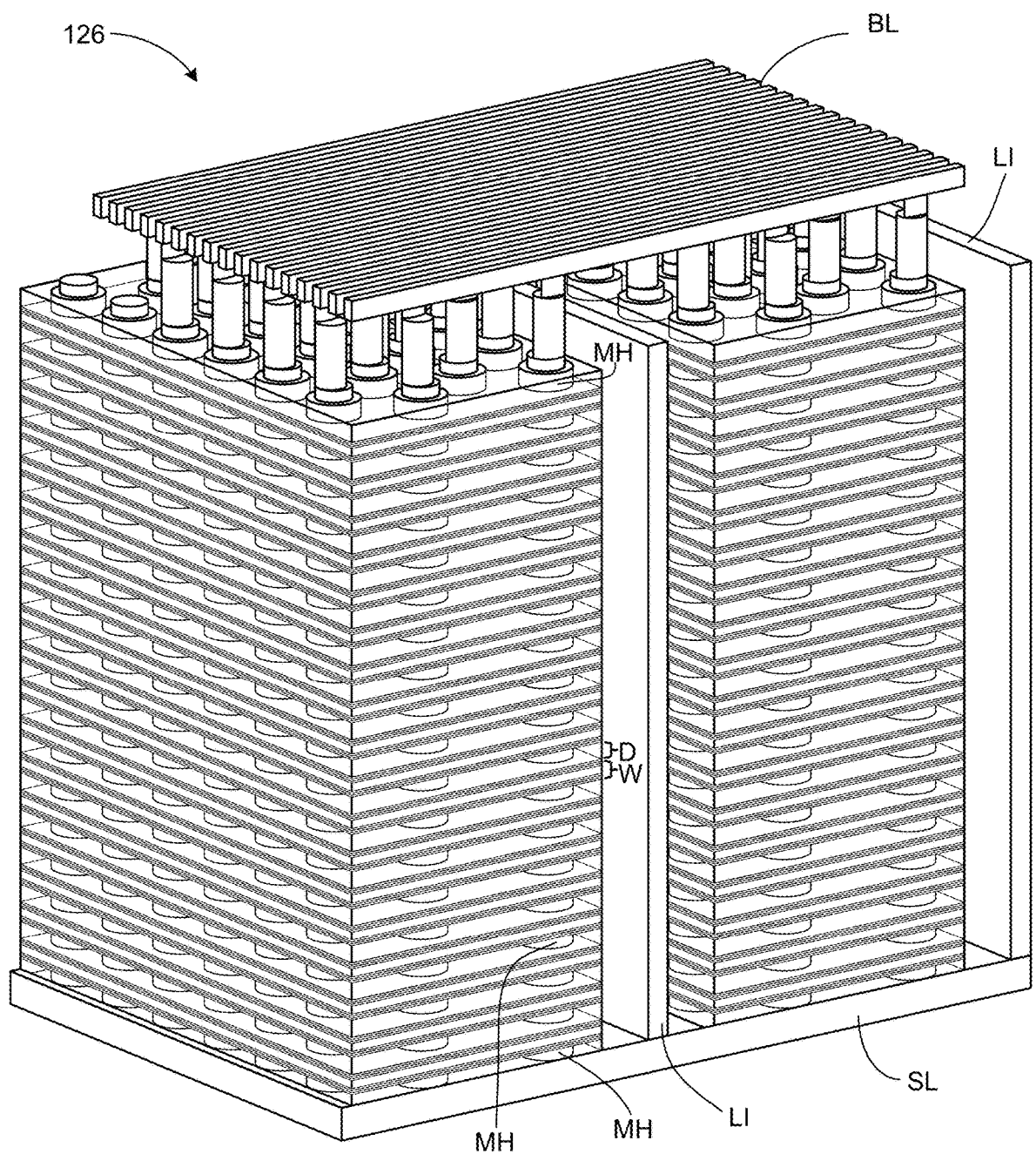
FIG. 6 illustrates an embodiment of a three-dimensional monolithic memory structure.

FIG. 6 is a perspective view of a portion of another embodiment of a three-dimensional memory structure 126, which includes a plurality memory cells. For example, FIG. 6 shows a portion of one block of a block-erasable memory and is one example of an implementation for non-volatile memory die 108. The structure depicted includes a set of bit lines BL positioned above a stack of alternating dielectric layers and conductive layers. For example, purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 6 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 6, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Although the example memory system of FIG. 6 is a three-dimensional memory structure that includes vertical NAND strings with charge-trapping material, other (2D and 3D) memory structures can also be used with the technology described herein. For example, floating gate memories (e.g., NAND-type and NOR-type flash memory, ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (e.g. MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the cell, one above and one below the cell. When current is passed through them, an induced magnetic field is created.

Phase change memory (PCM, or PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave. PCM may also be operated and controlled by electrical currents for heating and cooling rather than lasers.

While specific examples of memory cells and memory array design are described above, it will be understood that the presently described technology is not limited to a particular type of memory cell, or to a particular array design.

Different types of non-volatile memory have different requirements. Some memory devices require an erase operation to reuse memory cells that contain obsolete data. For example, flash memory cells that are written are generally erased before they are used to store new data (i.e. overwriting existing data with new data is not commonly done in flash memory). In general, the unit of erase (referred to as an "erase block" or "block") is larger than the unit of programming (referred to as a "page") so that when a page of data is to be updated, it is not generally practical to erase the physical page containing a previous copy of the data. In such systems, updated data may be written to a different physical location and the previous copy becomes obsolete. Logical addresses provided by the host may be mapped to physical addresses in a memory array using a mapping scheme that allows incoming data to be written to different memory cells that are already erased, often in a different block. Such mapping schemes may become quite complex as a memory fills with data and updated data is written to available spaces. Maintaining such a mapping scheme may require significant resources.

Some non-volatile memories allow memory cells to be reprogrammed without an erase operation (i.e. allow data to be overwritten). In such non-volatile memories, it is possible to write updated data at the same location as a previous copy of the data. Such memories may be referred to as "program-in-place" memories. Such memories allow host data to be mapped to physical locations in a non-volatile memory array in a simple manner. For example, each host address may map to a corresponding physical address in a one-to-one mapping scheme so that host addresses correspond to physical addresses in a static mapping. This may be considered a physical addressing scheme.

Some non-volatile memories have characteristics that allow them to be used in applications traditionally served by volatile memories, e.g. DRAM and SRAM. Such memories may be referred to as "storage class memory" and include program-in-place memories. Phase Change Memory (PCM) and ReRAM may be considered as examples of storage class memory. Such memories may be used to replace a traditional dual in-line memory module (DIMM) that contains DRAM with non-volatile DIMM (NVDIMM).

In some non-volatile memories, memory cells tend to wear out with use. Different types of memory generally have different media properties including endurance characteristics (different expected endurance limits) so that some types of memory wear out rapidly while others may endure a lot of wear without significant degradation. Some non-volatile memory systems use wear leveling to distribute wear across a memory and avoid concentration of wear in particular areas. In NAND flash memory, wear leveling schemes may be applied as part of a logical to physical mapping scheme, which is often used in such memories. In other memories, such as program-in-place memories, including PCM and ReRAM, a full logical to physical mapping scheme may not be necessary and may not be desirable because of the resources needed for such a scheme. However, some program-in-place memories have poor endurance characteristics (e.g. low expected endurance limit) so that wear leveling may be particularly important.

Certain examples presented here refer to wear leveling schemes that do not require maintaining a full logical to physical map for a memory array. While such schemes may be convenient for program-in-place memories including PCM and ReRAM, it will be understood that they may be applied to any type of memory.

FIGS. 7A-I show a simple example of a deterministic wear leveling scheme applied to a region of a non-volatile memory that includes 5 physical pages. Logical pages A-D are mapped to physical pages 0-4 (physical page numbers in the left column) in a cycle, with a gap rotating through the memory as logical pages are displaced. It will be understood that non-volatile memories, or memory regions, generally contain more than 5 physical pages to store more than 4 logical pages and that the present example is simplified for illustrative purposes.

FIG. 7A illustrates a first mapping of logical pages to physical pages in which logical page A is mapped to physical page 1, logical page B is mapped to logical page 1, logical page C is mapped to logical page 2, and logical page D is mapped to physical page 3. No logical page is mapped to physical page 4 so that physical page 4 is unwritten in this example and forms a gap in the mapping scheme.

FIG. 7B illustrates a second mapping of logical pages to physical pages in which logical page D and the gap are swapped. Thus, logical page D is mapped to physical page 4 (position incremented by one place) and physical page 3 is unwritten so that it forms a gap in the mapping scheme. The mapping of logical pages A-C to physical pages 0-2 respectively remains as before. Remapping may be performed by copying logical page D from physical page 3 to physical page 4 and updating a pointer that indicates the location of the gap from physical page 4 to physical page 3. In memories that require erasing before memory cells are written again physical page 3 may be erased.

Remapping from the first mapping of FIG. 7A to the second mapping of FIG. 7B may be performed in response to a triggering event such as an amount of elapsed time, or an amount of wear indicated by a number of read and/or write and/or erase operations performed on the memory, or some other event. For example, after a hundred writes to physical pages 0-4 collectively, remapping may be performed. In this way, individual counts are not necessary for each physical page and there is relatively little overhead (particularly for larger numbers of physical pages in a memory, or region of a memory). The number of writes that triggers a remapping may be selected according to the expected endurance of the memory cells, the number of physical pages in a group, and/or other factors. In some cases, instead of recording all writes to a region, some sampling may be performed and used to estimate a total number of writes to the region. This may reduce overhead associated with maintaining counts.

FIG. 7C illustrates a subsequent mapping of logical pages to physical pages in which logical page C is swapped with the gap. Logical page C is mapped to physical page 3 and the gap is mapped to physical page 2 (e.g. by updating a gap pointer). Mapping of other logical pages to physical pages remains as in FIG. 7B.

FIG. 7D illustrates a subsequent mapping of logical pages to physical pages in which logical page B is swapped with the gap. Logical page B is mapped to physical page 2 and the gap is mapped to physical page 1 (e.g. by updating a gap pointer). Mapping of other logical pages to physical pages remains as in FIG. 7C.

FIG. 7E illustrates a subsequent mapping of logical pages to physical pages in which logical page A is swapped with the gap. Logical page A is mapped to physical page 1 and the gap is mapped to physical page 0 (e.g. by updating a gap pointer). Mapping of other logical pages to physical pages remains as in FIG. 7D. Logical pages A-D have all been relocated by one position at this point (i.e. physical address incremented by 1).

FIG. 7F illustrates a subsequent mapping of logical pages to physical pages in which logical page D is swapped with the gap. Logical page D is mapped to physical page 0 and the gap is mapped to physical page 4 (e.g. by updating a gap pointer). Mapping of other logical pages to physical pages remains as in FIG. 7E. Thus, it can be seen that the gap has cycled around to physical page 4, where it started in FIG. 7A. During this gap cycle, each logical page was incremented by one physical page, e.g. logical page A, from 0 to 1, logical page B, from 1 to 2. The mapping of logical pages to physical pages is thus offset by one from the mapping shown in FIG. 7A with logical pages remaining in the same cyclic order. Any such mapping may be indicated very simply. For example, in addition to a gap pointer, a start pointer may indicate a start location (e.g. the location where logical page A is stored). Thus, the mapping of FIG. 7F could be indicated by a start pointer indicating physical page 1 and a gap pointer indicating physical page 4, while the mapping of FIG. 7C would be indicated by a start pointer indicating physical page 0 and a gap pointer indicating physical address 2.

FIG. 7G illustrates a mapping after a subsequent gap cycle (i.e. after a sequence of gap moves that brings the gap back to physical page 4). It can be seen that the logical pages are incremented by another physical page by this gap cycle (i.e. offset by two pages from the mapping of FIG. 7A). Thus, the start pointer would indicate physical page 2 and the gap pointer would indicate physical page 4 for this mapping.

FIG. 7H illustrates a mapping after a subsequent gap cycle. It can be seen that the logical pages are incremented by another physical page by this gap cycle (i.e. offset by three pages from the mapping of FIG. 7A). Thus, the start pointer would indicate physical page 3 and the gap pointer would indicate physical page 4 for this mapping.

FIG. 7I illustrates a mapping after a subsequent gap cycle. It can be seen that the logical pages are incremented by another physical page by this gap cycle (i.e. offset by four pages from the mapping of FIG. 7A). Thus, the start pointer would indicate physical page 0 and the gap pointer would indicate physical page 4 for this mapping. This represents the same mapping as in FIG. 7A so that a full cycle has been completed and the cycle begins again. The scheme illustrated in FIG. 7A-I provides a simple deterministic (mathematical) wear leveling scheme that does not require maintaining a full logical to physical map. A mapping can be indicated by just two pointers representing the start location and gap location and may be referred to as a "start gap" scheme. This represents a significantly lower overhead than recording large numbers of individual page mappings. Other deterministic mapping schemes may also be used to map logical addresses to physical addresses in a manner that changes the mapping in a predetermined manner (e.g. according to a mathematical scheme) that can be represented by a relatively small amount of data (significantly less than a full look-up index table). For example, U.S. Patent Publication Number 2017/0177470, "Access network for address mapping in non-volatile memories" describes examples that may provide alternative regional wear leveling schemes.

A mathematical wear leveling scheme may be applied across an entire non-volatile memory as a single unit. However, for large memories, this may not provide sufficient movement to avoid memory cell wear out. For example, for a 1TiB (one binary terabyte or one times 2^40 bytes) memory with a physical page size of 64 B, it would take more than 17 billion (1.7E10) gap moves to complete a gap cycle. In other examples, memories may be accessed in different units of read (e.g. 128B, 256B, or other unit) and memories may be of any size. For some types of memory with relatively low endurance, this would allow a physical page to be worn out during a gap cycle (e.g. some Storage Class Memory (SCM) memories have estimated or targeted endurance of about 5E5 writes). In some cases, an individual logical address may be sequentially written many times (e.g. because of malicious attack) so that a physical page may be worn out before a gap would remap the logical page. For various medias and interfaces the behavior at the end of endurance when the device is worn out may vary. It is possible for the media to have a predicted endurance that will be over or under achieved in actual deployment. Further, it is possible for the device to have knowledge of the pre-existing media expectations. Thus, the end of endurance can be through some monitoring or behavior change, or it may be assumed by the controller pre-emptively.

Figure 8:
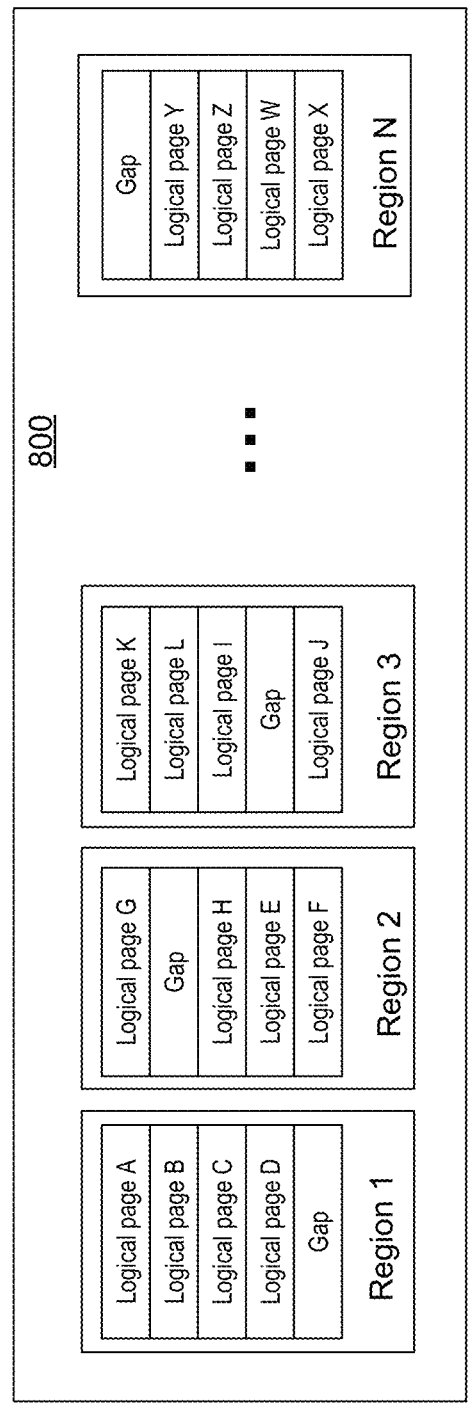
FIG. 8 illustrates a non-volatile memory with separate instances of a regional wear leveling operating independently in each region.

FIG. 8 illustrates an example of a non-volatile memory 800 that is mapped into N regions, with each region independently applying a mathematical wear leveling scheme (e.g. a start gap scheme). Different instances of a start gap wear leveling scheme are applied separately in regions 1-N. The size of a region (number of regions for a given memory) and the frequency of gap movement may be selected according to different goals. Those goals may be to match expected media endurance capabilities against host workloads of concern. A specific example is to choose group size and gap movements that would disrupt a series of sequential writes to an individual logical address before reaching an endurance limit of a physical page, e.g. for expected endurance of about 5E5 writes, a gap cycle should take fewer than 5E5 writes, for example 1E5 writes. Control circuits (e.g. in a controller such as controller 122) are configured to map a set of non-volatile memory cells into a plurality of regions (e.g. according to firmware that specifies a mapping scheme). Inclusion of other mitigating factors may be included in any example prediction. Examples of these mitigating factors include different media programming or sensing voltages, device controller cache, device throughput throttling, reduced host workload support, or other device controller features.

Figures 9A, 9B:
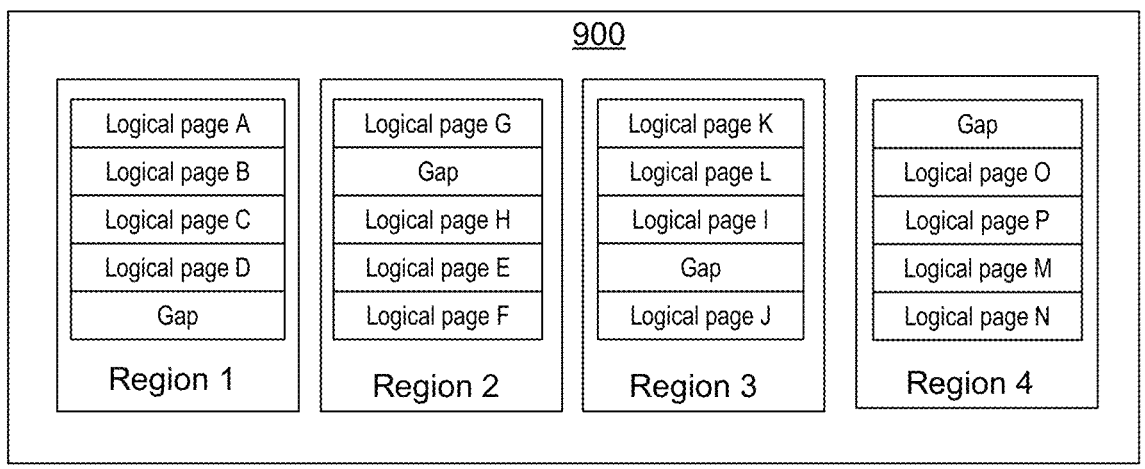
FIGS. 9A-B illustrates mapping of logical addresses to regions of a non-volatile memory.

FIGS. 9A-B illustrate a non-volatile memory 900 that is mapped into four regions with each of regions 1-4 operating a regional wear leveling scheme (an independent instance of a mathematical wear leveling scheme in this example). The mapping of logical pages to regions is fixed in this example, so that logical pages A-D are mapped to region 1, logical pages E-H are mapped to region 2, logical pages I-L are mapped to region 3, and logical pages M-P are mapped to region 4. Mapping of non-volatile memory cells into regions may be performed as part of initialization and may be performed by a memory controller that is configured to map non-volatile memory cells into regions. FIG. 9B is a table that indicates the mapping of logical addresses to regions. While such a scheme distributes wear within each individual region, some regions may receive more wear than others in such a scheme (e.g. logical pages A-D may be frequently written causing region 1 to wear out rapidly). Thus, one region may wear out prematurely and cause a memory system to fail while other regions have significant remaining life expectancy.

In some non-volatile memory, in addition to regional wear leveling schemes operating within regions, an inter-region wear leveling scheme may distribute wear between regions. Such inter-region wear leveling may avoid concentration of wear in any particular region so that early wear out of a region may be avoided.

FIGS. 10A-B illustrate a non-volatile memory 1000 that has an inter-region wear leveling scheme that operates between regions 1-5, in addition to individual regional wear leveling schemes operating within each region 1-5. FIG. 10A shows non-volatile memory cells of non-volatile memory 1000 mapped into regions 1-5 with data stored in regions 1-4, with each of regions 1-4 having a respective gap according to its wear leveling scheme. No data is stored in region 5. FIG. 10B is a table that indicates the mapping of groups of logical pages to regions for non-volatile memory 1000. It can be seen that region 5 is not mapped to any logical pages in this example but instead is a gap in the mapping scheme. An example of an inter-region wear leveling scheme operates by moving this gap from region to region in a similar manner to the start gap wear leveling scheme of FIGS. 7A-I. Thus, in addition to applying a first wear leveling scheme in a given region (e.g. region 1) a second wear leveling scheme is applied between regions 1-5 in this example.

FIG. 11A shows non-volatile memory 1000 after a first gap move from region 5 to region 4. Logical pages M-P are relocated from region 4 to region 5 and the gap is relocated from region 5 to region 4 as indicated by the table of FIG. 11B. Other logical page to region mapping remains as before. The updated mapping may be recorded by a pointer as before or in a table maintained by a memory system to record allocation of logical addresses to regions (e.g. as shown in FIG. 11B). While moving region 4 into region 5, it is possible to move one page at a time while tracking the progress of the move with a pointer. If accessing Logical pages M-P, a comparison for above or below the pointer will determine if the data is still in region 4 or already transitioned to region 5. These transitions may be done one Logical page at a time, or it may be accomplished in groups of moves (i.e. two or more transitions at a time). In some cases, an entire region may be copied into cache prior to being written back to the non-volatile memory and no copy may remain in the non-volatile memory during this transition. The transitions between regions may be tracked with a pointer or other tracking scheme.

FIG. 12A shows non-volatile memory 1000 after a second gap move from region 4 to region 3. Logical pages I-L are relocated from region 3 to region 4 and the gap is relocated from region 4 to region 3 as indicated by the table of FIG. 12B. Other logical page to region mapping remains as before. The updated mapping may be recorded by a pointer as before or in a table maintained by a memory system to record allocation of logical addresses to regions (e.g. as shown in FIG. 12B).

FIG. 13A shows non-volatile memory 1000 after a third gap move from region 3 to region 2. Logical pages E-H are relocated from region 2 to region 3 and the gap is relocated from region 3 to region 2 as indicated by the table of FIG.

13B. Other logical page to region mapping remains as before. The updated mapping may be recorded by a pointer as before or in a table maintained by a memory system to record allocation of logical addresses to regions (e.g. as shown in FIG. 13B).

FIG. 14A shows non-volatile memory 1000 after a fourth gap move from region 2 to region 1. Logical pages A-D are relocated from region 1 to region 2 and the gap is relocated from region 2 to region 1 as indicated by the table of FIG. 14B. Other logical page to region mapping remains as before. The updated mapping may be recorded by a pointer as before or in a table maintained by a memory system to record allocation of logical addresses to regions (e.g. as shown in FIG. 14B). A subsequent gap move returns the gap to region 5 and so on, with the mapping of logical addresses incrementing by one region for each gap cycle. Though not explicitly shown in the above figures, it will be understood that each region may continue its regional wear leveling scheme between steps in the inter-region wear leveling scheme which are generally less frequent. While regional wear leveling operates at a page level, inter-region wear leveling operates over a larger unit of data of a group of logical pages and may require multiple copy operations. One or more pointers may be used to track such copying to allow resumption if copying is interrupted. While inter-region wear leveling may be performed at discrete intervals in some cases (e.g. during idle time when there is little or no impact on host operations or during a power-up or booting routine) in some cases, inter-region wear leveling is performed continuously with relocations interleaved with host access operations so that gap moves proceed while host access operations are performed (e.g. servers that may be in continuous operation and may not have idle time).

While the same type of wear leveling scheme (start gap wear leveling) is used for both regional wear leveling and inter-region wear leveling in this example, different wear leveling schemes may also be used and inter-regional wear leveling may operate substantially independently of regional wear leveling. Remapping in an inter-region wear leveling scheme may be performed in response to a triggering event such as an amount of elapsed time, or an amount of wear indicated by a threshold number of read and/or write and/or erase operations performed on the memory, or some other event. A count may be maintained for a memory such as non-volatile memory 1000 that indicates wear across regions (e.g. by summing individual write counts maintained for individual regions for respective regional wear leveling schemes, sampling across regions, or otherwise). The number of writes that triggers an inter-region remapping may be selected according to a number of factors including, for example, the disparity in wear between regions (e.g. as indicated by individual write counts), disparity of access intensity, estimated endurance of memory cells, region size, and/or other factors.

In some cases, host logical addresses may be grouped and assigned to regions by simply dividing a host logical address space into contiguous ranges with each range forming a group. In other cases, host addresses may be grouped according to data access patterns so that, for example, frequently written addresses are grouped together, and infrequently written addresses are also grouped together. In other examples, frequently accessed and infrequently accessed data may be grouped together to produce groups of logical pages with similar overall wear for each group.

FIG. 15 shows an example in which received logical data from a host is divided into four groups 1-4 on the basis of expected access patterns (e.g. expected write frequency). A first group of logical pages A-D, Group 1, is expected to be written with low frequency. Groups 2 and 3, consisting of logical pages E-H and I-L respectively, are expected to be written with medium frequency. Group 4, consisting of logical pages M-P are expected to be written with high frequency. Information about host access patterns may be obtained from a host (e.g. via indicators of expected host access patterns associated with host logical addresses), heuristically extracted due device monitoring, cache effectiveness monitoring, or other indicators. In some cases, the access patterns may be used to group data accordingly, e.g. by grouping host logical addresses with similar access patterns together, or by mixing data with different access patterns. For example, a host that is in communication using the NVMe protocol may specify one or more NVMe namespaces that indicate host logical address ranges with specified characteristics including expected access frequency information. A group may be considered as a form of intermediate logical address or intermediate logical page (ILP).

In some memory arrays, some areas of the memory may have less desirable media properties than others. For example, in memories some layers may have lower endurance, retention, voltage disturbs, bit error rate accumulations, or media predictability than others. In one example, locations with lower or higher endurance may be known for a given memory design and may be common to all memories of a given design so that a prediction of endurance may be made prior to use. Endurance predictions may also be obtained from testing, or observed behavior (e.g. error rate found by ECC), and indications of endurance expectations may be recorded during testing for later use. Physical areas with similar media property expectations may be assigned to the same region so that memory cells within a given region have similar endurance expectations. Alternatively, the regions may be constructed of diverse media expectations to drive a more average and even behavior throughout the drive. The mapping of non-volatile memory cells into a plurality of regions (e.g. in physical pages or blocks) may be based on address order (e.g. contiguous physical addresses are mapped to different groups so that physical pages 0 to N−1 are in a first region, N to 2N−1 in a second region, and so on). Addresses may be scrambled or hashed before being assigned to regions, selected in a stepped order (e.g. counting mod x so that region 1 includes physical pages 1, 1+x, 1+2x, and so on), or otherwise selected according to sorting scheme. Layouts of the regions may be made to optimize for performance and expected access conflicts for target workloads (for example regions may be configured for any of: sequential accesses, 4 kB accesses for block storage to memory accesses, media die access conflicts (i.e. configured to avoid subarray, plane, die, or partition access conflicts by distributing potentially-conflicting data across subarrays, planes, dies, or partitions)). A region may be considered an intermediate physical address or intermediate physical block (IPB) with each region having capacity to store one group to allow groups to be mapped to regions in a one-to-one mapping.

FIG. 16 shows an example of a memory in which non-volatile memory cells are mapped into 5 regions that are classified according to their expected endurance. Regions 1 and 5 are classified as low endurance regions. Region 2 is classified as a high endurance region. Regions 3 and 4 are classified as medium endurance regions. Each region may be formed of physical areas that are expected to have similar endurance characteristics (similar expected endurance limits) and may be physically dispersed across multiple devices.

Mapping of non-volatile memory cells into regions may be performed in any suitable sized unit (e.g. by page, block, or other unit) and may be a static mapping or may be dynamic, i.e. some remapping may occur during operation. Mapping of a set of non-volatile memory cells into a plurality of regions may be performed by a memory controller (e.g. according to firmware) and may be performed as part of an initialization and/or subsequent to initialization.

Knowing likely data access patterns and/or endurance expectations for different regions allows such factors to be taken into account when assigning logical data to regions. For example, data that is frequently accessed may be assigned to regions that have high endurance while infrequently accessed data may be assigned to regions that have low endurance. Alternatively, two regions of high access rate may be placed for minimal access conflicts. Access operations include read and write operations, and may include erase operations in memories that perform erase between writes. Write operations are generally associated with wear and a write count may be used as a measure of wear. In some cases, read operations may also cause wear and may be considered when measuring wear (e.g. in addition to write operations in a weighted scheme). While examples described refer to write operations as examples of memory access operations, it will be understood that other memory access operations such as read, erase, refresh or other operations may also be considered when estimating wear.

FIGS. 17A-B illustrate a mapping of logical pages of FIG. 15 to regions of FIG. 16 according to access frequency and endurance. Logical pages A-D, which have low expected access frequency, are mapped to region 1, which has low endurance. Logical pages M-P, which have high expected access frequency, are mapped to region 2, which has high endurance. Logical pages E-H and I-L, which have medium expected access frequency are mapped to region 4, which has medium endurance. A gap for an inter-region wear leveling scheme is assigned to region 5, which has low endurance. This may represent an initial mapping in a memory so that at least initially data is assigned in a manner that accounts for different expected access patterns and different endurance characteristics. While regions are classified into just three classes (low, medium, and high endurance) in this example, it will be understood that any number of classes may be used. Similarly, host access frequency may be divided into any suitable number of classes. Subsequent to the mapping shown in FIGS. 17A-B an inter-region wear leveling scheme may be applied so that the mapping shown is changed. While an inter-region wear leveling scheme may be a mathematical wear leveling scheme that blindly remaps logical groups between physical regions, in some cases an inter-region wear leveling scheme may be based on actual or estimated wear.

FIG. 18 shows an example of data that is remapped from a first mapping to a second mapping according to an indicator of wear shown in the right column. The indicator may be a total number of writes experienced by the region, number of gap cycles (which is a fraction of the total number of writes), number of full cycles (which is a smaller fraction of the total number of writes), a statistically estimated number of writes based on sampling, or some other metric. It can be seen that region 3, containing logical pages I-L has an indicator that indicates higher wear than any other region. Therefore, the group containing logical pages I-L is relocated to region 5 (which has been unused up to this point) so that the most frequently written data is relocated to the least worn region. An indicator of wear may be maintained for each region and/or for each logical group of data. Such a scheme may be based on observed wear per region and may be implemented with or without indicators of access frequency information from a host, and with or without information about expected endurance for different regions. A map may be maintained to identify which logical group of pages is mapped to which region. The number of regions is generally a small fraction of the number of pages so that such a map represents a relatively small overhead. Mathematical wear leveling may be used for regional wear leveling so that such a system benefits from the simplicity of mathematical wear leveling at a regional level and also benefits from the adaptability of wear leveling based on recorded wear data at the inter-regional level. Thus, two levels of wear leveling (regional and inter-region) are provided in this example. In other examples, three or more layers of wear leveling may be provided (e.g. another layer above the one illustrated in FIG. 18, with regions 1-5 forming a single region in a higher-level scheme). At any level, wear leveling may be mathematical or may be based on media properties such as expected endurance or other properties.

FIG. 19 shows an example of a non-volatile memory system 1900 that maintains indicators of wear for each region in a first table 1902 and maintains a recording of access frequency for each group of logical pages in a second table 1904. It will be understood that during an initial mapping period, these numbers will be equal (i.e. the number of writes experienced by a region will be equal to the number of writes to the group of logical pages assigned to the region). However, as groups are moved to distribute wear during a period of use, these numbers diverge. While groups of logical data may have widely different numbers of writes, regions tend to have numbers of writes that are in a narrower range due to wear leveling. Tables such as tables 1902 and 1904 allow groups of logical pages to be remapped to physical regions according to wear, for example, to evenly distribute wear, or to distribute wear according to expected media properties of different regions including their estimated endurance. While the above examples refer to estimated endurance as an example of a media property of physical units that may be used in implementations of the present technology, other media properties may also be used, either alone or in combination, including bit error accumulation rate, retention, sensitivity to disturbs and other media properties that may indicate a deterioration in physical memory. Furthermore, while access rate, or number of writes, is used as an access parameter in examples above, it will be understood that other memory access parameters may also be used in a wear leveling scheme, including time since last access, burst access versus steady access, localized versus dispersed access, access size, and other factors.

FIG. 20 illustrates an example of a method that includes applying a first instance of a regional wear leveling scheme in a first region of a non-volatile memory 2002, applying a second instance of the regional wear leveling scheme in a second region of the non-volatile memory 2004; and applying an inter-region wear leveling scheme between the first region of the non-volatile memory and the second region of the non-volatile memory 2006. It will be understood that the number of regions in this example is two for simplicity but that some memory systems may have much larger numbers of regions.

The regional wear leveling scheme may be a mathematical wear leveling scheme that includes rotating a mapping of logical addresses to physical addresses in a predetermined cyclical pattern (e.g. by incrementing an offset as previously shown in FIGS. 7A-I). Inter-regional wear leveling may also be mathematical wear leveling, e.g. may include rotating the mapping of groups of logical addresses to regions according to a predetermined cyclical pattern. Alternatively, wear indicators may be maintained for the first and second regions (and any other regions) and the inter-region wear leveling scheme may remap groups of data between regions according to such wear indicators. Indicators of expected access patterns may be used to initially group data, e.g. keeping data with similar host access patterns together so that frequently written data is in one or more groups and infrequently written data is in other groups. In some cases, indicators of expected host access patterns associated with host logical addresses may be sent by a host and host logical addresses may be grouped according to the one or more indicators of expected host access patterns into at least a first group assigned to a first region of the non-volatile memory and a second group assigned to a second region of the non-volatile memory (e.g. grouped into frequently written and infrequently written groups that are written to different regions). In some cases, host data access patterns may be identified from a plurality of host access commands and host logical addresses may be grouped according to the host data access patterns into at least a first group assigned to the first region of the non-volatile memory and a second group assigned to the second region of the non-volatile memory (e.g. grouped into frequently written and infrequently written groups that are written to different regions).

Figure 21:
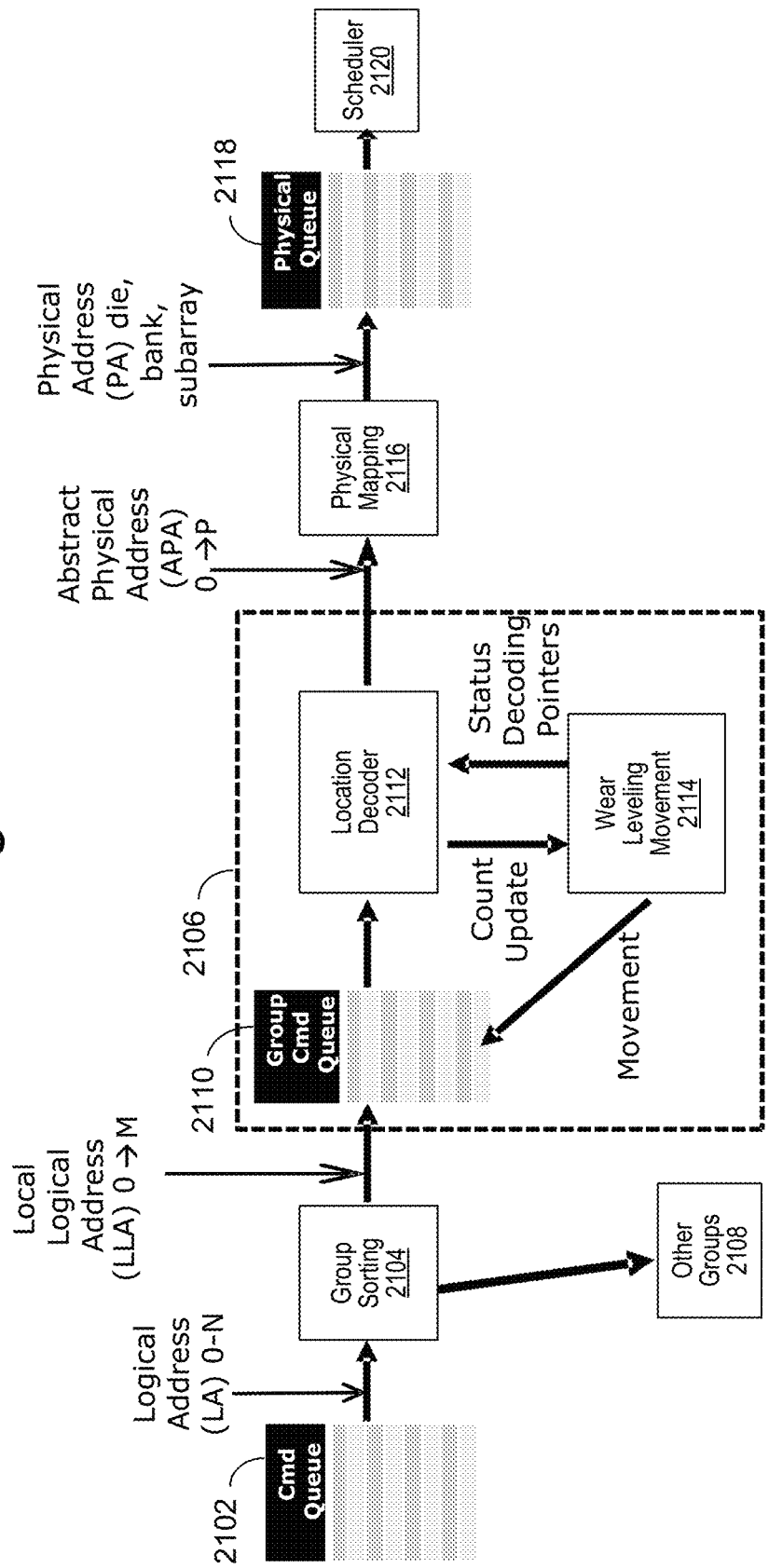
FIG. 21 illustrates an example of hardware for implementing regional and inter-region wear leveling.

FIG. 21 illustrates an example embodiment of regional and inter-region wear leveling that may be implemented in a non-volatile memory system such as non-volatile memory system 100 (e.g. in media management layer 238). A command queue 2102 contains commands received from a host including commands with host logical addresses (LAs) from 0 to N. Group sorting module 2104 sorts logical addresses according to group, where host logical addresses have been previously assigned to groups (e.g. groups of equal size that contain data for one region of non-volatile memory, in other examples groups may be of unequal size) and groups have been assigned to regions. FIG. 21 illustrates a regional wear leveling module 2106 that applies a regional wear leveling scheme for a corresponding region that stores a group comprised of M host logical addresses that are assigned to local logical addresses 0-M (other host logical address ranges may be similarly assigned to local logical addresses 0-M for other regional wear leveling modules so LAA=0 in a given region does not mean LA=0). Other regional wear leveling modules apply a wear leveling scheme in other regions in a similar manner. Group sorting module 2104 identifies other host logical address ranges that correspond to one or more other groups 2108 that implement other instances of a regional wear leveling scheme in parallel. A group command queue 2110 contains only commands for the group or region (similar components are present in other regions for handling respective commands). A command passes from group command queue 2110 to location decoder 2112, which identifies a physical address corresponding to the command. Location decoder 2112 may maintain pointers, for example, start and gap pointers as previously described, to enable a simple decoding of logical addresses without requiring a map of all logical addresses. A count update output is provided to a wear leveling movement module 2114 as required. For example, a count update may be sent for every write command. Wear leveling movement module 2114 maintains a count of write commands and implements movement of data in response to a triggering event, for example after a predetermined number of write commands. Implementation in this example includes generating movement commands that are sent to the group command queue for subsequent execution (e.g. copying of data to a gap from a neighboring line) and generating updates to any pointers used by location decoder 2112 (e.g. updating a gap pointer and/or updating a start pointer). Location decoder 2112 generates an abstract physical address (APA) in the range 0-P (e.g. by incrementing a local logical address), which is converted into a physical address (PA) by physical mapping module 2116 (e.g. into an address that specifies a physical location in terms of a die, bank, subarray, or other physical unit). These commands are placed in a physical command queue 2118 and from there pass to a scheduler 2120 to be executed in the non-volatile memory array. In this example, the number of abstract physical addresses in a region, P, is greater than the number of local logical addresses M, e.g. P=M+1, to allow for a gap. In other regional wear leveling schemes this may not be the case, e.g. in some cases M=P.

The regional wear leveling scheme of FIG. 21 may be implemented independently in each region and is not visible to a host. Regional wear leveling module 2106 may be considered a means for operating an instance of a mathematical wear leveling scheme in a region of non-volatile memory while other similar modules act as means for operating other instances of the mathematical wear leveling scheme in other regions of the non-volatile memory. Inter-region wear leveling may be implemented by changing logical address ranges mapped to regions, e.g. by reconfiguring group sorting module 2104 and copying data between regions. Thus, group sorting module 2104 may be considered a means for operating an inter-region wear leveling scheme between at least the first region and the second region. Thus, while regional wear leveling module 2106 applies a first wear leveling scheme in a first region of the plurality of regions, group sorting module 2104 applies a second wear leveling scheme between the plurality of regions.

The components of FIG. 21 may be physically located together (e.g. in a single memory controller) or may be located separately. For example, Group sorting module 2104 may be in a memory controller (e.g. in a media management module) while regional wear leveling module 2106 may be physically separate, e.g. in a lower level controller in a memory die, bank, subarray, or other unit of memory. In some cases, a regional wear leveling module may communicate with an inter-regional wear leveling module such as group sorting module 2104 to coordinate regional and inter-regional wear leveling. In other cases, regional and inter-regional wear leveling may be independent. Their implementations may be split across different aspects of the controller. For example, the group sorting may be in hardware, but the group movement may be FW managed or initiated.

An example of a non-volatile storage apparatus includes: a set of non-volatile memory cells; and one or more control circuits in communication with the set of non-volatile memory cells, the one or more control circuits are configured to map the set of non-volatile memory cells into a plurality of regions, apply a first wear leveling scheme in a first region of the plurality of regions, and apply a second wear leveling scheme between the plurality of regions.

The first wear leveling scheme may be a deterministic wear leveling scheme. The set of non-volatile memory cells may have an expected endurance limit and the first wear leveling scheme may be configured to remap received logical data at a rate sufficient to ensure remapping of a sequence of writes to an individual logical address from a first physical address to a second physical address before the expected endurance limit of the first physical address is reached. The one or more control circuits may be configured to record wear data for the plurality of regions and the second wear leveling scheme may be based on the wear data for the plurality of regions. The one or more control circuits may be configured to obtain access frequency information for logical address ranges used by a host, and the second wear leveling scheme may be further based on the access frequency information. The one or more control circuits may be configured to obtain the access frequency information through indicators of access frequency sent by the host. The one or more control circuits may be configured to obtain the access frequency information through recording of access frequency experienced over a period of use. The set of non-volatile memory cells may comprise phase change memory cells. The set of non-volatile memory cells may comprise Resistive Random Access Memory (ReRAM) cells, PCM, NAND, NOR, MRAM, etc. The set of non-volatile memory cells may be formed in a plurality of memory levels disposed above a substrate in a monolithic three-dimensional memory structure. The one or more control circuits may be configured to individually apply the first wear leveling scheme to each of the plurality of regions, the first wear leveling scheme is a start gap scheme, region size and rate of remapping of the start gap scheme may be sufficient to remap a series of sequential writes to an address prior to reaching an endurance limit, and wherein the second wear leveling scheme is based on recorded wear data for the plurality of regions.

An example of a method includes applying a first instance of a regional wear leveling scheme in a first region of a non-volatile memory; applying a second instance of the regional wear leveling scheme in a second region of the non-volatile memory; and applying an inter-region wear leveling scheme between the first region of the non-volatile memory and the second region of the non-volatile memory.

Applying the first instance of the regional wear leveling scheme in the first region may include rotating a mapping of logical addresses to physical addresses of the first region according to a predetermined cyclical pattern. Applying the inter-region wear leveling scheme may include rotating a mapping of groups of logical addresses to regions of the non-volatile memory according to a predetermined cyclical pattern. Applying the inter-region wear leveling scheme may include maintaining a first indicator of wear associated with the first region and a second indicator of wear associated with the second region and remapping data according to at least one of the first indicator of wear and the second indicator of wear. The method may further include: receiving, from a host, one or more indicators of expected host access patterns associated with host logical addresses and grouping host logical addresses according to the one or more indicators of expected host access patterns into at least a first group assigned to the first region of the non-volatile memory and a second group assigned to the second region of the non-volatile memory. The method may further include identifying host data access patterns from a plurality of host access commands and grouping host logical addresses according to the host data access patterns into at least a first group assigned to the first region of the non-volatile memory and a second group assigned to the second region of the non-volatile memory.

An example of a system includes: a first region of non-volatile memory; a second region of non-volatile memory; means for operating a first instance of a mathematical wear leveling scheme in the first region of non-volatile memory; means for operating a second instance of the mathematical wear leveling scheme in the second region of non-volatile memory; and means for operating an inter-region wear leveling scheme between at least the first region of non-volatile memory and the second region of non-volatile memory.

The system may further include means for maintaining a first indicator of wear for the first region of non-volatile memory and a second indicator of wear for the second region of non-volatile memory. The system may further include: means for receiving, from a host, an expected data access pattern; and means for grouping host logical addresses according to the expected data access pattern.

Adaptive Wear Leveling Examples

Examples above refer to multiple levels of wear leveling where an individual wear leveling scheme at any level may be either deterministic (e.g. based on a mathematical approach so that remapping of logical addresses to physical addresses is performed blindly, without regard to properties of physical memory or logical data) or may be based on some media property of physical units (a property of physical memory media) and/or property of logical data (e.g. based on numbers of write cycles experienced by units of physical memory, numbers of errors in data read from units of physical memory, and/or frequency of writes of logical data). These different approaches may be implemented at different levels as described above (e.g. using deterministic wear leveling at a regional level and using media property based wear leveling at an inter-regional level). In some cases, a deterministic wear leveling scheme may be adapted to factor in some properties of physical memory and/or logical data. Such a scheme may take advantage of the simplicity of using a mathematical function for logical to physical translation (e.g. not requiring maintaining a full logical-to-physical map) while also benefiting from adaptability provided by factoring in some properties of physical memory and/or logical data. Such an adaptive scheme may be implemented at one or more level of a multi-level approach (e.g. as inter-regional wear leveling in one or more examples above) or as a stand-alone wear leveling scheme.

FIG. 22 shows an example of a memory, or portion of a memory, in which a start gap wear leveling scheme is used (e.g. as shown in examples of FIGS. 7A-14B) over five units (Unit 1-Unit 5). Units 1 to 5 may be regions in an inter-regional wear leveling scheme (e.g. as illustrated in FIGS. 10A-14B), logical pages in a regional wear leveling scheme (e.g. as illustrated in FIGS. 7A-I), or some other unit that is used for wear leveling purposes. Units 1 to 4 store data A to D respectively, with Unit 5 storing no data (i.e. Unit 5 represents a gap in the start gap scheme). The rightmost column indicates a number of writes to the corresponding unit, or wear count, since a prior move. It can be seen that Units 3 and 4 (shaded) have significantly higher wear counts (15 and 23) than other units and thus may be considered heavily worn. In the start gap scheme of FIGS. 7A-I, data D would subsequently be moved to Unit 5 and data C would be moved to Unit 4 (as shown by the arrow). The high wear count for Unit 3 may indicate that data C is frequently written so that moving data C to Unit 4 may create an undesirable mapping of frequently written data to heavily worn non-volatile memory cells. Adapting the start gap scheme to avoid such mappings in a simple manner can improve wear leveling results without requiring a full logical to physical map. While, in this example, wear is tracked and used to show an undesirable mapping, in other examples, other metrics (including other media properties and/or logical properties of data) may be tracked and used to indicate undesirable mappings.

FIGS. 23A-23D illustrate an example of a start gap wear leveling scheme that is adapted to avoid an undesirable mapping, which in this case is the mapping of data C to Unit 4 as discussed with respect to FIG. 22 (the third column of FIG. 22 is omitted in FIGS. 23A-D for simplicity). In FIG. 23A, instead of copying data D to Unit 5, data D is copied to a location 2302 that is separate from Units 1 to 5 and may be considered a temporary buffer. Location 2302 may be another location in the same structure as Units 1 to 5 (e.g. in same block, plane, die, bank, or other structure) or may be in a physically separate structure (e.g. a buffer).

In FIG. 23B, data C is copied to Unit 5 (which previously formed the gap). Thus, the location of data C is incremented by 2 places (from Unit 3 to 5) instead of by 1 place, which would have put data C in Unit 4. Thus, data C jumps ahead and the undesirable mapping of data C to Unit 4 is avoided.

In FIG. 23C, data A and B are moved to Units 3 and 4 respectively. In FIG. 23D, data D is moved back from location 2302 and is written in Unit 1. Thus, at this point, data A to D is stored in order according to a start gap scheme, with a start at Unit 3 (location of data A) and a gap at Unit 2. This represents movement of all data by two increments in order to skip an undesirable placement mapping. It will be understood that for the period of the remapping shown in FIGS. 23A-D, some additional data may be needed to indicate locations of all data A-D. Specifically, a pointer may be maintained to indicate data D is at location 2302 and pointers or other indicators may be provided to show locations of data during the transition from FIG. 23A to FIG. 23D (e.g. in addition to a gap pointer, an indicator that the gap extends over two units instead of one). While the example of FIGS. 23A-D shows incrementing locations of logical data by two units, locations may be incremented by more than two units in order to avoid multiple undesirable mappings. While the example of FIGS. 23A-D illustrates a start gap scheme, other deterministic schemes may also be modified to avoid undesirable mappings. It will be understood that a non-volatile memory may operate in a purely deterministic manner for some period of time before any undesirable mapping is identified (e.g. if wear of physical units is used to identify undesirable mappings, then it may take some period of time for wear to accumulate to a level where some units are considered heavily worn) and may subsequently modify wear leveling according to media properties and/or logical data properties for a later period of time. Thus, a non-volatile memory may use purely deterministic wear leveling when it is new and may subsequently use adaptive wear leveling to adapt to changing media properties and/or logical data properties after some period of use. An adaptive wear leveling scheme may be adaptive in various ways including mapping (e.g. selection of a placement mapping) and other factors, such as timing of any remapping, including remapping frequency and in some situations, suspension of remapping. In some cases, a scheduled remapping may be suspended or deferred because a current placement mapping is determined to be preferable to a subsequent placement mapping. For example, where remapping would result in a worse configuration from a wear leveling perspective, or result in little or no improvement, it may not be worth performing the remapping and the remapping may be suspended or deferred until a later time (e.g. when some criteria are met).

In some systems, there may be a large number of units in a wear leveling scheme so that there may be more than one undesirable unit mappings in any given placement mapping. Undesirable unit mappings may not all be equal, i.e. there may be different media properties for different physical units and/or different logical data properties for different data leading to a range of undesirability for different individual unit mappings. A placement mapping (e.g. an overall mapping that reflects the individual unit mappings of a non-volatile memory according to a mathematical function) may have a cost metric associated with it that reflects the desirability or undesirability of the placement mapping based on a single property, or a combination of properties (including media properties and/or logical data properties). A property may be treated in a binary fashion (e.g. good/bad, high/low), may be divided into more than two ranges (e.g. low/medium/high), or may be given an analog, or near analog treatment (e.g. maintaining a count that may range from zero to some large number).

A cost metric may be based on a combination of media and logical data properties such as logical data "heat" (frequency of writes) multiplied by physical unit wear or age. A cost metric may be based on an average value, or median value, across some or all physical units, or may be focused on a subset of physical units. In an example, a cost metric may be based only on a media property of physical units such as age or wear of physical units, and may further focus on a subset of physical units that are heavily worn, thus reducing overhead associated with tracking wear for all physical units. In an example, a cost metric may be based only on write frequency ("heat") of logical data and may focus on logical units that are frequently written, thus reducing overhead associated with tracking write frequency for all logical units. Other metrics may also be used, e.g. error count obtained from ECC correction of data from different units.

In general, maintaining metrics for all units of a physical memory and/or all logical addresses may impose a significant overhead. According to an example, placement mappings may be evaluated based on a simplified scheme that looks at one property (e.g. a media property of physical units such as wear of physical units) and focuses on a subset of units (e.g. heavily worn units). For example, heavily worn units may form a relatively small subset of an overall population so that evaluating placement mappings according to such a subset presents a simpler problem than considering all individual unit mappings. Thus, while a memory may be represented by a first number of physical addresses, wear leveling may be based on data from a second number of physical addresses that is less than the first number of physical addresses. To further simplify, units may simply be considered heavily worn if they have wear above a threshold (e.g. total number of write cycles, or number of write cycles since last move, greater than a threshold value) without recording all wear data (i.e. units are either "normal" or "heavily worn" not ranked on a scale of wear). Placement mappings may be evaluated based on the number of individual logical units that would be remapped from a heavily worn unit to another heavily worn unit if the placement mapping was chosen as the next placement mapping.

Figure 24:
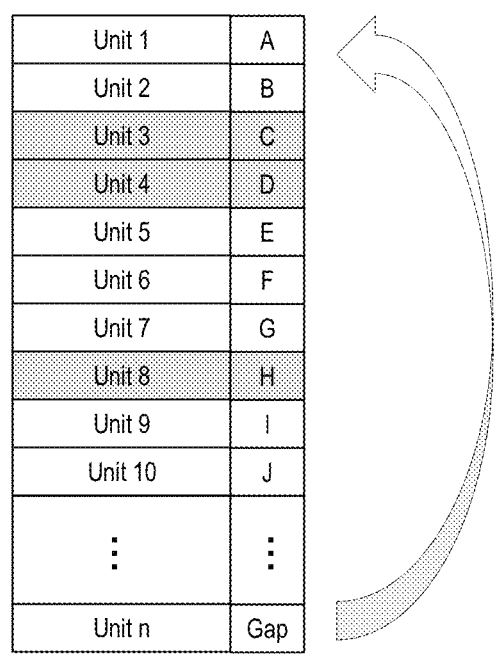
FIG. 24 illustrates an example of a start gap wear leveling scheme applied to a memory with n physical units.

A start gap scheme has a limited number of placement mappings that are efficiently stored as a location of a start and a gap (i.e. given the start location and the gap location, the individual mappings of all logical addresses may be obtained). A logical to physical translation can be mathematically performed by applying an offset to a logical address to obtain a corresponding physical address where the offset is a function of the start location and the gap location. FIG. 24 illustrates a start gap scheme operating over n units. Logical to physical mapping cycles around while the order of logical addresses remains the same. Thus, there are a limited number of placement mappings to choose from in such a scheme. A default remapping may increment logical addresses by one physical address (e.g. data A from Unit 1 to Unit 2, data B from Unit 2 to Unit 3, and so on) with some remappings incrementing logical addresses by two physical addresses (as shown in FIGS. 23A-D) or more than two physical addresses in order to avoid undesirable individual remappings (e.g. to avoid remapping a logical address from a heavily worn physical address to another heavily worn physical address). While a full logical to physical mapping scheme may allow all permutations of logical to physical addresses, recording such mapping requires significant overhead (e.g. an entry for each physical address to record the logical address of data stored there) and looking up such a map may increase latency. Mathematical schemes may require significantly less overhead by limiting possible permutations to a number of placement mappings that can be represented efficiently (e.g. two pointers for a start gap scheme for n units compared with a map with n entries, each recording a corresponding logical address) and may allow faster translation between logical and physical addresses by applying a mathematical function instead of looking up entries in a map or table. However, purely deterministic wear leveling based on a mathematical approach proceeds blindly and does not account for changing media properties and/or logical data properties.

Another example of a wear leveling scheme that may be adapted according to a cost metric is a hypercubic wear leveling scheme in which logical addresses are XORed (subject to an Exclusive OR function) with a placement mapping bit string to obtain a corresponding physical address. A placement mapping in such a scheme has an associated bit string, with each placement mapping having an individual bit string that defines a unique logical to physical mapping for all addresses subject to the scheme. An n-dimensional HyperCube (n-D HC) is a data structure which has $2^n$ elements. Each element is a vertex of the HyperCube. In the context of Logical to Physical mapping (e.g. for a non-volatile memory), each element of a hypercube may represent a physical address which stores data with a logical address.

Figure 25B:
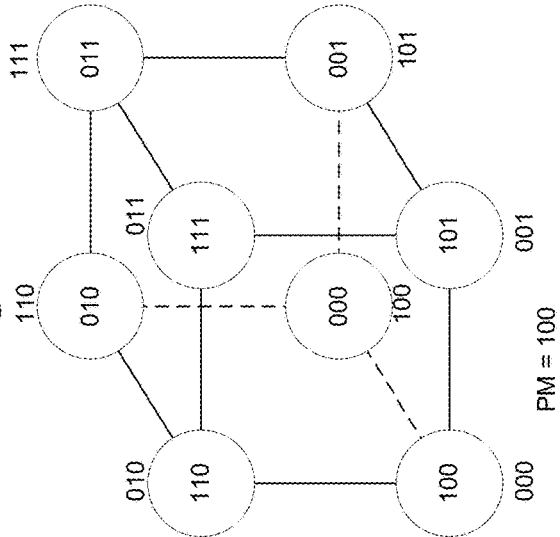
FIGS. 25A-C illustrate examples of placement mappings using a hypercubic representation.
Figure 25C:
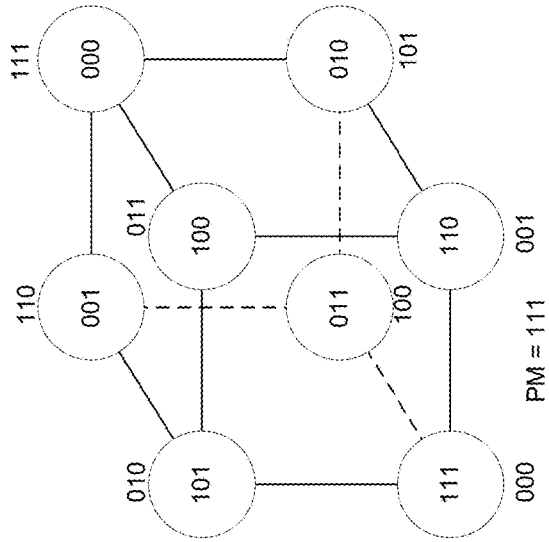
Figure 25A:
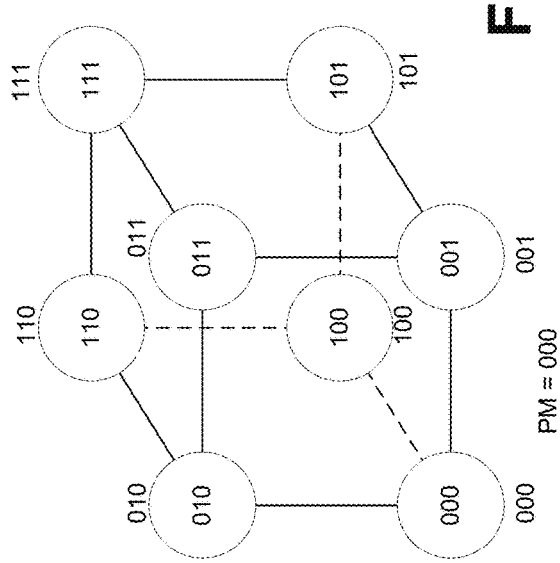

FIGS. 25A-C illustrate three placement mappings according to a hypercubic wear leveling scheme, which is illustrated using three-dimensional hypercubes (i.e. using cubes). It will be understood that such schemes may be applied to n-dimensional hypercubes where n may be chosen according to the number of addresses to be mapped. Eight logical addresses (3-bit addresses shown within balls at vertices of cubes) are mapped to eight physical addresses (3-bit addresses shown next to respective balls).

In FIG. 25A the placement mapping is represented by the bit string 000 (PM=000). All logical addresses are subject to an Exclusive OR (XOR) operation to generate a corresponding physical address, i.e. bit string 000 is combined with logical addresses 000, 001, 010 and so on. XORing with 000 returns the input bits as output (i.e. PM=000 represents the identity function). Thus, each logical address is mapped to an identical physical address (logical address 000 to physical address 000, logical address 001 to physical address 001, and so on).

FIG. 25B shows another placement mapping represented by the bit string 100 (PM=100) which remaps the logical addresses as shown. All logical addresses are subject to an XOR operation to determine a corresponding physical address i.e. bit string 100 is combined with logical addresses 000, 001, 010 and so on. Thus, the first bit of each logical address is flipped in this example to obtain the physical address. The result of applying this placement mapping to data previously arranged as shown in FIG. 25A is to swap logical addresses between pairs of physical addresses that differ only in the first bit. Thus, for example, while FIG. 25A shows physical address 010 mapped to logical address 010 and physical address 110 mapped to logical address 110, FIG. 25B shows these swapped so that physical address 010 is mapped to logical address 110 and physical address 110 is mapped to logical address 010. Similar swaps can be seen between other pairs of physical addresses.

FIG. 25C shows another placement mapping represented by the bit string 111 (PM=111). XORing 111 with logical addresses provides physical addresses that are inverted from the corresponding logical address, e.g. logical address 101 is mapped to physical address 010. Comparing the placement mapping of FIG. 25C with placement mappings of FIGS. 25A-B, it can be seen that moving from any placement mapping to another placement mapping involves swapping logical addresses mapped to pairs of physical addresses. For example, while FIG. 25A shows physical address 010 mapped to logical address 010 and physical address 101 mapped to logical address 101, FIG. 25C shows these swapped so that physical address 010 is mapped to logical address 101 and physical address 101 is mapped to logical address 010. Other pairs of physical addresses similarly swap logical addresses. Thus, it is a feature of such a placement mapping scheme, based on XORing addresses with different bit strings for each placement mapping, that transitions between placement mappings include swaps of logical addresses between pairs of physical addresses.

According to an example, a wear leveling scheme may remap logical addresses to physical addresses of a non-volatile memory according to a plurality of placement mappings and may select a new placement mapping from the plurality of placement mappings according to a cost function associated with the new placement mapping. The cost function may be based on a media property of physical units in the non-volatile memory and/or a logical property of logical data mapped to the non-volatile memory. For example, wear, or another media property of physical units may be recorded and a cost function may be based on recorded wear values. Wear may be recorded for all units or for a subset of units such as heavily worn units, and a cost function may be based on the number of individual unit remappings between heavily worn units. For example, the next placement mapping may be selected to minimize remappings between heavily worn units.

Figure 26:
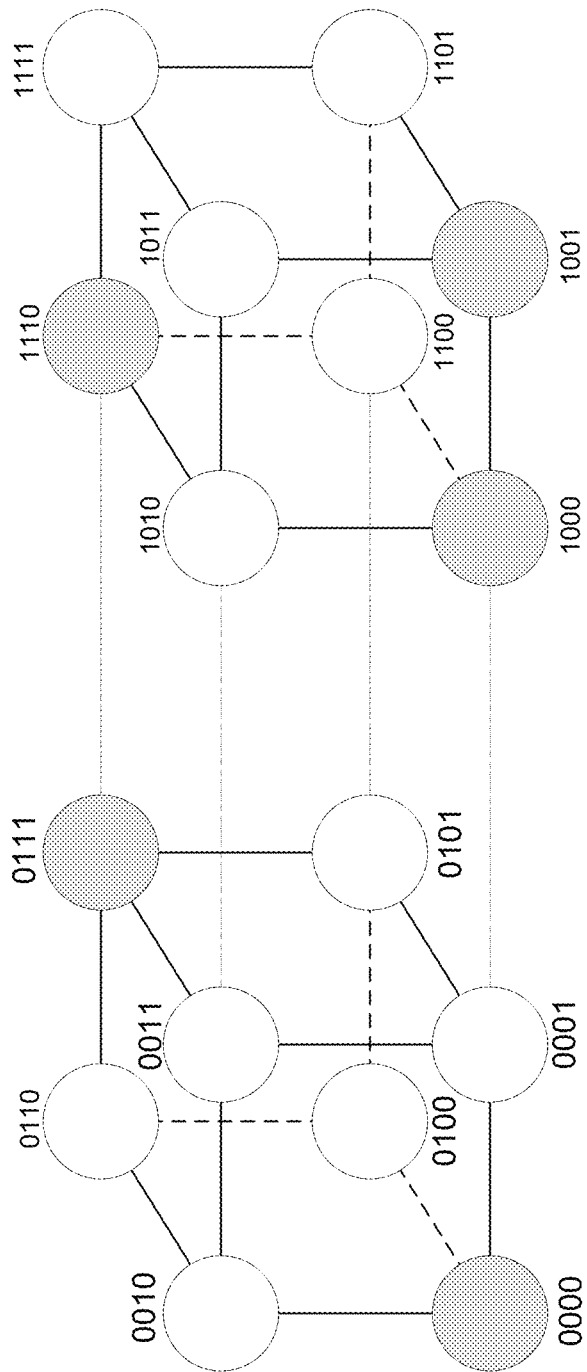
FIG. 26 illustrates an example of physical addresses including heavily worn physical addresses in a hypercubic representation.

FIG. 26 illustrates an example of a hypercubic representation of physical address space as a 4-dimensional hypercube. Thus, each physical address is a four-bit address in this example. A subset of physical addresses are identified as addresses of heavily worn units in this example. Physical addresses 0000, 0111, 1000, 1110, and 1001 (shaded) are addresses of heavily worn units. A scheme may evaluate a potential placement mapping for use as a new placement mapping by calculating cost values associated with remapping from the current placement mapping to each of the potential placement mappings, then selecting the new placement mapping according to the cost values and moving data according to the new placement mapping.

For any given current placement mapping PM1, the next placement mapping (new placement mapping) may be PM2, and a pair of heavily worn physical units (e.g. physical blocks) may be PB1 and PB2. Logical units (logical pages in this example) LP1 and LP2 are mapped to PB1 and PB2 using PM1. Therefore:

LP1^PM1=PB1
LP2^PM1=PB2

A cost function may evaluate the number of individual unit remappings from heavily worn units to heavily worn units (number of swaps between shaded, heavily worn units in FIG. 26), e.g. where LP1 is remapped to PB2 and LP2 is remapped to PB1. Such a remapping would satisfy the following:

LP1^PM2=PB2
LP2^PM2=PB1

This gives that:

PM2=PB2^LP1→PM2=PB2^PB1^PM1

In the above equation the term "PB2^PB1" may be referred to as "the Swap Factor" (SF). By focusing on swaps between certain physical units (e.g. a subset of physical units with particular media properties such as heavy wear, high bit error rates, or some other media property) selecting a placement mapping may be simplified. Reducing or minimizing the number of such swaps between units of such a subset may be used as a basis for selecting a new placement mapping. For example, in the example shown in FIG. 26, the shaded addresses 0000, 0111, 1000, 1110, and 1001 correspond to a subset of physical addresses that are identified because of heavy wear so that swaps between such addresses are undesirable. Examples of swap pair subsets of interest in this example are as follows (with pairs on the left, along with an extra address reflecting odd number of addresses in subset):

{{0000,1000}, {0111, 1110}, 1001}→SF={1000, 1001}
{{0111, 1000}, {1110, 1001}, 0000}→SF={1111, 0111}
. . . .
{{0000, 0111}, {1110, 1001}, 1000}→SF={0111, 0111}→SF={0111}

Where the SF indicates a placement mapping or mappings associated with each swap, e.g. SF={1000, 1001} indicates that bit strings 1000 and 1001 generate swaps between physical addresses 0000, 1000 and 0111, 1110 respectively. It can be seen that SF={0111} generates two individual unit remappings between heavily worn units, i.e. between physical addresses 0000 and 0111 and between physical addresses 1110 and 1001. A cost metric may associate cost value accordingly (e.g. cost value=2). Such an SF represents a worst-case scenario in this example (with five units in the subset, there is a maximum of two such pairs). Other placement mappings that generate at least one remapping between heavily worn units (e.g. 1000, 1001, 1111) may be assigned a cost value accordingly (e.g. cost value=1). When all swaps between physical addresses of the subset have been considered and all corresponding placement mappings have been identified and assigned a cost value, any remaining placement mappings may be assumed to generate no swaps between physical addresses of the subset (i.e. such placement mappings only swap addresses of the subset with addresses that are not in the subset) and may be assigned a cost value accordingly (e.g. cost value=0). A next placement mapping may be selected accordingly (e.g. selecting a placement to provide a minimum cost value). Data in the non-volatile memory is then moved according to the new placement mapping.

While the example of FIG. 26 shows a population of sixteen physical addresses from which a subset of five physical addresses are marked as heavily worn, it will be understood that a non-volatile memory may include a much larger number of units (e.g. thousands or millions) with a correspondingly larger subset of interest so that the number of pairings to consider may be significantly larger and the range of cost values may be greater. The subset of units that is considered may be restricted to a suitable number so that overhead is not excessive and so that selection of a new placement mapping does not require excessive calculation.

Figure 27:
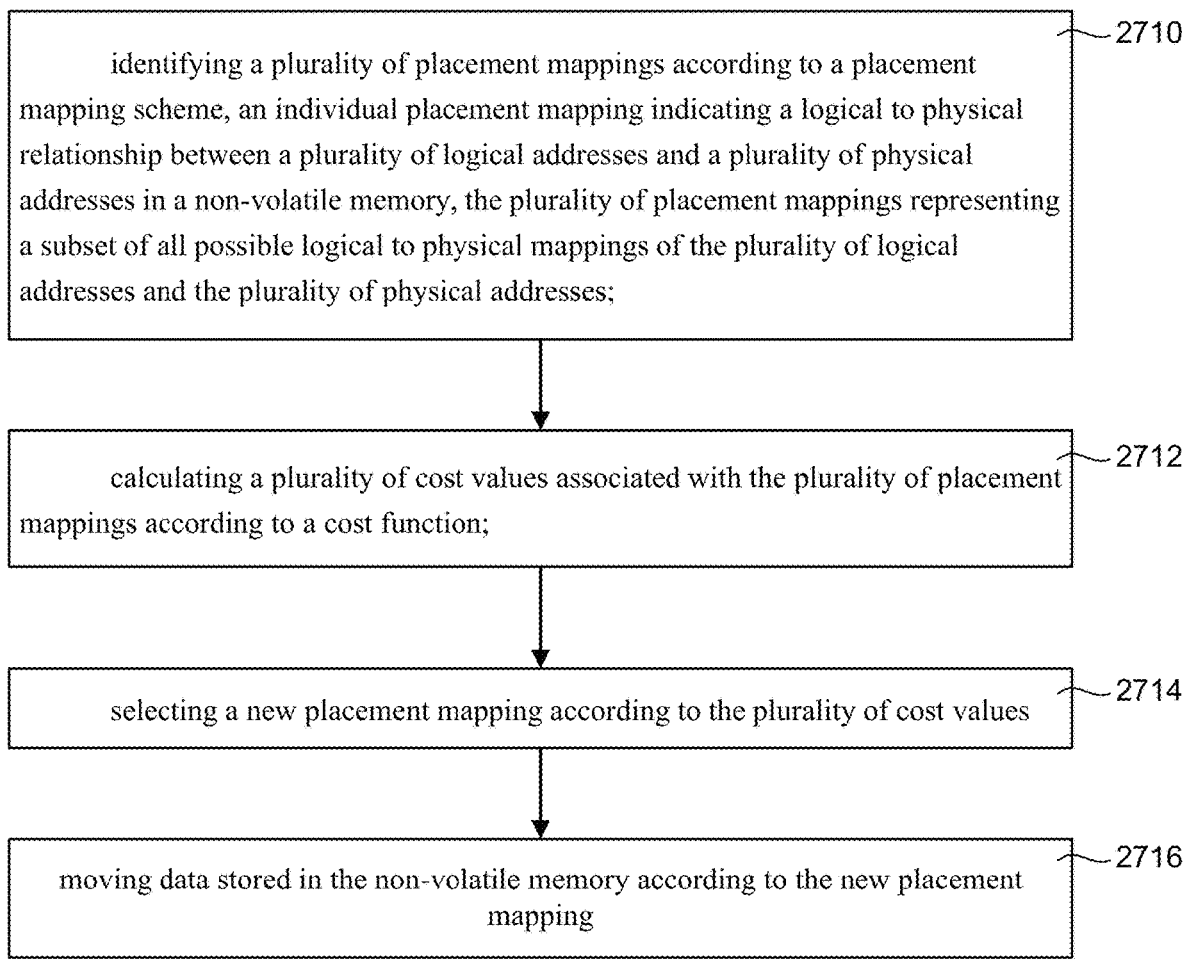
FIG. 27 illustrates an example of a method that includes selecting a placement mapping.

FIG. 27 illustrates a method according to an example of the present technology, which may be implemented in a non-volatile memory system such as shown in FIG. 2, using a non-volatile memory structure such as ReRAM, PCM, MRAM, NAND flash memory, NOR flash memory, or other suitable memory. The method includes identifying a plurality of placement mappings according to a placement mapping scheme, an individual placement mapping indicating a logical to physical relationship between a plurality of logical addresses and a plurality of physical addresses in a non-volatile memory, the plurality of placement mappings representing a subset of all possible logical to physical mappings of the plurality of logical addresses and the plurality of physical addresses 2710. For example, a start gap placement mapping scheme includes individual placement mappings that can be represented by a start location (e.g. start pointer) and a gap location (e.g. gap location) and these placement mappings are limited to maintaining a particular order of logical addresses (e.g. logically consecutive) so that the placement mappings of the scheme are a subset of all possible logical to physical mappings. In another example, a hypercubic placement mapping scheme includes individual placement mappings that can be represented by a bit string. The method includes calculating a plurality of cost values associated with the plurality of placement mappings according to a cost function 2712, e.g. by calculating a number of individual unit remappings between heavily worn units (i.e. from one heavily worn unit to another heavily worn unit) and selecting a new placement mapping according to the plurality of cost values 2714. For example, by selecting a placement mapping with the smallest number of remappings from heavily worn units to heavily worn units. Then, the method includes moving data stored in the non-volatile memory according to the new placement mapping, e.g. by swapping stored data between pairs of physical addresses as indicated by a bit string of a new hypercubic placement mapping or incrementing locations of data in physical addresses according to a start gap scheme.

It will be understood that when data is stored in a non-volatile memory according to any of the placement mappings of a given mathematical scheme (e.g. start gap scheme, hypercubic scheme, or other scheme) logical to physical translation can be performed by applying a corresponding mathematical function (e.g. adding an offset to a logical address to obtain a corresponding physical address, or XORing a logical address with a placement mapping bit string to obtain a corresponding physical address, or other mathematical function). When remapping to a new placement mapping, media properties and/or logical data properties may be used to select a new placement mapping (e.g. by avoiding certain undesirable placement mappings). Thus, while placement mappings are individually represented by a mathematical function and for any given placement mapping all logical to physical translation is represented by the formula, such a scheme is not deterministic in selecting a new placement mapping because media properties and/or logical data properties are used in such selection.

Methods of implementing the present technology, such as the method illustrated in FIG. 27, may be implemented using any suitable hardware including dedicated hardware (e.g. dedicated circuits in an ASIC, or in one or more separate ICs), programmable hardware (e.g. one or more PLDs, FPGAs, etc.), using a controller that is configured by suitable software, e.g. by firmware, or some combination of these approaches.

Figure 28:
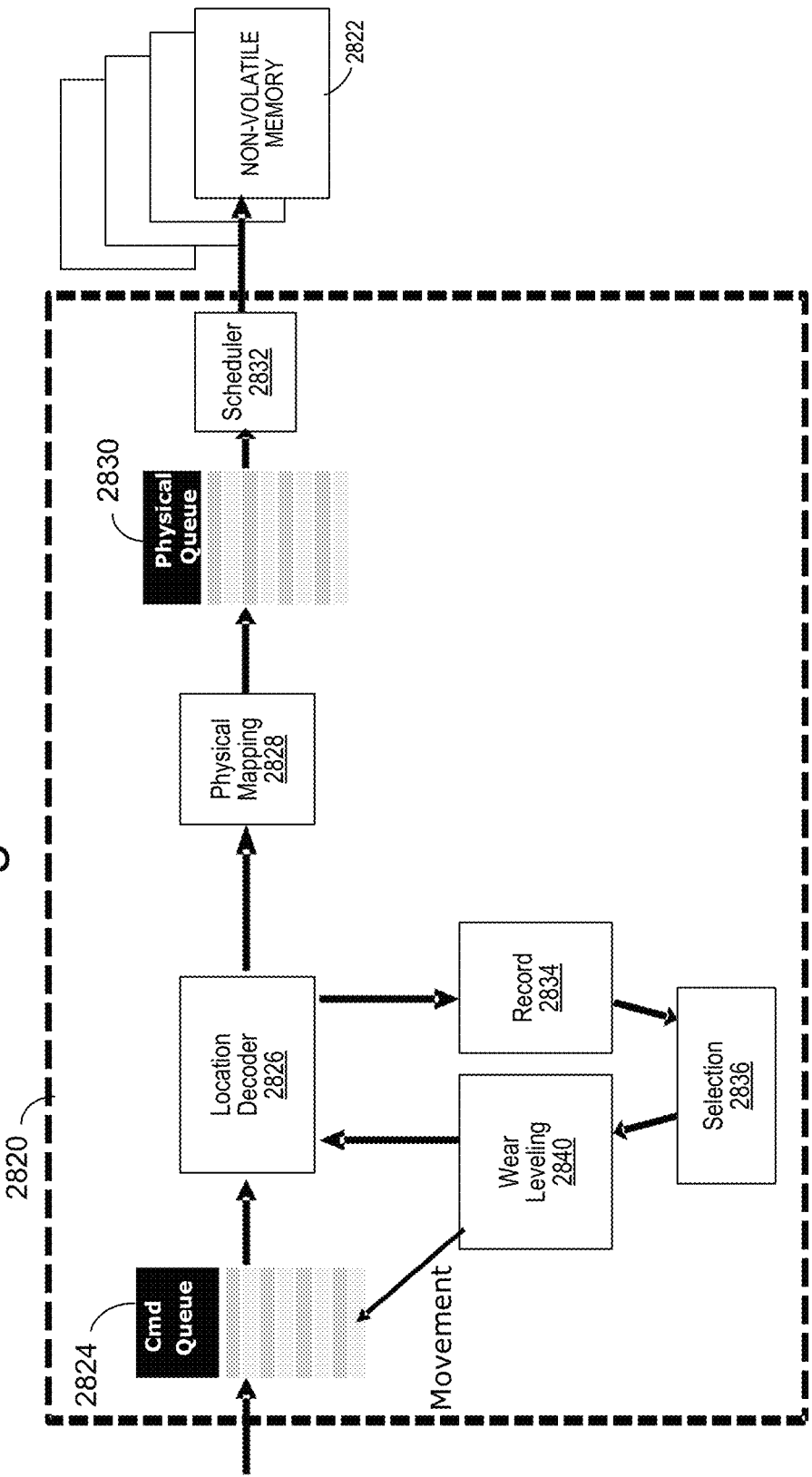
FIG. 28 illustrates an example of hardware that includes control circuits coupled to a set of non-volatile memory cells.

FIG. 28 shows an example of hardware that may be used to implement aspects of the present technology. Control circuits 2820 are in communication with a set of non-volatile memory cells that form physical units (e.g. pages, blocks, planes, dies, banks, or other units) of non-volatile memory 2822, where a unit has an individual address. A command queue 2824 receives commands (e.g. write commands) from a host. Commands are sent from command queue 2824 to location decoder 2826, which uses a placement mapping to map incoming commands from the host to abstract physical addresses. For example, location decoder 2826 may apply a start gap scheme (as illustrated in FIGS. 7A-I) by applying an offset to a received logical address to obtain a corresponding abstract physical address or may apply a hypercubic scheme by performing an XOR operation to XOR a received logical address with a bit string to obtain a corresponding abstract physical address (e.g. as illustrated in FIGS. 25A-C). Abstract physical addresses are sent from location decoder 2826 to physical mapping module 2828, which converts an abstract physical address into a physical address (e.g. into an address that specifies a physical location in terms of a word line, plane, die, bank, subarray, etc.). These commands are placed in a physical command queue 2830 and from there pass to a scheduler 2832 to be executed in the non-volatile memory 2822 (e.g. by writing data in a designated unit in non-volatile memory 2822).

The placement mapping used by location decoder 2826 may be modified according to a cost function to provide wear leveling. For example, a record 2834 may store data relating to one or more media properties and/or one or more logical data properties. For example, as commands are decoded by location decoder 2826, record 2834 may store numbers of writes to particular units (i.e. some measure of wear), or numbers of times particular logical addresses are written (heat of particular logical address). Thus, record 2834 may be considered a means for recording a media property of physical units for at least a subset of the plurality of units and may be implemented as a dedicated memory unit, or a portion of a memory that is shared. In another example, bit error rate data (e.g. from an ECC decoder) may be recorded for different units. Such data stored in record 2834 may be used to select a new placement mapping for use by location decoder 2826. Wear, or other media property and/or logical data property may be evaluated at different points (e.g. by different components that handle write/read commands) and the point at which a media property (or logical data property) is captured and recorded may vary (e.g. wear data may be captured from physical mapping module 2828 or physical queue 2830, and record 2834 may be located accordingly). For example, data relating to a media property of at least a subset of physical units in non-volatile memory 2822 may be used by selection module 2836 to select a new placement mapping based on numbers of individual unit mappings between heavily worn units that are associated with different placement mapping selections (as described above with respect to FIG. 26). Thus, selection module 2836 may be considered a means for selecting a placement mapping for a plurality of units from a plurality of placement mappings according to a cost function based on the media property recorded for at least the subset of the plurality of units to map a plurality of logical addresses to the plurality of physical addresses of the plurality of units. The cost function may be based on the media property alone or may factor the media property with other factors including other media properties and/or logical data properties. When a new placement mapping is selected by selection module 2836, it is sent to wear leveling module 2840 to implement the movement of data in non-volatile memory 2822 by generating corresponding read and write commands and inserting them in command queue 2824. Thus, wear leveling module 2840 in combination with command queue 2824 and read/write circuits of non-volatile memory 2822 may be considered means for moving data stored in the plurality of units according to the placement mapping. Wear leveling module 2840 also updates location decoder 2826 as data is moved (i.e. as corresponding read and write commands generated by wear leveling module 2840 are executed and data is moved from locations corresponding to the old placement mapping to locations corresponding to the new placement mapping).

In an example, a cost function may be based on a combination of at least two factors, a media property such as wear and a logical data property such as write frequency. Thus, a record, such as record 2834 may store data regarding both wear (whether a block is fresh or worn) of physical media and write frequency (whether logical addresses are frequently written, or "hot", or are infrequently written, or "cold") of logical data. A selection module, such as selection module 2836, may factor in both sets of data to select a new placement mapping. For example, a placement mapping may be selected to map frequently written (hot) data to less worn (fresh) physical locations and to write infrequently written (cold) data to more worn physical locations.

An example of a non-volatile storage apparatus includes: a set of non-volatile memory cells; and one or more control circuits in communication with the set of non-volatile memory cells, the one or more control circuits are configured to remap logical addresses to physical addresses of the set of non-volatile memory cells according to a plurality of placement mappings and to select a new placement mapping from the plurality of placement mappings according to a cost function associated with the new placement mapping.

The cost function may be based on at least one of: a media property of physical units in the set of non-volatile memory cells and a logical property of logical data mapped to the set of non-volatile memory cells. The one or more control circuits may be further configured to record wear for a plurality of units in the set of non-volatile memory cells and the cost function may be based on recorded wear values. The cost function may represent a number of individual unit remappings between heavily worn units in the set of non-volatile memory cells and the new placement mapping may minimize remappings between heavily worn units. The set of non-volatile memory cells may be represented by a first number of physical addresses and the one or more control circuits may be configured to calculate the cost function for only a second number of physical addresses that is less than the first number of physical addresses. The second number of physical addresses may include only heavily worn cells. Each of the plurality of placement mappings may be represented by a start location and a gap location. Each of the plurality of placement mappings may be represented by a bit string, an individual bit string combined with logical addresses in an exclusive OR (XOR) operation to generate a corresponding physical address. The one or more control circuits may be further configured to move data stored in the set of non-volatile memory cells from a first physical address to a second physical address in response to selection of the new placement mapping. The set of non-volatile memory cells may be formed in a plurality of memory levels disposed above a substrate in a monolithic three-dimensional memory structure. The set of non-volatile memory cells may comprise Phase Change Memory (PCM) cells, Resistive Random Access Memory (ReRAM) cells, or Magnetoresistive Random Access Memory (MRAM cells).

An example of a method includes: identifying a plurality of placement mappings according to a placement mapping scheme, an individual placement mapping indicating a logical to physical relationship between a plurality of logical addresses and a plurality of physical addresses in a non-volatile memory, the plurality of placement mappings representing a subset of all possible logical to physical mappings of the plurality of logical addresses and the plurality of physical addresses; calculating a plurality of cost values associated with the plurality of placement mappings according to a cost function; selecting a new placement mapping according to the plurality of cost values; and moving data stored in the non-volatile memory according to the new placement mapping.

The method may include recording at least one of: a media property of physical units in the non-volatile memory associated with the plurality of physical addresses, and a logical property of logical data associated with the plurality of logical addresses. Recording a media property of physical units in the non-volatile memory may include marking a subset of physical units in the non-volatile memory as heavily worn. Calculating the plurality of cost values associated with the plurality of placement mappings may include calculating a number of individual unit remappings from heavily worn units to heavily worn units. Selecting a new placement mapping according to the plurality of cost values may include selecting a placement mapping with a smallest number of remappings from heavily worn units to heavily worn units. Moving data stored in the non-volatile memory according to the new placement mapping may include swapping logical addresses between pairs of physical addresses, the cost values may represent a number of swaps between physical addresses with heavy wear, and the new placement mapping may be selected to provide a minimum cost value. Each of the plurality of physical addresses may represent a region in the non-volatile memory and a deterministic wear leveling scheme may be independently implemented in each region.

An example of a system includes: a set of non-volatile memory cells forming a plurality of units, each unit having a physical address; means for recording a media property for at least a subset of the plurality of units; and means for selecting a placement mapping for the plurality of units from a plurality of placement mappings according to a cost function based on the media property recorded for at least the subset of the plurality of units to map a plurality of logical addresses to a plurality of physical addresses of the plurality of units. The system may further include means for moving data stored in the plurality of units according to the placement mapping.

Dynamic Group Configuration Examples

In general, wear leveling is performed over some group of physical units of a non-volatile memory (a wear leveling group). For example, different regions may form wear leveling groups that are individually subject to wear leveling schemes and the regions may collectively form a wear leveling group for operation of an inter-region wear leveling scheme. An individual wear leveling group may apply a deterministic wear leveling scheme or may apply a wear leveling scheme based on a media property and/or logical data property.

In some examples, the sizes of a wear leveling groups may be configurable rather than being static. Thus, grouping of physical units into wear leveling groups may change over time, e.g. in response to a pattern of access, a media property, or other reason. A wear leveling group (e.g. group of physical addresses) may be split into two or more subgroups (e.g. a subset or subgroup of physical addresses) that may then operate as separate wear leveling groups. For example, a wear leveling group may be split into a heavily worn subgroup and a lightly worn subgroup so that these different subgroups can be differently managed. Two or more wear leveling groups (groups of physical addresses) may be merged together to form a merged group of physical addresses. For example, a heavily worn group and a lightly worn group may be merged to form a merged group that evens out wear between the two groups and avoids wear out of the heavily worn group. Thus, new wear leveling groups may be formed in various ways.

FIG. 29A shows an example of a wear leveling group 2900 that is represented as a 3-dimensional hypercube (a cube) with eight corners representing eight physical units (e.g. as shown in FIGS. 25A-C). Physical addresses of physical units are located beside balls at corners while the mapping of logical addresses to physical addresses is represented by logical addresses in balls at corners. For simplicity, the placement mapping of FIG. 29A is the identity placement mapping (PM=000) so that physical addresses are the same as logical addresses (in other examples, physical and logical addresses are related by an XOR function with a bit string as previously shown).

The eight physical units are split into two subgroups 2902 and 2904 of FIGS. 29B and 29D respectively. Thus, physical addresses 010, 011, 110, and 111 form subgroup 2902 of FIG. 29B, which is subsequently operated as a separate wear leveling group. For example, while FIG. 29B shows the identity placement mapping (PM=000) subgroup 2902 may subsequently be remapped according to a different placement mapping and may be considered a wear leveling group. FIG. 29C shows group 2902 after remapping according to a placement mapping given by bit string 100 (PM=100) so that the first bit of each logical address is flipped to obtain the corresponding physical address. Wear leveling of group 2902 may continue independently including separate selection of placement mappings and separately triggered and implemented remappings.

FIG. 29D shows subgroup 2904 formed of physical addresses 000, 001, 100, and 101. Subgroup 2904 may be operated as a separate wear leveling group. For example, subgroup 2904 may be remapped according to placement mappings that are independently selected and implemented as appropriate and subgroup 2904 may be considered a group for wear leveling purposes. FIG. 29E shows group 2904 after remapping according to a placement mapping given by bit string 001 (PM=001), which is different to PM=100 used for subgroup 2902) so that the last bit of each logical address is flipped to obtain the corresponding physical address. Wear leveling of group 2904 may continue independently including separate selection of placement mappings and separately triggered and implemented remappings. Selection of appropriate placement mappings and remappings associated with new placement mappings may be performed independently for group 2902 and group 2904 after they are generated by splitting group 2900. In this way, wear leveling may be adapted to each such wear leveling group separately.

Splitting of wear leveling groups into subgroups (and subsequent operation of subgroups as separate wear leveling groups) may be triggered at some point during operation of a non-volatile memory. For example, after some period of operating an individual wear leveling group (e.g. wear leveling group 2900) the wear leveling group may be split into two or more subgroups that may subsequently be operated as independent wear leveling groups. Splitting may occur for a number of reasons and may be based on recorded media properties and/or logical address properties and/or other factors. For example, where areas within a wear leveling group experience different wear, the group may be split into a heavily worn subgroup and a lightly worn subgroup so that the two subgroups may be differently managed according to their wear levels. In some cases, logical addresses mapped to a heavily worn group may then be remapped to another group and infrequently written logical addresses may be mapped to the heavily worn group. This may be done with less movement of data (fewer writes) after a split than if an undivided group was swapped in this way and may provide a more focused response to changing media properties and/or logical data properties. In another example, when there are repeated writes to one or more logical address that is likely to wear out a corresponding physical location in a non-volatile memory, reducing a wear leveling group size may increase the frequency of remapping the logical address so that repeated writes are disrupted, and no single physical location is worn out. While FIGS. 29A-E show splitting a group into two subgroups of equal size, it will be understood that subgroups may not be of equal size and that the number of such subgroups may be more than two.

In addition to splitting a wear leveling group to form smaller wear leveling groups, the reverse operation may also be implemented in some cases so that two or more wear leveling groups may be merged to form a merged group that is then operated as a unit, i.e. merged group may be a wear leveling group with a single placement mapping. Thus, two groups such as groups 2902 and 2904 may be merged together to form a merged group such as group 2900 in an operation that is the reverse of that shown in FIGS. 29A-E. In general, any groups to be merged are first remapped to have the same placement mapping and are then linked and operated together as a single wear leveling group. For example, in some cases, where one wear leveling group has heavy wear (e.g. may be in danger of wearing out) and another wear leveling group has light wear, the groups may be merged to generate a merged group and thus distribute wear and slow wear out of heavily worn cells.

Splitting group 2900 into subgroups 2902 and 2904 shows one example of how a group may be split into two subgroups of equal size. Other splits may also be performed. Group 2900 is split between top and bottom, or according to the second bit of the three-bit physical addresses used. Thus, physical addresses with a middle bit=0 on the bottom in the illustration of FIG. 29A form subgroup 2904 while physical addresses with a middle bit=1 on the top in the illustration of FIG. 29A form subgroup 2902. Other splits are shown in the following examples.

Figure 30A:
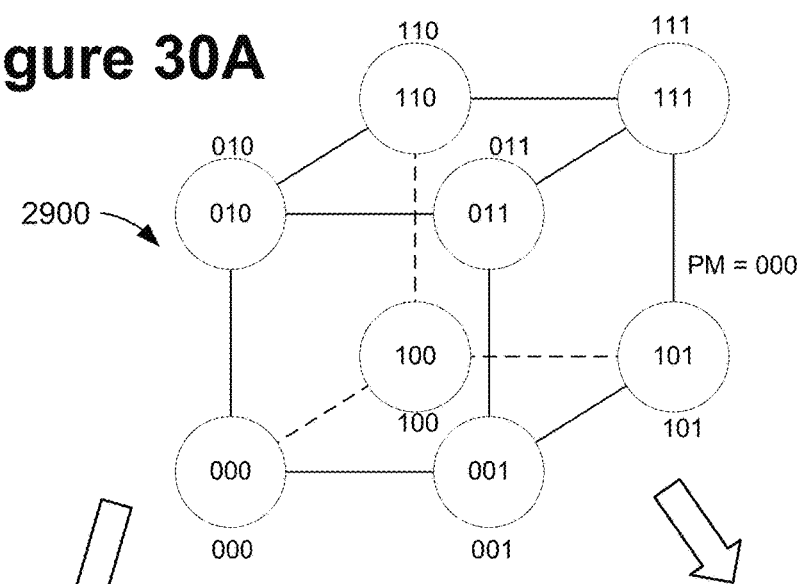
FIGS. 30A-E illustrate an example of splitting a wear leveling group into subgroups.
Figure 30B:
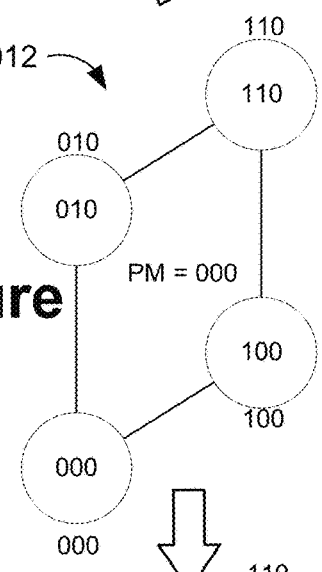
Figure 30C:
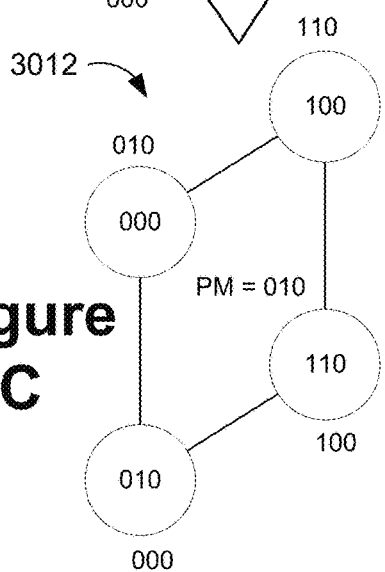

FIGS. 30A-E show an example of a different split of wear leveling group 2900 (i.e. an alternative split to the split illustrated in FIGS. 29A-E). In FIGS. 30A-E, wear leveling group 2900 is split into two subgroups 3012 and 3014 along a different plane to that shown in FIGS. 29A-E so that four physical addresses on either side form separate subgroups. Thus, subgroup 3012 of FIG. 30B is formed of physical addresses 000, 010, 100, and 110 from the left side of FIG. 30A (physical addresses with last bit=0). FIG. 30A shows group 2900 with an identity placement mapping (PM=000) so that logical addresses and physical addresses are the same for simplicity of illustration. Similarly, FIG. 30B shows subgroup 3012 with PM=000. Subsequently, as shown in FIG. 30C, a different placement mapping, PM=010, is used for subgroup 3012.

Figure 30D:
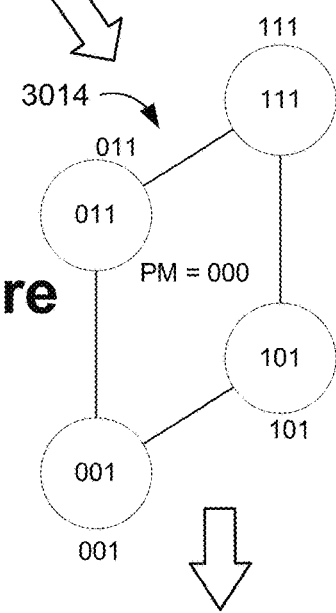
Figure 30E:
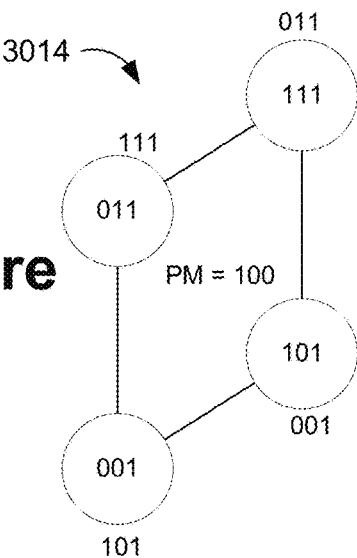

Subgroup 3014 of FIG. 30D is formed of physical addresses 001, 011, 101, and 111 from the right side of FIG. 30A (physical addresses with last bit=1). FIG. 30D shows subgroup 3014 with PM=000. Subsequently, as shown in FIG. 30E, a different placement mapping, PM=100, is used for subgroup 3014. This placement mapping is different to the placement mapping used for subgroup 3012 so that it can be seen that each subgroup is independently remapped according to a separate wear leveling scheme. Such remappings may also occur at different times and may be based on different wear leveling schemes.

Figure 31A:
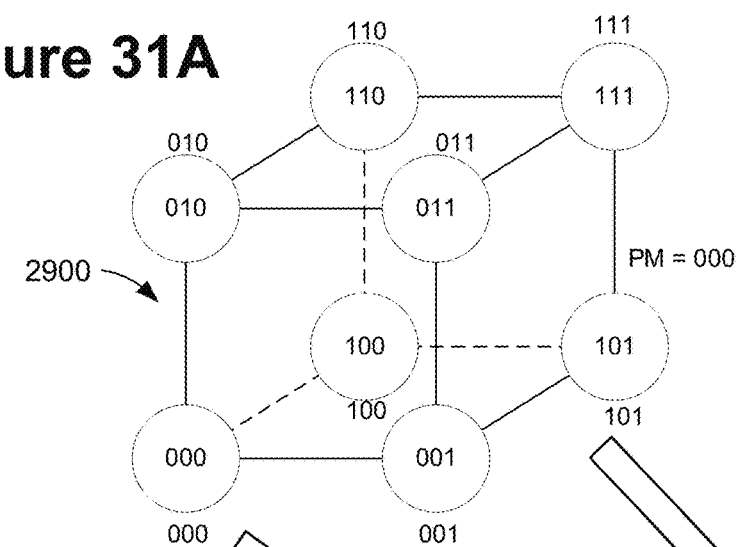
FIGS. 31A-E illustrate an example of splitting a wear leveling group into subgroups.
Figure 31B:
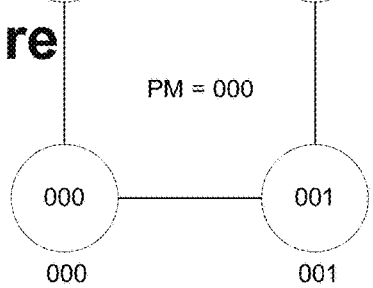
Figure 31D:
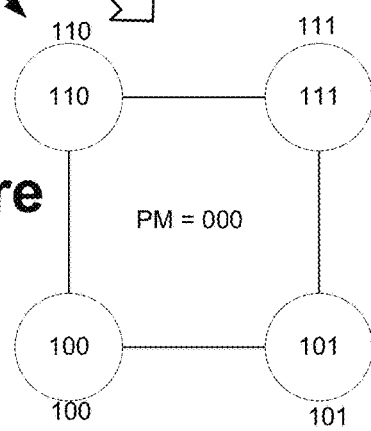
Figure 31C:
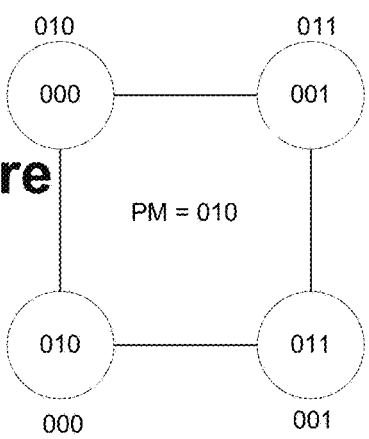

FIGS. 31A-E show another example of a different split of wear leveling group 2900 (i.e. an alternative split to the splits illustrated in FIGS. 29A-E and FIGS. 30A-E). In FIGS. 31A-E, wear leveling group 2900 is split into two subgroups 3122 and 3124 along a different plane to that shown in FIGS. 29A-E or FIGS. 30A-E so that four physical addresses on front and back sides form separate subgroups. Thus, subgroup 3122 of FIG. 31B is formed of physical addresses 000, 001, 010, and 011 from the front of FIG. 31A (physical addresses with first bit=0). FIG. 31A shows group 2900 with an identity placement mapping (PM=000) so that logical addresses and physical addresses are the same for simplicity of illustration. Similarly, FIG. 31B shows subgroup 3122 with PM=000. Subsequently, as shown in FIG. 31C, a different placement mapping, PM=010, is used for subgroup 3122.

Figure 31E:
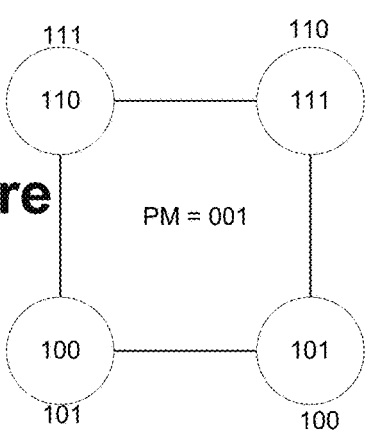

Subgroup 3124 of FIG. 31D is formed of physical addresses 100, 101, 110, and 111 (i.e. physical addresses with first bit=1). FIG. 31D shows subgroup 3124 with PM=000. Subsequently, as shown in FIG. 31E, a different placement mapping, PM=001, is used for subgroup 3124. This placement mapping is different to the placement mapping used for subgroup 3122 so that it can be seen that each subgroup is independently remapped according to a separate wear leveling scheme.

The three different splits illustrated in FIGS. 29A to 31E each divide a group according to one bit in the 3-bit addresses used. Thus, in FIGS. 29A-E, subgroups are based on the second bit with physical addresses having second bit=1 (i.e. physical addresses 010, 011, 110, and 111) forming subgroup 2902 and physical addresses having a second bit=0 (i.e. physical addresses 000, 001, 100, and 101) forming subgroup 2904. In FIGS. 30A-E, subgroups are based on the third bit (last bit) with physical addresses having third bit=0 (i.e. physical addresses 000, 010, 100, and 110) forming subgroup 3012 and physical addresses having a third bit=1 (i.e. physical addresses 001, 011, 101, and 111) forming subgroup 3014. In FIGS. 31A-E, subgroups are based on the first bit with physical addresses having first bit=0 (i.e. physical addresses 000, 001, 010, and 011) forming subgroup 3122 and physical addresses having a first bit=1 (i.e. physical addresses 100, 101, 110, and 111) forming subgroup 3124. In any of these examples, a wear leveling scheme applied to such a subgroup may be based on two bits (i.e. excluding the bit used to split the two subgroups). Thus, for example, the first bit in physical and logical addresses of FIG. 31E may be ignored (all logical and physical addresses have a first bit=1) so that the wear leveling scheme may be represented by a 2-bit string (PM=01) applied to the remaining two bits of a logical address to obtain a corresponding 2-bit physical address (logical addresses are assigned to physical addresses by XOR of 2-bit string and two bits of logical address). In general, when a wear leveling group is split, operating the two (or more) resulting subgroups as separate wear leveling groups requires some additional overhead (e.g. two bit strings are maintained, and an additional determination is performed to identify which wear leveling group an address is mapped to and thus which bit string to apply).

While the examples of FIGS. 29A-31E show splitting of a 3-dimensional hypercube, it will be understood that the technology described may be applied to an n-dimensional hypercube, where n may be any value. For any such n-dimensional hypercube, that maps an n-bit logical address to an n-bit physical address, physical addresses and logical addresses may be split n ways (i.e. each bit can be used to split an n-dimensional hypercube into two (n−1)-dimensional hypercubes). Other splits may also be applied (e.g. along a diagonal or in some other way). Also, while the examples show splitting a wear leveling group into smaller wear leveling groups, groups may also be merged in a reverse operation (i.e. merging of groups of physical addresses to form merged groups of physical addresses).

Figure 32A:
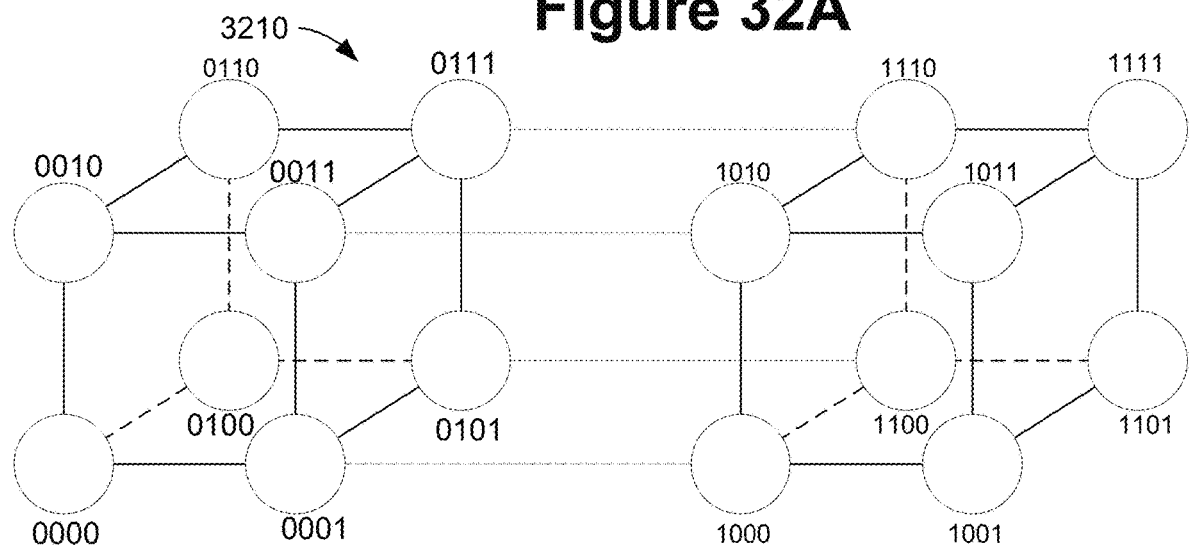
FIGS. 32A-C illustrate an example of splitting and merging of wear leveling groups.
Figure 32B:
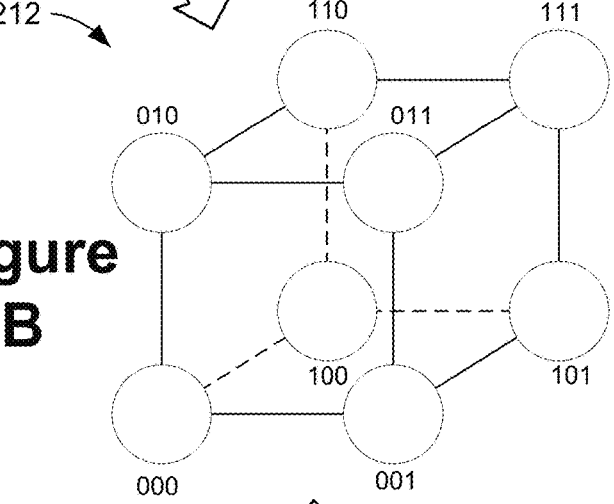
Figure 32C:
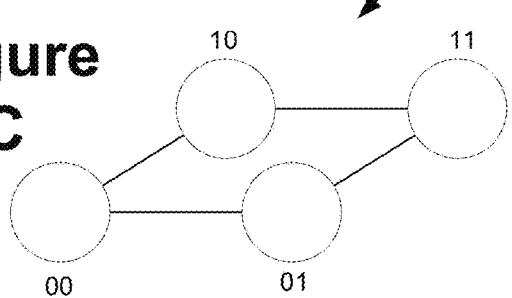

FIGS. 32A-C illustrate examples of splitting and merging between wear leveling groups in different configurations and is a generalized illustration (with FIGS. 29A-31E showing specific examples). FIG. 32A shows an example of a wear leveling group 3210 represented by a 4-dimensional hypercube, with each physical address given as a four-bit address (logical addresses are omitted for simplicity). Wear leveling may use a 4-bit string in an XOR operation to assign logical addresses to physical addresses.

A wear leveling group of physical units represented by addresses of a 4-dimensional hypercube may be split into smaller subgroups, for example, two subgroups each represented by a 3-dimensional hypercube as illustrated in FIG. 32B, with physical addresses of the subgroup selected according to a bit in the 4-bit physical address (e.g. the first bit). FIG. 32B uses 3-bit physical addresses of wear leveling group 3212 to represent the physical units (e.g. by dropping the first bit of corresponding 4-bit addresses of FIG. 32A). Two such groups, represented by 3-dimensional hypercubes, may be formed from a group such as wear leveling group 3210 shown in FIG. 32A, represented by a 4-dimensional hypercube. Wear leveling may use a 3-bit string in an XOR operation to convert logical addresses to physical addresses in such 3-dimensional hypercubes.

Wear leveling group 3212 of FIG. 32B may be further split into subgroups such as illustrated by wear leveling group 3214, which is shown as a 2-dimensional hypercube (square) in FIG. 32C. Two such 2-dimensional hypercubes may be formed from a 3-dimensional hypercube and addresses in a 2-dimensional hypercube may be 2-bit addresses (e.g. by dropping the first bit of corresponding 3-bit addresses of FIG. 32B). Wear leveling in such a 2-dimensional hypercube group may use a 2-bit string in an XOR operation to convert logical addresses to physical addresses.

While FIGS. 32A-C indicate splits that divide groups in half, in some cases, a group may be split into more than two subgroups. For example, instead of proceeding from a 4-dimensional hypercube wear leveling group (e.g. as in FIG. 32A) to a 3-dimensional hypercube wear leveling group (e.g. as in FIG. 32B) to a 2-dimensional hypercube wear leveling group (e.g. as in FIG. 32C), a 4-dimensional hypercube may simply be split into four 2-dimensional subgroups. Thus, four groups such as wear leveling group 3214 illustrated in FIG. 32C may be generated from a 4-dimensional group such as wear leveling group 3210 illustrated in FIG. 32A without going through an intermediate stage of a 3-dimensional group.

It will be understood that transitions illustrated between 4, 3, and 2-dimensional hypercubic arrangements of FIGS. 32A-C may occur in either direction, e.g. two 2-dimensional hypercubes may be merged to form a 3-dimensional hypercube, two 3-dimensional hypercubes may be merged to form a 4-dimensional hypercube, or four 2-dimensional hypercubes may be directly merged to form a 4-dimensional hypercube. In general, n-dimensional hypercubes may be divided to form (n−x)-dimensional hypercubes and n-dimensional hypercubes may be merged to form (n+y)-dimensional hypercubes, where x and y are arbitrary. Wear leveling for a group of any size may be achieved using placement mappings that are defined by bit strings of appropriate length (e.g. an n-bit string for a wear leveling group represented by an n-dimensional hypercube).

Dynamic configuration of wear leveling groups is not limited to any particular wear leveling scheme and may be applied to a range of different wear leveling schemes including deterministic wear leveling schemes and schemes that are based on media properties and/or logical data properties. While examples above are illustrated with hypercubic mapping, wear leveling groups of other wear leveling schemes may also be dynamically configured (e.g. split, merged, or otherwise resized).

FIGS. 33A-C illustrate an example of splitting a wear leveling group 3340 in a start gap wear leveling scheme (e.g. a scheme such as shown and described with respect to FIGS. 7A-I). FIG. 33A shows wear leveling group 3340 in which N physical units (Unit 1 to Unit N) are mapped to physical addresses A to ZZ according to a wear leveling scheme that rotates mapping of logical addresses to physical addresses as previously shown, for example, in FIG. 24. Physical Unit X does not have data and represents a gap in the logical to physical map that facilitates movement of data between physical units. In some cases, a gap of more than one physical unit may facilitate incrementing mapping by more than one physical unit at a time. Thus, the number of physical units, N, exceeds the number of logical units by at least one to allow for a gap and may exceed the number of logical units by more than one to provide a larger gap and/or provide additional flexibility.

Wear leveling group 3340 is split into wear leveling group 3342 of FIG. 33B and wear leveling group 3344 of FIG. 33C which are separate, independently operating wear leveling groups (or subgroups). Thus, physical units 1 to N/2 form individual wear leveling group 3342, which rotates logical addresses A to Z through physical units 1 to N/2. Physical unit X (where X is between 1 and N/2) is not assigned a logical address and thus represents a gap that facilitates movement of data in wear leveling group 3342.

Physical units N/2+1 to N form individual wear leveling group 3344, which rotates logical addresses AA to ZZ through physical units N/2+1 to N. Physical unit Y (where Y is between N/2+1 and N) is not assigned a logical address and thus represents a gap that facilitates movement of data in wear leveling group 3344. Thus, both wear leveling group 3342 and wear leveling group 3344 have respective gaps that may proceed according to respective wear leveling schemes. Similarly, both wear leveling group 3342 and wear leveling group 3344 have respective start locations that move according to respective wear leveling schemes. For example, the location of logical unit A in Unit 1 may be a start location and the location of the gap at Unit X may be a gap location of wear leveling group 3342. The location of logical unit AA in Unit N/2+1 may be a start location and the location of the gap at Unit Y may be a gap location of wear leveling group 3344. Thus, splitting wear leveling group 3340 into two separate wear leveling groups 3342 and 3344 uses some additional overhead to store two start locations and two gap locations instead of one (e.g. two start pointers and two gap pointers). Furthermore, two gaps are used to implement two start gap wear leveling schemes, with the additional gap using additional space in memory.

While FIGS. 33A-C show an example of splitting a wear leveling group into two equal-sized subgroups that are then operated as separate, independent wear leveling groups, other reconfigurations may be performed. For example, a wear leveling group may be split into more than two subgroups and subgroups may be of unequal size. Groups may also be merged so that two or more wear leveling groups, of equal or unequal size, may be merged and the merged group may be operated as a single wear leveling group. In general, wear leveling groups in start gap schemes may be split by choosing any continuous range of logical addresses and splitting them. Adjacent wear leveling groups can be easily merged also.

FIG. 34 illustrates an example of a wear leveling group 3450 that may be split into a number of subgroups, including subgroups 3452a-c, which are then individually operated as wear leveling groups according to respective wear leveling schemes (while three subgroups, subgroups 5452a-c, are shown, additional subgroups may be generated, and the number of subgroups is not limited to the three shown). Thus, FIG. 34 represents a more general example of dynamic group size configuration than the equal splitting of FIGS. 33A-C. Wear leveling group 3450 includes physical units 1 to N and may be operated using a wear leveling scheme such as a start gap wear leveling scheme or other scheme.

A first subgroup 3452a includes physical units 1 to K, where K may be chosen according to physical media properties and/or logical data properties and/or other factors. For example, physical units 1 to K may be chosen because they have a high level of wear, or a low level of wear, compared with other physical units of wear leveling group 3450. Subgroup 3452a may be subject to a wear leveling scheme such as a start gap wear leveling scheme or other wear leveling scheme.

A second subgroup 3452b includes physical units K+1 to K+Y, where Y may be any suitable number (i.e. the size of the group may be of any desired size). For example, Y may be chosen according to one or more media properties, one or more logical data property, and/or other factors. Additional subgroups (not shown) may be of any desired size and the number of such subgroups may be chosen according to various factors. A final subgroup 3452c includes physical units M to N. Each subgroup may be operated as a separate wear leveling group with an individual wear leveling scheme (e.g. start gap scheme or other scheme). Different subgroups may be of different sizes and may operate different wear leveling schemes. In general, operating a larger number of small wear leveling groups requires more overhead than operating a smaller number of large wear leveling groups.

Wear leveling groups may be merged to form merged groups that are then operated as a single wear leveling group. Thus, subgroups 3452a-c may be merged to form wear leveling group 3450. The number and sizes of such groups may be selected according to one or more media properties, logical data properties, and/or other factors. For example, a wear leveling group formed of physical units with heavy wear may be merged with one or more other wear leveling groups of physical units with light wear in order to distribute wear more evenly. Wear leveling groups with similar levels of wear may be merged and operated together with a wear leveling scheme that is selected for the level of wear.

Figure 35:
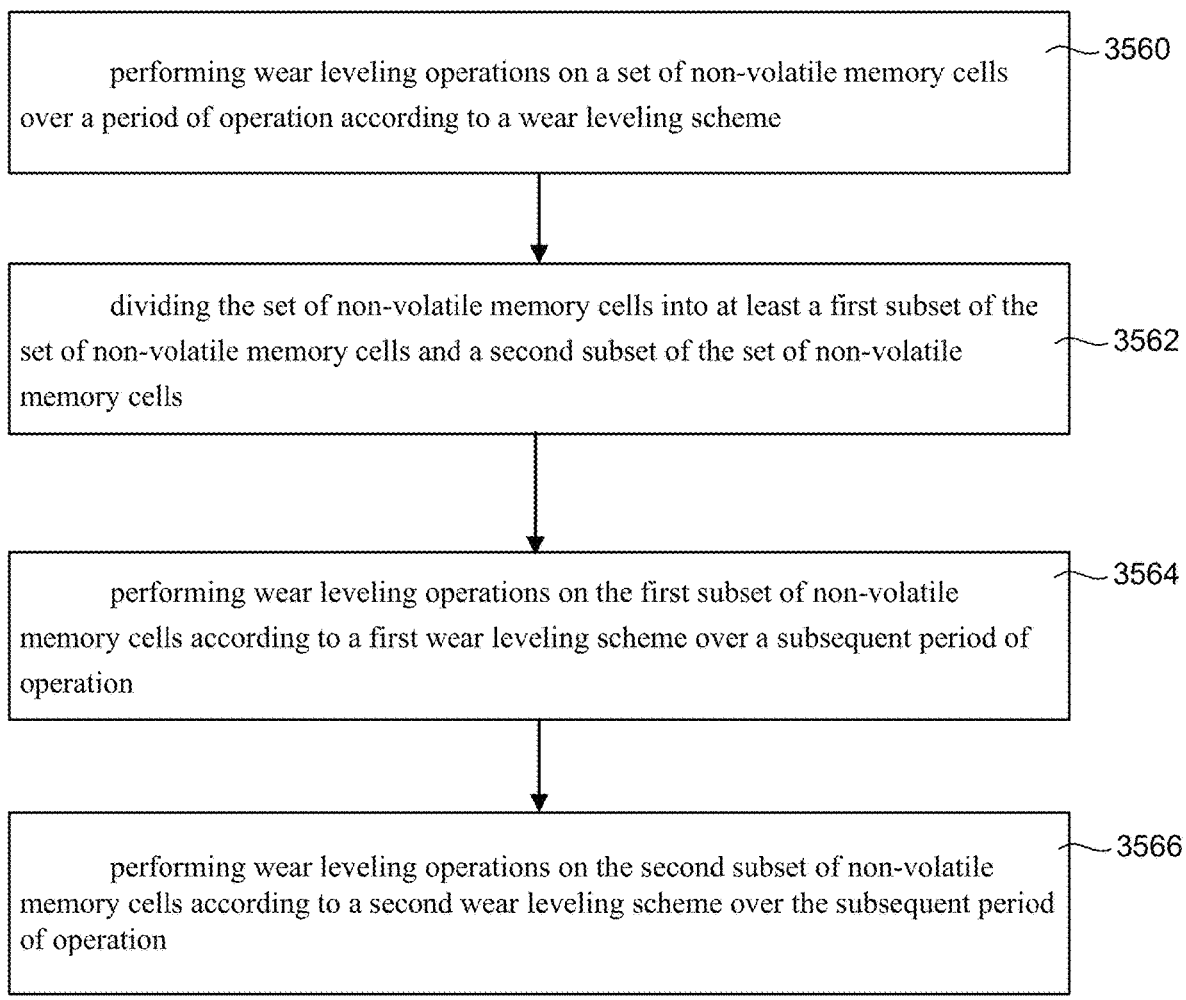
FIG. 35 illustrates an example of a method that includes dividing and performing wear leveling operations.

FIG. 35 illustrates a method that applies aspects of the present technology that may be applied to wear leveling groups in memories employing start gap wear leveling (e.g. as shown in FIGS. 7A-I) or hypercubic wear leveling (e.g. as illustrated in FIGS. 25A-C) or other wear leveling schemes. Step 3560 includes performing wear leveling operations on a set of non-volatile memory cells over a period of operation according to a wear leveling scheme, for example a deterministic wear leveling scheme such as a start gap scheme illustrated in FIGS. 7A-I or a scheme based on a media property and/or logical data property such as illustrated in FIG. 27. Step 3562 includes dividing the set of non-volatile memory cells into at least a first subset of the set of non-volatile memory cells and a second subset of the set of non-volatile memory cells, e.g. dividing as shown in FIG. 29A-E, 30A-E, 31A-E, 33A-C, or 34. In an example, subsets (or subgroups) are subsets of equal size, while in other examples they may be of unequal size. Step 3564 includes performing wear leveling operations on the first subset of non-volatile memory cells according to a first wear leveling scheme over a subsequent period of operation, for example, as illustrated in FIGS. 29B-C, 30B-C, and 31B-C. Step 3566 includes performing wear leveling operations on the second subset of non-volatile memory cells according to a second wear leveling scheme over the subsequent period of operation, for example, as shown in FIGS. 29D-E, 30D-E, and 31D-E.

Figure 36A:
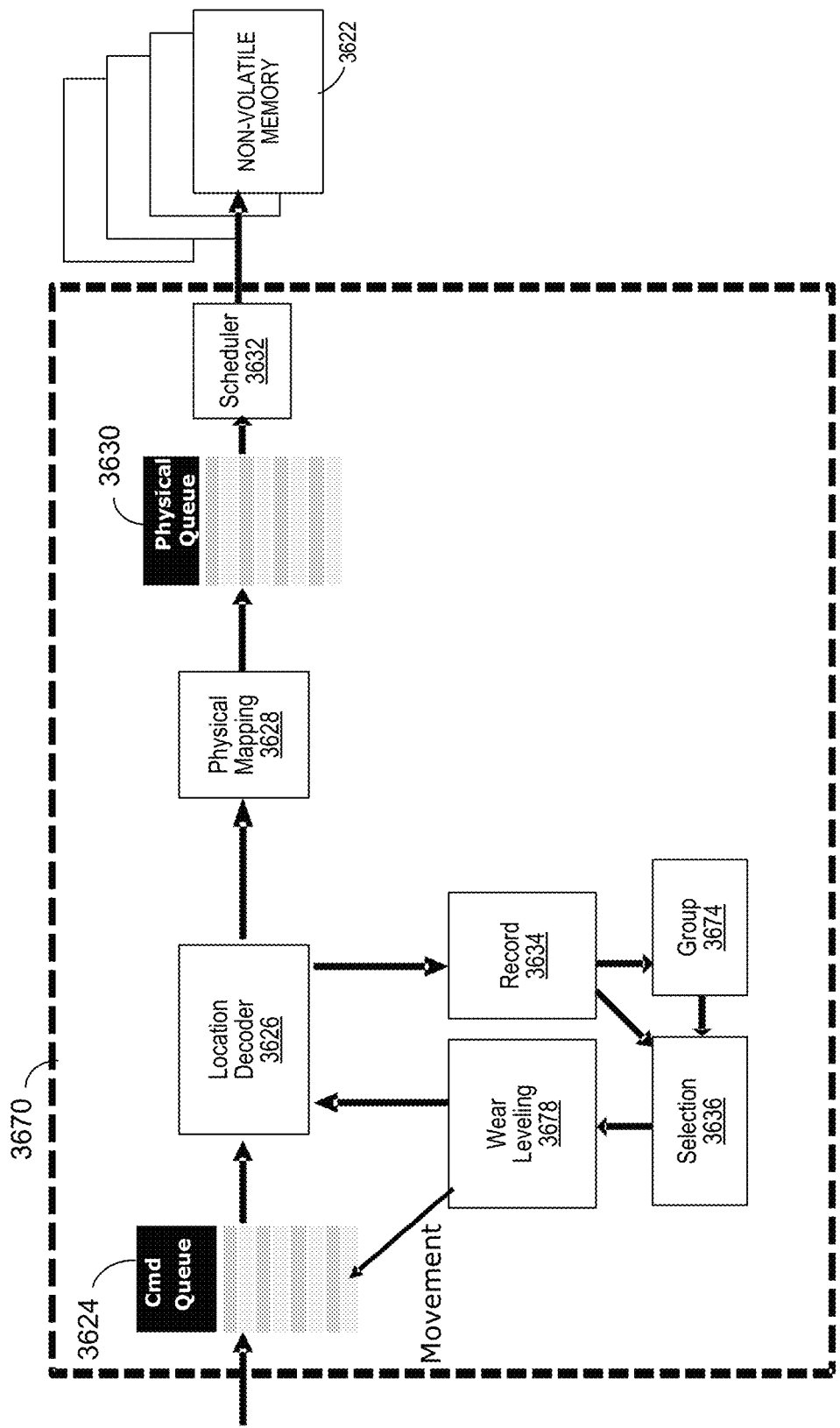
FIGS. 36A-C illustrate an example of control circuits.
Figure 36B:
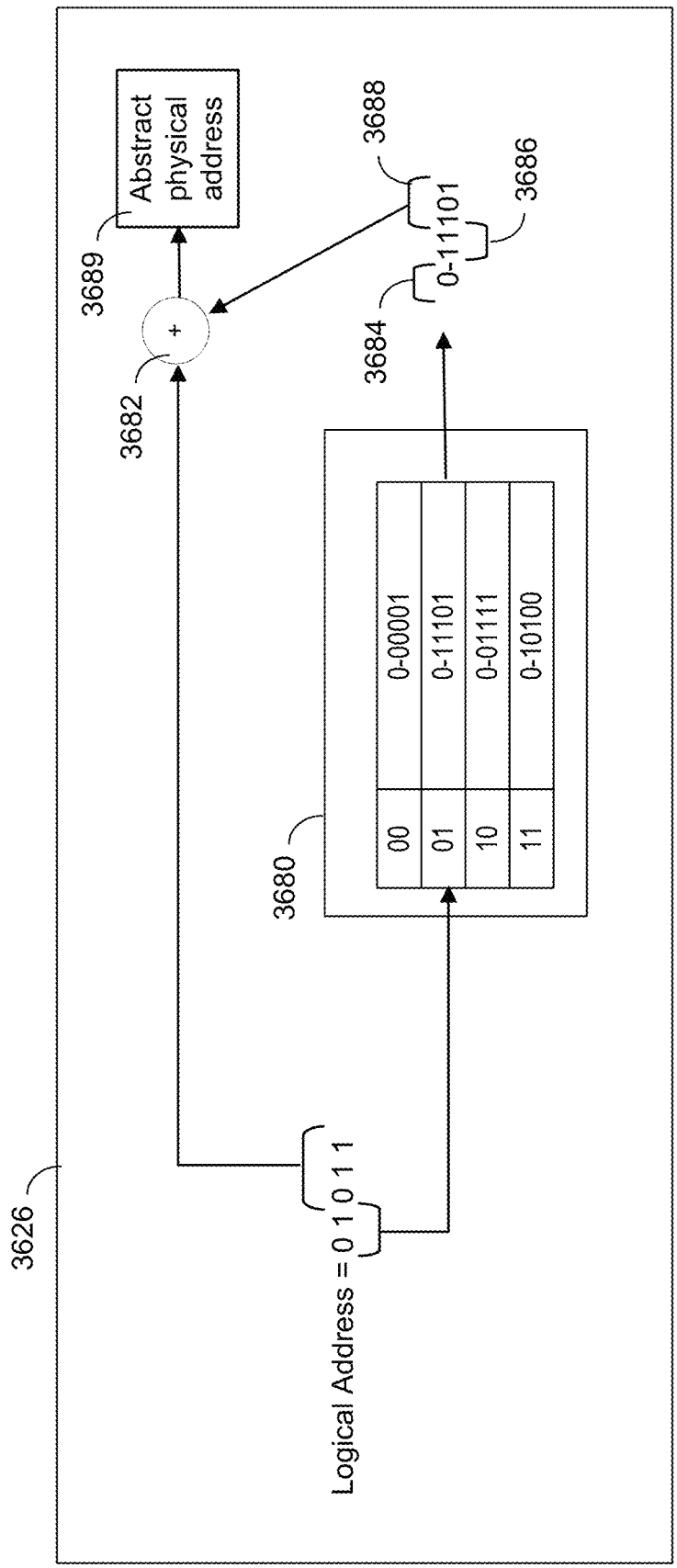

Aspects of the present technology may be implemented using a range of different configurations. An example of a configuration that may be used to implement aspects described above including, for example, the method illustrated in FIG. 35 to select group size for wear leveling groups and splitting and merging wear leveling groups (e.g. as shown in FIGS. 32A-C or 34) is illustrated in FIGS. 36A-B. Control circuits 3670 are in communication with a set of non-volatile memory cells that form a plurality of physical units (e.g. pages, blocks, planes, dies, banks, or other units) of non-volatile memory 3622, where each physical unit has a physical address. A command queue 3624 receives commands (e.g. read and write commands) from a host. Commands are sent from command queue 3624 to location decoder 3626, which uses a placement mapping to map incoming commands from the host to abstract physical addresses. For example, location decoder 3626 may apply one or more start gap schemes (as illustrated in FIGS. 7A-I) by applying offsets to a received logical address to obtain a corresponding abstract physical address or may apply hypercubic schemes by performing XOR operations that XOR a received logical address with a bit string to obtain a corresponding abstract physical address (e.g. as illustrated in FIGS. 25A-C). Abstract physical addresses are sent from location decoder 3626 to physical mapping module 3628, which converts an abstract physical address into a physical address (e.g. into an address that specifies a physical location in terms of a word line, plane, die, bank, subarray, etc.). These commands are placed in a physical command queue 3630 and from there pass to a scheduler 3632 to be executed in the non-volatile memory 3622 (e.g. by writing data in a designated unit in non-volatile memory 3622).

A placement mapping used by location decoder 3626 may be modified according to a deterministic wear leveling scheme or according to a cost function to provide wear leveling as previously described with respect to FIG. 28. For example, a record 3634 may store data relating to one or more recorded media properties and/or one or more logical data properties. For example, as commands are decoded by location decoder 3626, record 3634 may store numbers of writes to particular units (i.e. some record of access or measure of wear), and/or numbers of times particular logical addresses are written (heat of particular logical address), which identifies patterns of access. Thus, record 3634 may be considered a means for detecting a pattern of access to the plurality of physical units. In another example, bit error rate data (e.g. from an ECC decoder) may be recorded for different units. Such data stored in record 3634 may be used to select a new placement mapping for use by location decoder 3626. For example, data relating to a media property of at least a subset of physical units in non-volatile memory 3622 may be used by selection module 3636 to select a new placement mapping based on numbers of individual unit mappings between heavily worn units that are associated with different placement mapping selections (as described above with respect to FIG. 26).

Record 3634 is also connected to grouping module 3674, which groups physical units into wear leveling groups. Grouping module 3674 may split a wear leveling group into subgroups, merge wear leveling groups, or otherwise configure the sizes of wear leveling groups as described above, e.g. according to information from record 3634. Grouping module 3674 may be considered a means for selecting a number of physical units to form a wear leveling group based on a detected pattern of access to the plurality of physical units. The result of any changes in such grouping by grouping module 3674 is sent to selection module 3636. Thus, for example, in the case of splitting a wear leveling group, selection module 3636 may be informed of the split and in response may operate two separate wear leveling schemes (e.g. by selecting two different placement mappings) for the subgroups resulting from the split.

When one or more new placement mappings are selected by selection module 3636, they are sent to wear leveling module 3678 to implement the movement of data in non-volatile memory 3622 by generating corresponding read and write commands and inserting them in command queue 3624. Thus, wear leveling module 3678 in combination with command queue 3624 and read/write circuits of non-volatile memory 3622 may move data stored in the plurality of units according to the placement mapping. Wear leveling module 3678 also updates location decoder 3626 as data is moved (i.e. as corresponding read and write commands generated by wear leveling module 3678 are executed and data is moved from locations corresponding to the old placement mapping to locations corresponding to the new placement mapping).

FIG. 36B shows an example configuration of location decoder 3626 that may implement aspects of the present technology. In particular, location decoder 3626 includes a RAM 3680 (e.g. DRAM) that supports location decoding of data that is wear leveled according to different wear leveling schemes for different wear leveling groups. A logical address 01011 is received by location decoder 3626, e.g. from command queue 3624. A portion of the logical address is used to determine which wear leveling group the corresponding physical unit is in and thus which placement mapping to apply. Thus, placement mappings for different groups can be applied by location decoder 3626. Location decoder 3626 may be considered a means for applying a wear leveling scheme to the wear leveling group, or applying multiple wear leveling schemes to multiple wear leveling groups. In the example of FIG. 36B, the first two bits "01" represent a group of logical addresses that are operated as a wear leveling group and this is used to lookup RAM 3680 to find a corresponding entry that provides a lead bit 3684 ("0" in this example), a group number 3686 ("11" in this example) and the placement mapping bit string 3688 ("101" in this example). Lead bit 3684 having a value "0" is used to indicate that the group has not been split and that the entry in RAM 3680 corresponds to a group number and placement mapping (a value "1" is used to indicate that a split has occurred) Thus, lead bit 3684 is used as a split indicator (other suitable indicators may be used in other examples). The remainder of the logical address 01011 (excluding the leading two bits"01"), 011, is combined with bit string 3688 obtained from RAM 3680 by combination circuit 3682. For example, combination circuit 3682 may be an XOR circuit that generates an XOR of 011 (from logical address) and 101 (bit string 3688). Group number 3686 and the output of combination circuit 3682 provide an abstract physical address 3689 corresponding to logical address 01011. In another example, placement mappings may be provided by offsets and combination circuit 3682 may apply an offset obtained from RAM 3680 to a logical address. This provides an abstract physical address that is sent to physical mapping module 3628. Thus, any logical address beginning with "01" that is received by location decoder 3626 is used to obtain a group number and a bit string that is XORed with the remainder of the logical address while other logical addresses (corresponding to other wear leveling groups) may be XORed with other strings.

Figure 36C:
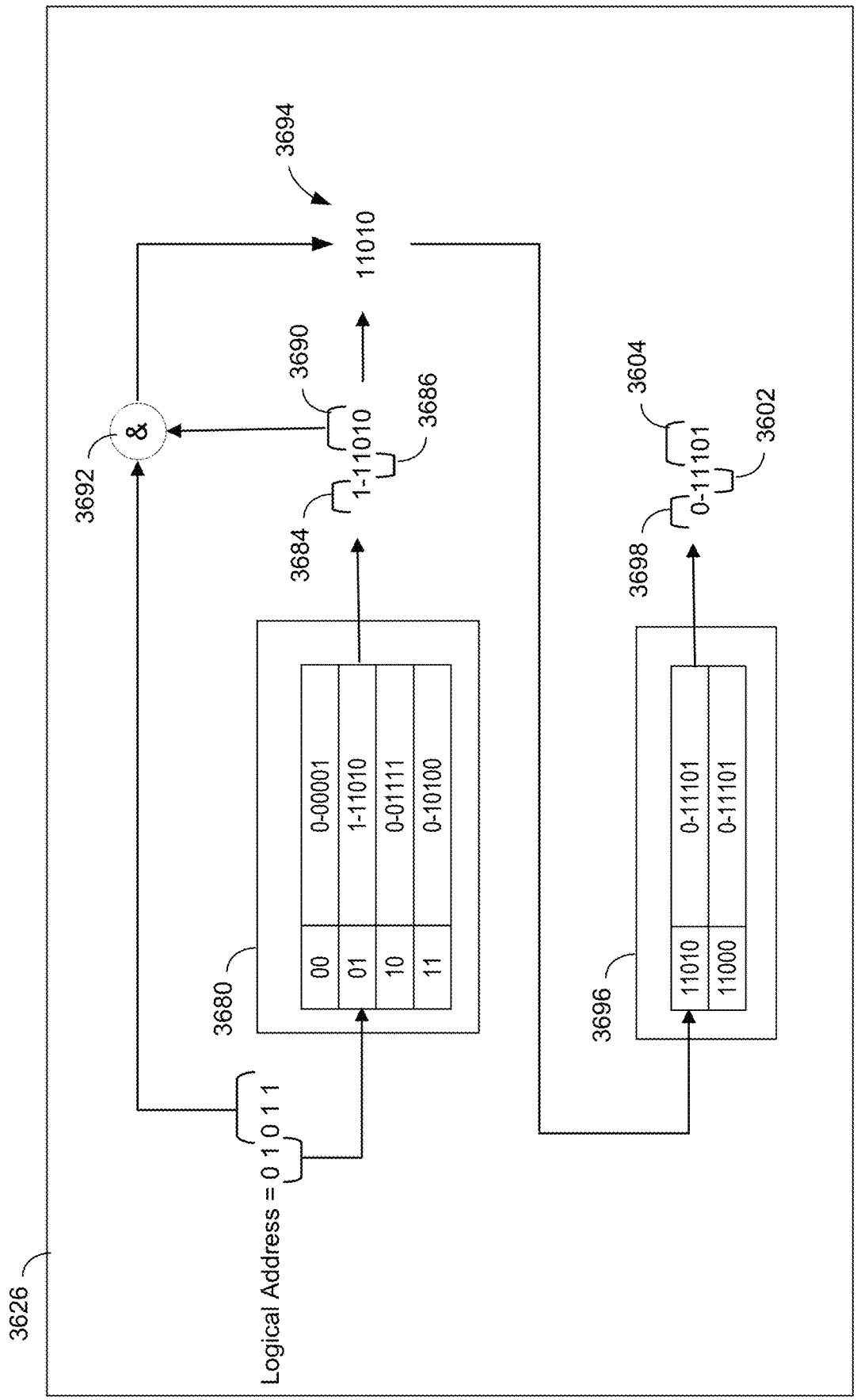

FIG. 36C provides another example of operation of location decoder 3626 in which a received logical address corresponds to a wear leveling group that is split. The logical address is 01011 as before. The leading two bits ("01") are used to find a corresponding entry in RAM 3680, which is 1-11010 in this example. The lead bit 3684 is "1" signifying that a split has occurred in the original wear leveling group corresponding to this logical address. The following two bits are group number 3686 as before and the last three bits are a split pattern code 3690 ("010") and not a bit string for a placement mapping as in the previous example. The split pattern code having a second bit=1 indicates that the split applied to the wear leveling group was based on the second bit (i.e. original group was split into addresses having a second bit=0 and addresses having a second bit=1 as illustrated in FIGS. 29A-E). Split pattern code 3690 is subject to an AND operation with the last three digits ("011") of the received logical address by AND circuit 3692. The output from AND circuit 3692 indicates which subgroup the address corresponds to and this is combined with group number 3686 to generate a CAM key 3694 ("11010" in this example) that is used to access a Content Addressable Memory (CAM), CAM 3696. The entry in CAM 3696 corresponding to the CAM key 11010 ("0-11101" in this example) includes lead bit 3698, which is a split indicator whose value ("0") which indicates no further split (i.e. the subgroup was not further split, and this subgroup is operated as a wear leveling group). Thus, the remaining portion of the entry corresponds to a group number 3602 and a placement mapping 3604 which are used as previously described in FIG. 36B (e.g. placement mapping may be XORed with logical address and the combination of group number 3602 and XOR output provide an abstract physical address that may be provided to physical mapping module 3628).

While the above examples illustrate particular implementations, it will be understood that various implementations are possible and that the present technology is not limited to the examples above. For example, while a RAM may be used for entries corresponding to original wear leveling groups and a CAM may be used for subgroups resulting from splits in the original wear leveling groups, other hardware may also be used (e.g. RAM, such as DRAM, may be used throughout, or CAM may be used throughout, or some other memory may be used for some or all functions). CAM generally provides a rapid, easily-reconfigured way to convert logical addresses to physical addresses according to multiple wear leveling schemes, e.g. a first wear leveling scheme and a second wear leveling scheme applied to different subgroups of a wear leveling group. CAM, such as CAM 3696, may be considered a means for applying a first wear leveling scheme to a first subgroup of a wear leveling group and applying a second wear leveling scheme to a second subgroup of the wear leveling group. Other configurations may also be used. A CAM may contain any form of meta-data (e.g. start and gap pointers, or other meta-data used in other schemes). CAM can be looked up rapidly and can be reconfigured as needed as wear leveling groups are split and/or merged. In some cases, space in CAM may be limited so that when a limit is reached, it may be necessary to merge previously formed subgroups before splitting a wear leveling group (e.g. when CAM is full, new entries can only be added by deleting one or more existing entries, which may be achieved by merging subgroups).

Aspects of the present technology, such as aspects of wear leveling illustrated in FIGS. 29A-36B, may be implemented using any suitable hardware including dedicated hardware (e.g. dedicated circuits in an ASIC, or in one or more separate ICs), programmable hardware (e.g. one or more PLDs, FPGAs, etc.), using a controller that is configured by suitable software, e.g. by firmware, or by some combination of these approaches.

An example of a non-volatile storage apparatus includes a set of non-volatile memory cells; and one or more control circuits in communication with the set of non-volatile memory cells, the one or more control circuits are configured to group physical addresses of the set of non-volatile memory cells into groups of configurable sizes and to individually apply wear leveling schemes to non-volatile memory cells of a group.

The one or more control circuits may be configured to split a group of physical addresses subject to a wear leveling scheme into at least a first subgroup of physical addresses and a second subgroup of physical addresses, to individually apply a first wear leveling scheme to the first subgroup of physical addresses, and to individually apply a second wear leveling scheme to the second subgroup of physical addresses. The one or more control circuits may be configured to merge a first group of physical addresses subject to a first wear leveling scheme and at least a second group of physical addresses subject to a second wear leveling scheme to form a merged group of physical addresses, and to apply a third wear leveling scheme to the merged group of physical addresses. The one or more control circuits may be further configured to record one or more media properties of the set of non-volatile memory cells and to regroup physical addresses of the set of non-volatile memory cells into new wear leveling groups according to recorded media properties and to individually apply wear leveling schemes to the new wear leveling groups. The one or more media properties may include wear and the one or more control circuits may be configured to perform at least one of merging groups of physical addresses and splitting groups of physical addresses according to recorded wear. The one or more control circuits may include a Content Addressable Memory (CAM) configured to store meta-data. The one or more control circuits may include an Exclusive OR (XOR) circuit and the one or more control circuits may be configured to apply a hypercubic wear leveling scheme to an individual group whereby logical addresses are assigned to physical addresses of the individual group by the Exclusive OR (XOR) circuit performing an Exclusive OR (XOR) operation on a logical address and a bit string to obtain a physical address. The set of non-volatile memory cells may comprise Phase Change Memory (PCM) cells, Resistive Random Access Memory (ReRAM) cells, or Magnetoresistive Random Access Memory (MRAM cells). The set of non-volatile memory cells may be formed in a plurality of memory levels disposed above a substrate in a monolithic three-dimensional memory structure.

An example of a method includes performing wear leveling operations on a set of non-volatile memory cells over a period of operation according to a wear leveling scheme; dividing the set of non-volatile memory cells into at least a first subset of the set of non-volatile memory cells and a second subset of the set of non-volatile memory cells; performing wear leveling operations on the first subset of the set of non-volatile memory cells according to a first wear leveling scheme over a subsequent period of operation; and performing wear leveling operations on the second subset of the set of non-volatile memory cells according to a second wear leveling scheme over the subsequent period of operation.

Dividing the set of non-volatile memory cells into at least a first subset of the set of non-volatile memory cells and a second subset of the set of non-volatile memory cells may include dividing the set of non-volatile memory cells into subsets of equal size. Performing wear leveling operations according to the wear leveling scheme may include performing an Exclusive OR (XOR) operation on an n-bit logical address to obtain an n-bit physical address, performing wear leveling operations on the first subset of the set of non-volatile memory cells according to the first wear leveling scheme may include performing an Exclusive OR (XOR) operation on an (n−1)-bit logical address and a first (n−1)-bit string to obtain an (n−1)-bit physical address, and performing wear leveling operations on the second subset of the set of non-volatile memory cells according to the second wear leveling scheme may include performing an Exclusive OR (XOR) operation on an (n−1)-bit logical address and a second (n−1)-bit string to obtain an (n−1)-bit physical address. Dividing the set of non-volatile memory cells into at least the first subset of the set of non-volatile memory cells and the second subset of the set of non-volatile memory cells may be triggered by a pattern of access to memory cells of the set of non-volatile memory cells, or by a pattern of changing media characteristics. The pattern of access may include frequent access directed at one or more addresses. The method may include maintaining a record of access to the set of non-volatile memory cells and searching the record of access for one or more patterns of access to the set of non-volatile memory cells, the one or more patterns of access triggering at least one of: dividing the set of non-volatile memory cells and merging the set of non-volatile memory cells with another set of non-volatile memory cells. Performing wear leveling operations according to the wear leveling scheme may include maintaining a gap in a logical to physical mapping and rotating the gap through physical addresses of the set of non-volatile memory cells; performing wear leveling operations on the first subset of the set of non-volatile memory cells according to the first wear leveling scheme may include maintaining a first gap in a logical to physical mapping of the first subset of the set of non-volatile memory cells and rotating the first gap through physical addresses of the first subset of the set of non-volatile memory cells; and performing wear leveling operations on the second subset of the set of non-volatile memory cells according to the second wear leveling scheme may include maintaining a second gap in a logical to physical mapping of the second subset of the set of non-volatile memory cells and rotating the second gap through physical addresses of the second subset of the set of non-volatile memory cells. The method may include merging the first subset of the set of non-volatile memory cells and additional non-volatile memory cells to form a merged set of non-volatile memory cells, and performing wear leveling operations on the merged set of non-volatile memory cells according to a third wear leveling scheme. The method may include detecting a high level of wear of the first subset of the set of non-volatile memory cells; in response to detecting the high level of wear of the first subset of the set of non-volatile memory cells, triggering the merging of the first subset of the set of non-volatile memory cells and the additional non-volatile memory cells; and selecting the additional non-volatile memory cells for the merging based on a low level of wear of the additional non-volatile memory cells.

An example of a system includes a set of non-volatile memory cells forming a plurality of physical units, each physical unit having a physical address; means for detecting a pattern of access to the plurality of physical units; means for selecting a number of physical units to form a wear leveling group based on a detected pattern of access to the plurality of physical units; and means for applying a wear leveling scheme to the wear leveling group.

The system may include means for applying a first wear leveling scheme to a first subgroup of the wear leveling group and applying a second wear leveling scheme to a second subgroup of the wear leveling group.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
one or more control circuits configured for communication with a set of non-volatile memory cells, the one or more control circuits are configured to group physical addresses of the set of non-volatile memory cells into two or more wear leveling groups including at least a first wear leveling group and a second wear leveling group, apply a first wear leveling scheme to only the first wear leveling group to level wear only between physical addresses of the first wear leveling group, the first wear leveling scheme configured to change logical-to-physical mapping of the first wear leveling group, apply a second wear leveling scheme that is independent of the first wear leveling scheme to only the second wear leveling group to level wear only between physical addresses of the second wear leveling group, the second wear leveling scheme configured to change logical-to-physical mapping of the second wear leveling group, in response to detecting a high level of wear of the first wear leveling group, merge at least the first wear leveling group and the second wear leveling group to form a merged wear leveling group, the second wear leveling group selected based on a low level of wear of the second wear leveling group, and apply a third wear leveling scheme to the merged wear leveling group.

2. The non-volatile storage apparatus of claim 1 wherein the first and second wear leveling groups have N physical units each and the third wear leveling group has 2N physical units.

3. The non-volatile storage apparatus of claim 1 wherein the one or more control circuits are further configured to subsequently split the merged wear leveling group.

4. The non-volatile storage apparatus of claim 1 wherein the one or more control circuits are configured to record the merge in a table.

5. The non-volatile storage apparatus of claim 1 wherein the one or more control circuits are further configured to record one or more media properties including wear of the set of non-volatile memory cells and merge groups of physical addresses according to recorded wear.

6. The non-volatile storage apparatus of claim 4 wherein the one or more control circuits include a Content Addressable Memory (CAM) configured to store the table.

7. The non-volatile storage apparatus of claim 1 wherein the one or more control circuits are further configured to apply at least one of a start gap wear leveling scheme and an Exclusive OR (XOR) wear leveling scheme.

8. The non-volatile storage apparatus of claim 1 wherein the set of non-volatile memory cells comprise Phase Change Memory (PCM) cells, Resistive Random Access Memory (ReRAM) cells, or Magnetoresistive Random Access Memory (MRAM cells).

9. The non-volatile storage apparatus of claim 1 wherein the set of non-volatile memory cells is formed in a plurality of memory levels disposed above a substrate in a monolithic three-dimensional memory structure.

10. A method, comprising:
performing wear leveling operations on a first wear leveling group according to a first wear leveling scheme over a period of operation including performing an XOR operation on a logical address and a first bit string to obtain a physical address and changing the first bit string to swap logical addresses between pairs of physical addresses of the first wear leveling group;

performing wear leveling operations on a second wear leveling group according to a second wear leveling scheme over the period of operation including performing an XOR operation on a logical address and a second bit string to obtain a physical address and changing the second bit string to swap logical addresses between pairs of physical addresses of the second wear leveling group;

detecting a high level of wear of the first wear leveling group;

in response to detecting the high level of wear of the first wear leveling group, merging at least the first wear leveling group and the second wear leveling group to form a merged wear leveling group, the second wear leveling group selected for the merging based on a low level of wear of the second wear leveling group; and performing wear leveling operations on the merged wear leveling group according to a third wear leveling scheme over a subsequent period of operation including performing an XOR operation on a logical address and a third bit string to obtain a physical address and changing the third bit string to swap logical addresses between pairs of physical addresses of the merged wear leveling group.

11. The method of claim 10 wherein the first and second wear leveling groups are of equal size.

12. The method of claim 10 wherein performing wear leveling operations according to the third wear leveling scheme includes performing an Exclusive OR (XOR) operation on an n-bit logical address to obtain an n-bit physical address, performing wear leveling operations according to the first wear leveling scheme includes performing an Exclusive OR (XOR) operation on an (n–1)-bit logical address and a first (n–1)-bit string to obtain an (n–1)-bit physical address, and performing wear leveling operations according to the second wear leveling scheme includes performing an Exclusive OR (XOR) operation on an (n–1)-bit logical address and a second (n–1)-bit string to obtain an (n–1)-bit physical address.

13. The method of claim 10 further comprising:
subsequently dividing the merged wear leveling group into two or more subgroups and applying different wear leveling schemes to each of the two or more subgroups.

14. The method of claim 10 further comprising maintaining a table that includes an indicator to indicate that the first and second wear leveling groups were merged and to record the third bit string.

15. The method of claim 10 further comprising maintaining a record of access to a set of non-volatile memory cells of the merged wear leveling group and searching the record of access for one or more patterns of access to the set of non-volatile memory cells, the one or more patterns of access triggering at least one of: dividing the set of non-volatile memory cells and merging the set of non-volatile memory cells with another set of non-volatile memory cells.

16. The method of claim 10 further comprising:
receiving a command that includes a logical address;
determining that the logical address corresponds to the first wear leveling group from a first portion of the logical address;
looking up a table entry for the first wear leveling group;
determining from the table entry that the first wear leveling group was merged into the merged wear leveling group; and
obtaining the third bit string from the table.

17. The method of claim 10 further comprising prior to merging the first and second wear leveling groups to form the merged wear leveling group, changing at least one of the first or second bit strings such that the first and second bit strings are the same.

18. The method of claim 14 further comprising:
storing the table in a Content Addressable Memory (CAM).

19. A system comprising:
means for detecting a pattern of access to a plurality of physical units in a set of non-volatile memory cells in a first period of operation, each physical unit having a physical address, the plurality of physical units forming a first wear leveling group for application of a first wear leveling scheme and a second wear leveling group for application of a second wear leveling scheme, the first and second wear leveling schemes configured to change logical to physical translation a plurality of times in the first period of operation, the first wear leveling scheme applying an XOR operation on a logical address and a first bit string to obtain a physical address, the second wear leveling scheme applying an XOR operation on a logical address and a second bit string to obtain a physical address, the first and second wear leveling groups each containing a first number of physical units;
means for dynamically selecting physical units of the plurality of physical units to form one or more merged wear leveling groups in a second period of operation based on the detected pattern of access to the plurality of physical units in the first period of operation, including selecting a second number of physical units to form a merged wear leveling group that includes all physical units of the first and second wear leveling groups in response to detecting a high level of wear of the first wear leveling group, the second wear leveling group selected based on a low level of wear of the second wear leveling group; and
means for applying a third wear leveling scheme to only the merged wear leveling group including applying an XOR operation on a logical address and a third bit string to obtain a physical address and changing the third bit string to swap logical addresses between pairs of physical addresses of the merged wear leveling group.

20. The system of claim 19 wherein the set of non-volatile memory cells are Phase Change Memory (PCM) cells, Resistive Random Access Memory (ReRAM) cells, or Magnetoresistive Random Access Memory (MRAM cells).

* * * * *